US012105277B2

(12) United States Patent
Alpern et al.

(10) Patent No.: US 12,105,277 B2
(45) Date of Patent: Oct. 1, 2024

(54) ELECTROOPTICAL SYSTEMS HAVING HEATING ELEMENTS

(71) Applicant: Innoviz Technologies Ltd., Rosh Hayin (IL)

(72) Inventors: Yair Alpern, Kiryat Tivon (IL); Michael Girgel, Kiryat Motzkin (IL)

(73) Assignee: Innoviz Technologies Ltd., Rosh Ha'ayin (IL)

( * ) Notice: Subject to any disclaimer, the term of this patent is extended or adjusted under 35 U.S.C. 154(b) by 671 days.

(21) Appl. No.: 17/282,199

(22) PCT Filed: Oct. 3, 2019

(86) PCT No.: PCT/IB2019/001075
§ 371 (c)(1),
(2) Date: Apr. 1, 2021

(87) PCT Pub. No.: WO2020/070554
PCT Pub. Date: Apr. 9, 2020

(65) Prior Publication Data
US 2021/0341729 A1 Nov. 4, 2021

Related U.S. Application Data

(60) Provisional application No. 62/741,034, filed on Oct. 4, 2018.

(51) Int. Cl.
*G02B 26/08* (2006.01)
*B81B 7/00* (2006.01)
(Continued)

(52) U.S. Cl.
CPC ........ *G02B 26/0858* (2013.01); *B81B 7/0087* (2013.01); *G01S 7/4817* (2013.01);
(Continued)

(58) Field of Classification Search
CPC .. G02B 26/0858; G02B 26/105; G02B 13/16; G02B 3/0056; G02B 27/283;
(Continued)

(56) References Cited

U.S. PATENT DOCUMENTS

2005/0173770 A1 8/2005 Linden
2016/0172951 A1* 6/2016 Takimoto ............. G02B 26/085
310/37

(Continued)

FOREIGN PATENT DOCUMENTS

CN 101082697 A 12/2007
CN 101925836 A 12/2010
(Continued)

OTHER PUBLICATIONS

PCT International Search Report and Written Opinion issued in International Application No. PCT/IB2019/001075, dated Mar. 25, 2020, 17 pages.
(Continued)

*Primary Examiner* — Euncha P Cherry
(74) *Attorney, Agent, or Firm* — Finnegan, Henderson, Farabow, Garrett & Dunner, LLP

(57) ABSTRACT

A microelectromechanical system (MEMS) mirror assembly may comprise a frame and a MEMS mirror coupled to the frame. The MEMS mirror assembly may also include at least one piezoelectric actuator including a body and a piezoelectric element. When subjected to an electrical field, the piezoelectric element may be configured to bend the body, thereby moving the MEMS mirror with respect to a plane of the frame. The MEMS mirror assembly may further include at least one heating resistor configured to heat the piezoelectric element when an electric current passes through the at least one heating resistor.

20 Claims, 30 Drawing Sheets

(51) Int. Cl.
- *G01S 7/481* (2006.01)
- *G02B 26/10* (2006.01)
- *H05B 1/02* (2006.01)
- *H05B 3/18* (2006.01)
- *G01S 17/931* (2020.01)
- *H10N 30/20* (2023.01)

(52) U.S. Cl.
CPC ........... *G02B 26/105* (2013.01); *H05B 1/023* (2013.01); *H05B 3/18* (2013.01); *G01S 17/931* (2020.01); *H10N 30/204* (2023.02)

(58) Field of Classification Search
CPC ... G02B 26/101; B81B 7/0087; G01S 7/4817; G01S 17/931; G01S 7/481; H05B 1/023; H05B 3/18; H10N 30/204
See application file for complete search history.

(56) References Cited

U.S. PATENT DOCUMENTS

| | | |
|---|---|---|
| 2018/0081037 A1 | 3/2018 | Medina |
| 2018/0143322 A1 | 5/2018 | Rosenzweig |

FOREIGN PATENT DOCUMENTS

| | | |
|---|---|---|
| CN | 205120965 U | 3/2016 |
| CN | 107533339 A | 1/2018 |
| CN | 108349723 A | 7/2018 |
| JP | 2009053100 A | 3/2009 |

OTHER PUBLICATIONS

Office Action issued in Chinese Application No. 201980064254.0, dated Jan. 9, 2024, and machine translation thereof (10 pages).

\* cited by examiner

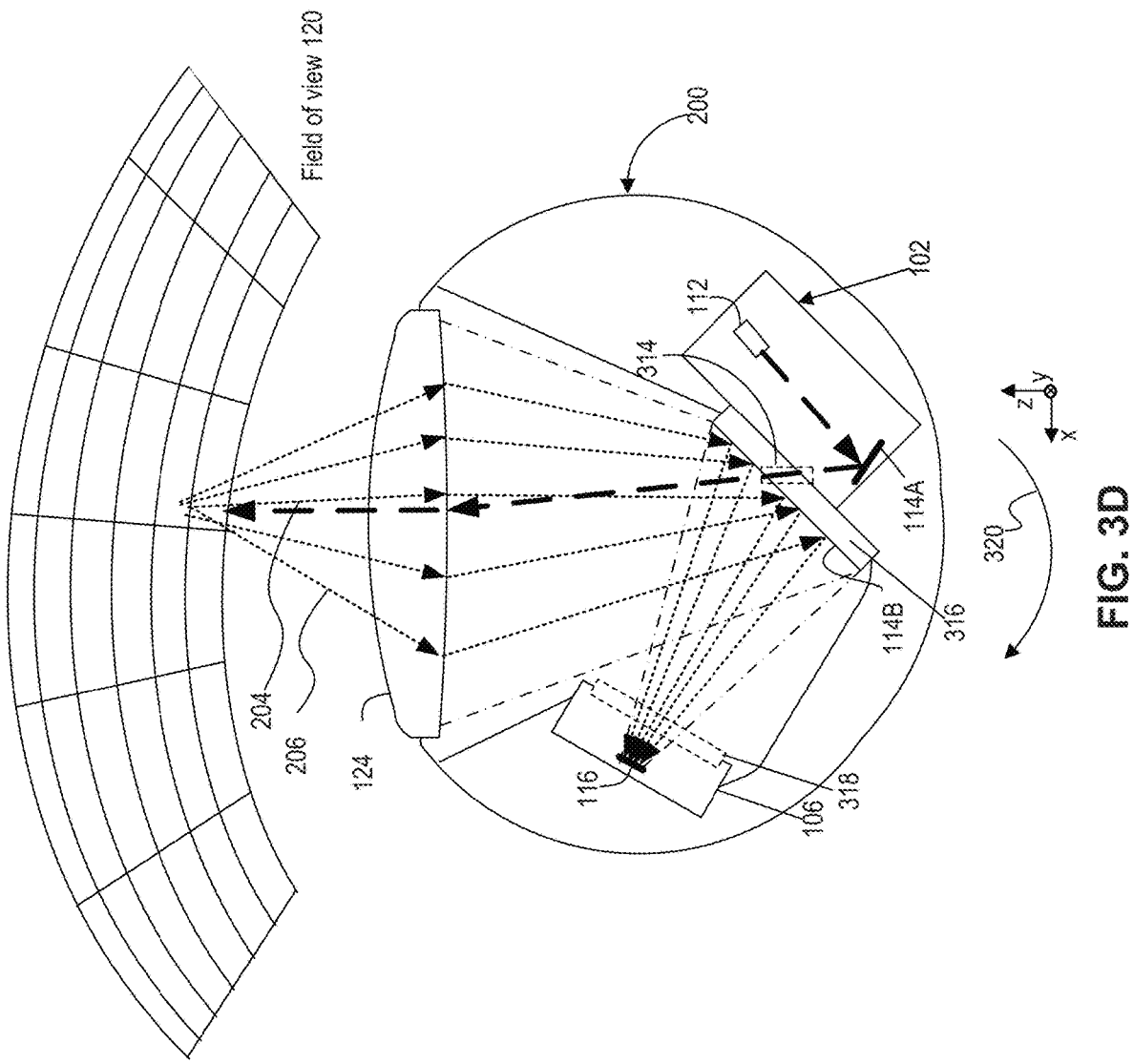

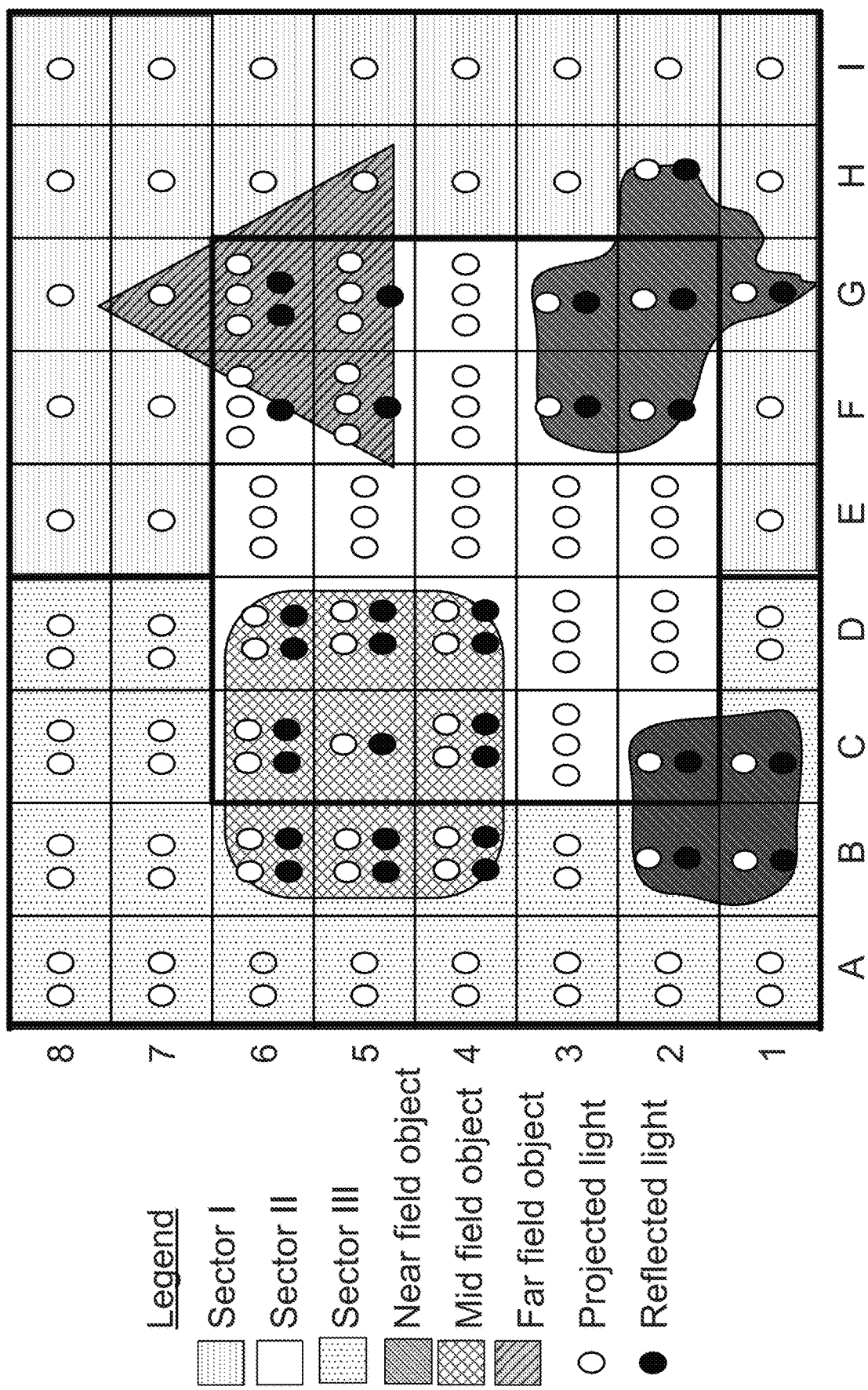

ELECTROOPTICAL SYSTEMS HAVING HEATING ELEMENTS

CROSS-REFERENCE TO RELATED APPLICATION

The present application is a U.S. national stage application of International Application No. PCT/IB2019/001075, filed Oct. 3, 2019, which claims priority to U.S. Provisional Patent Application No. 62/741,034, filed Oct. 4, 2018. The above-referenced applications are incorporated herein by reference in their entireties.

BACKGROUND

I. Technical Field

The present disclosure relates generally to technology for scanning a surrounding environment, and, for example, to systems and methods that use LIDAR technology to detect objects in the surrounding environment.

II. Background Information

With the advent of driver assist systems and autonomous vehicles, automobiles need to be equipped with systems capable of reliably sensing and interpreting their surroundings, including identifying obstacles, hazards, objects, and other physical parameters that might impact navigation of the vehicle. To this end, a number of differing technologies have been suggested including radar, LIDAR, camera-based systems, operating alone or in a redundant manner.

One consideration with driver assistance systems and autonomous vehicles is an ability of the system to determine surroundings across different conditions including, rain, fog, darkness, bright light, and snow. A light detection and ranging system, (LIDAR a/k/a LADAR) is an example of technology that can work well in differing conditions, by measuring distances to objects by illuminating objects with light and measuring the reflected pulses with a sensor. A laser is one example of a light source that can be used in a LIDAR system. As with any sensing system, in order for a LIDAR-based sensing system to be fully adopted by the automotive industry, the system should provide reliable data enabling detection of far-away objects. Currently, however, the maximum illumination power of LIDAR systems is limited by the need to make the LIDAR systems eye-safe (i.e., so that they will not damage the human eye which can occur when a projected light emission is absorbed in the eye's cornea and lens, causing thermal damage to the retina.)

The systems and methods of the present disclosure are directed towards improving performance of LIDAR systems while complying with eye safety regulations.

SUMMARY

Embodiments consistent with the present disclosure provide devices and methods for automatically capturing and processing images from an environment of a user, and systems and methods for processing information related to images captured from the environment of the user.

In an embodiment, a microelectromechanical system (MEMS) mirror assembly is disclosed. The MEMS mirror assembly comprises a frame and a MEMS mirror coupled to the frame. The MEMS mirror assembly may also comprise at least one piezoelectric actuator including a body and a piezoelectric element. When subjected to an electrical field, the piezoelectric element may be configured to bend the body, thereby moving the MEMS mirror with respect to a plane of the frame. The MEMS mirror assembly may further comprise at least one heating resistor configured to heat the piezoelectric element when an electric current passes through the at least one heating resistor.

In an embodiment, a method for operating a microelectromechanical system (MEMS) mirror assembly is disclosed. The method may comprise applying an electric field to a piezoelectric element of a piezoelectric actuator of the MEMS mirror assembly for bending a body of the piezoelectric actuator. The method may also comprise passing an electric current through at least one heating resistor of the MEMS mirror assembly for heating the piezoelectric element.

In an embodiment, a solid-state photodetector is disclosed. The solid-state photodetector may comprise an integrated circuit that includes at least one light sensitive photodiode configured to generate output signal indicative of light impinging on the light sensitive photodiode. The solid-state photodetector may also at least one heating resistor configured to heat the solid-state photodetector when an electric current passes through the at least one heating resistor. The electrooptical system may further comprise a circuitry for transmitting the electric current of an electric current source to the at least one heating resistor.

In an embodiment, a method for operating an electrooptical system is disclosed. The method may comprise passing an electric current through at least one heating resistor of the electrooptical system for heating a light sensitive photodiode. The at least one heating resistor may be implemented on a chip on which the light sensitive photodiode is implemented. The method may also comprise detecting light from a field-of-view (FOV) of the electrooptical system by the light sensitive photodiode of the electrooptical system.

Consistent with other disclosed embodiments, non-transitory computer-readable storage media may store program instructions, which are executed by at least one processor and perform any of the methods described herein.

The foregoing general description and the following detailed description are exemplary and explanatory only and are not restrictive of the claims.

BRIEF DESCRIPTION OF THE DRAWINGS

The accompanying drawings, which are incorporated in and constitute a part of this disclosure, illustrate various disclosed embodiments. In the drawings:

FIGS. 3A, 3B, 3C, and 3D are diagrams illustrating different configurations of scanning units in accordance with some embodiments of the present disclosure.

FIG. 5C is a diagram illustrating the actual light emission projected towards and reflections received during a single frame-time for the whole field of view.

DETAILED DESCRIPTION

Figure 1A:
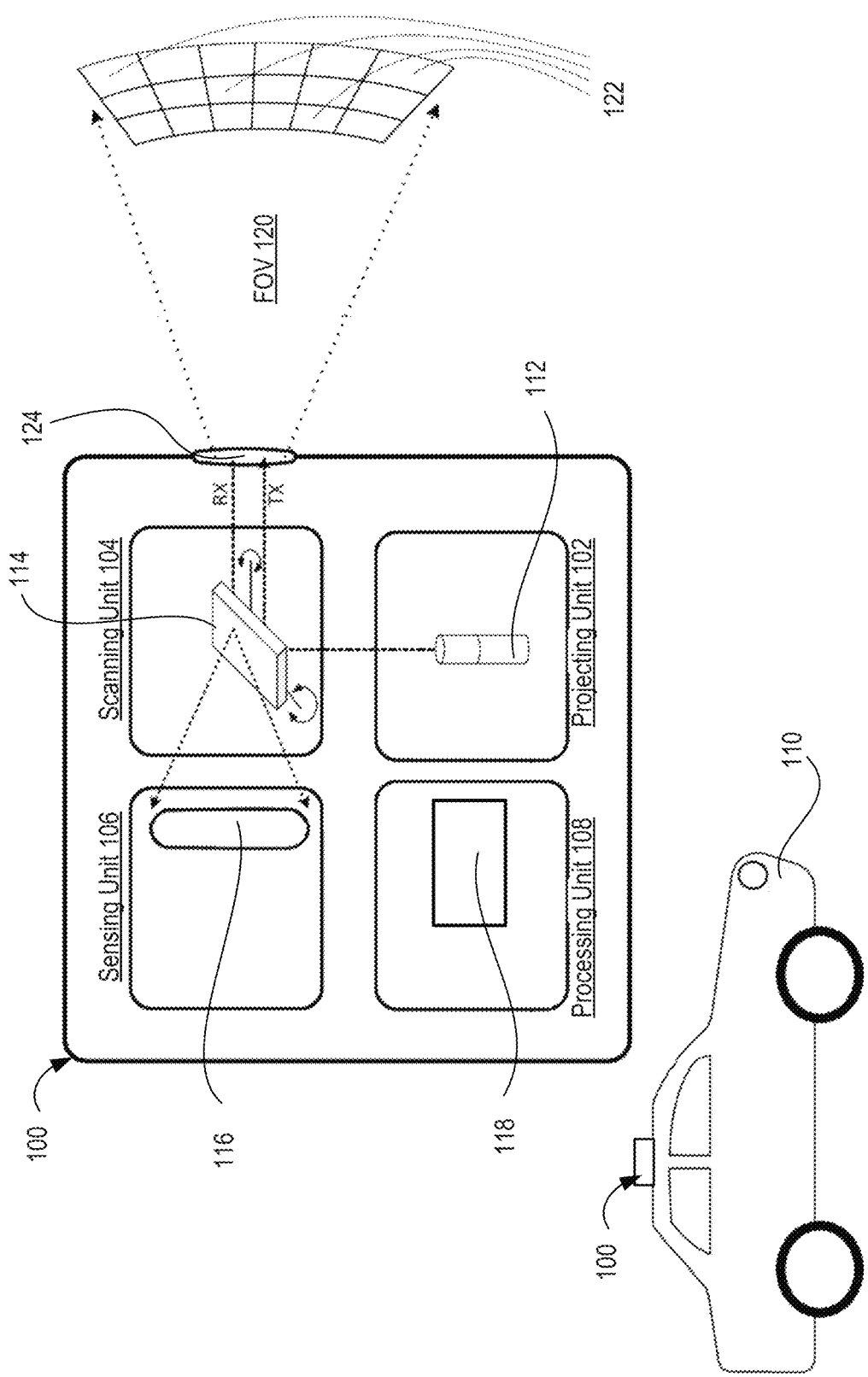
FIG. 1A is a diagram illustrating an exemplary LIDAR system consistent with disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions or modifications may be made to the components illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope is defined by the appended claims.

Terms Definitions

Disclosed embodiments may involve an optical system. As used herein, the term "optical system" broadly includes any system that is used for the generation, detection and/or manipulation of light. By way of example only, an optical system may include one or more optical components for generating, detecting and/or manipulating light. For example, light sources, lenses, mirrors, prisms, beam splitters, collimators, polarizing optics, optical modulators, optical switches, optical amplifiers, optical detectors, optical sensors, fiber optics, semiconductor optic components, while each not necessarily required, may each be part of an optical system. In addition to the one or more optical components, an optical system may also include other non-optical components such as electrical components, mechanical components, chemical reaction components, and semiconductor components. The non-optical components may cooperate with optical components of the optical system. For example, the optical system may include at least one processor for analyzing detected light.

Consistent with the present disclosure, the optical system may be a LIDAR system. As used herein, the term "LIDAR system" broadly includes any system which can determine values of parameters indicative of a distance between a pair of tangible objects based on reflected light. In one embodiment, the LIDAR system may determine a distance between a pair of tangible objects based on reflections of light emitted by the LIDAR system. As used herein, the term "determine distances" broadly includes generating outputs which are indicative of distances between pairs of tangible objects. The determined distance may represent the physical dimension between a pair of tangible objects. By way of example only, the determined distance may include a line of flight distance between the LIDAR system and another tangible object in a field of view of the LIDAR system. In another embodiment, the LIDAR system may determine the relative velocity between a pair of tangible objects based on reflections of light emitted by the LIDAR system. Examples of outputs indicative of the distance between a pair of tangible objects include: a number of standard length units between the tangible objects (e.g. number of meters, number of inches, number of kilometers, number of millimeters), a number of arbitrary length units (e.g. number of LIDAR system lengths), a ratio between the distance to another length (e.g. a ratio to a length of an object detected in a field of view of the LIDAR system), an amount of time (e.g. given as standard unit, arbitrary units or ratio, for example, the time it takes light to travel between the tangible objects), one or more locations (e.g. specified using an agreed coordinate system, specified in relation to a known location), and more.

The LIDAR system may determine the distance between a pair of tangible objects based on reflected light. In one embodiment, the LIDAR system may process detection results of a sensor which creates temporal information indicative of a period of time between the emission of a light signal and the time of its detection by the sensor. The period of time is occasionally referred to as "time of flight" of the light signal. In one example, the light signal may be a short pulse, whose rise and/or fall time may be detected in reception. Using known information about the speed of light in the relevant medium (usually air), the information regarding the time of flight of the light signal can be processed to provide the distance the light signal traveled between emission and detection. In another embodiment, the LIDAR system may determine the distance based on frequency phase-shift (or multiple frequency phase-shift). Specifically, the LIDAR system may process information indicative of one or more modulation phase shifts (e.g. by solving some simultaneous equations to give a final measure) of the light signal. For example, the emitted optical signal may be modulated with one or more constant frequencies. The at least one phase shift of the modulation between the emitted signal and the detected reflection may be indicative of the distance the light traveled between emission and detection. The modulation may be applied to a continuous wave light signal, to a quasi-continuous wave light signal, or to another type of emitted light signal. It is noted that additional information may be used by the LIDAR system for determining the distance, e.g. location information (e.g. relative positions) between the projection location, the detection location of the signal (especially if distanced from one another), and more.

In some embodiments, the LIDAR system may be used for detecting a plurality of objects in an environment of the LIDAR system. The term "detecting an object in an environment of the LIDAR system" broadly includes generating information which is indicative of an object that reflected light toward a detector associated with the LIDAR system. If more than one object is detected by the LIDAR system, the generated information pertaining to different objects may be interconnected, for example a car is driving on a road, a bird is sitting on the tree, a man touches a bicycle, a van moves towards a building. The dimensions of the environment in which the LIDAR system detects objects may vary with respect to implementation. For example, the LIDAR system may be used for detecting a plurality of objects in an environment of a vehicle on which the LIDAR system is installed, up to a horizontal distance of 100 m (or 200 m, 300 m, etc.), and up to a vertical distance of 10 m (or 25 m, 50 m, etc.). In another example, the LIDAR system may be used for detecting a plurality of objects in an environment of a vehicle or within a predefined horizontal range (e.g., 25°, 50°, 100°, 180°, etc.), and up to a predefined vertical elevation (e.g., ±10°, ±20°, +40°-20°, ±90° or 0°-90°).

As used herein, the term "detecting an object" may broadly refer to determining an existence of the object (e.g., an object may exist in a certain direction with respect to the LIDAR system and/or to another reference location, or an object may exist in a certain spatial volume). Additionally or alternatively, the term "detecting an object" may refer to determining a distance between the object and another location (e.g. a location of the LIDAR system, a location on earth, or a location of another object). Additionally or alternatively, the term "detecting an object" may refer to identifying the object (e.g. classifying a type of object such as car, plant, tree, road; recognizing a specific object (e.g., the Washington Monument); determining a license plate number; determining a composition of an object (e.g., solid, liquid, transparent, semitransparent); determining a kinematic parameter of an object (e.g., whether it is moving, its velocity, its movement direction, expansion of the object). Additionally or alternatively, the term "detecting an object" may refer to generating a point cloud map in which every point of one or more points of the point cloud map correspond to a location in the object or a location on a face thereof. In one embodiment, the data resolution associated with the point cloud map representation of the field of view may be associated with 0.1°×0.1° or 0.3°×0.3° of the field of view.

Consistent with the present disclosure, the term "object" broadly includes a finite composition of matter that may reflect light from at least a portion thereof. For example, an object may be at least partially solid (e.g. cars, trees); at least partially liquid (e.g. puddles on the road, rain); at least partly gaseous (e.g. fumes, clouds); made from a multitude of distinct particles (e.g. sand storm, fog, spray); and may be of one or more scales of magnitude, such as ~1 millimeter (mm), ~5 mm, ~10 mm, ~50 mm, ~100 mm, ~500 mm, ~1 meter (m), ~5 m, ~10 m, ~50 m, ~100 m, and so on. Smaller or larger objects, as well as any size in between those examples, may also be detected. It is noted that for various reasons, the LIDAR system may detect only part of the object. For example, in some cases, light may be reflected from only some sides of the object (e.g., only the side opposing the LIDAR system will be detected); in other cases, light may be projected on only part of the object (e.g. laser beam projected onto a road or a building); in other cases, the object may be partly blocked by another object between the LIDAR system and the detected object; in other cases, the LIDAR's sensor may only detects light reflected from a portion of the object, e.g., because ambient light or other interferences interfere with detection of some portions of the object.

Consistent with the present disclosure, a LIDAR system may be configured to detect objects by scanning the environment of LIDAR system. The term "scanning the environment of LIDAR system" broadly includes illuminating the field of view or a portion of the field of view of the LIDAR system. In one example, scanning the environment of LIDAR system may be achieved by moving or pivoting a light deflector to deflect light in differing directions toward different parts of the field of view. In another example, scanning the environment of LIDAR system may be achieved by changing a positioning (i.e. location and/or orientation) of a sensor with respect to the field of view. In another example, scanning the environment of LIDAR system may be achieved by changing a positioning (i.e. location and/or orientation) of a light source with respect to the field of view. In yet another example, scanning the environment of LIDAR system may be achieved by changing the positions of at least one light source and of at least one sensor to move rigidly respect to the field of view (i.e. the relative distance and orientation of the at least one sensor and of the at least one light source remains).

As used herein the term "field of view of the LIDAR system" may broadly include an extent of the observable environment of LIDAR system in which objects may be detected. It is noted that the field of view (FOV) of the LIDAR system may be affected by various conditions such as but not limited to: an orientation of the LIDAR system (e.g. is the direction of an optical axis of the LIDAR system); a position of the LIDAR system with respect to the environment (e.g. distance above ground and adjacent topography and obstacles); operational parameters of the LIDAR system (e.g. emission power, computational settings, defined angles of operation), etc. The field of view of LIDAR system may be defined, for example, by a solid angle (e.g. defined using $\phi$, $\theta$ angles, in which $\phi$ and $\theta$ are angles defined in perpendicular planes, e.g. with respect to symmetry axes of the LIDAR system and/or its FOV). In one example, the field of view may also be defined within a certain range (e.g. up to 200 m).

Similarly, the term "instantaneous field of view" may broadly include an extent of the observable environment in which objects may be detected by the LIDAR system at any given moment. For example, for a scanning LIDAR system, the instantaneous field of view is narrower than the entire FOV of the LIDAR system, and it can be moved within the FOV of the LIDAR system in order to enable detection in other parts of the FOV of the LIDAR system. The movement of the instantaneous field of view within the FOV of the LIDAR system may be achieved by moving a light deflector of the LIDAR system (or external to the LIDAR system), so as to deflect beams of light to and/or from the LIDAR system in differing directions. In one embodiment, LIDAR system may be configured to scan scene in the environment in which the LIDAR system is operating. As used herein the term "scene" may broadly include some or all of the objects within the field of view of the LIDAR system, in their relative positions and in their current states, within an operational duration of the LIDAR system. For example, the scene may include ground elements (e.g. earth, roads, grass, sidewalks, road surface marking), sky, man-made objects (e.g. vehicles, buildings, signs), vegetation, people, animals, light projecting elements (e.g. flashlights, sun, other LIDAR systems), and so on.

Disclosed embodiments may involve obtaining information for use in generating reconstructed three-dimensional models. Examples of types of reconstructed three-dimensional models which may be used include point cloud models, and Polygon Mesh (e.g. a triangle mesh). The terms "point cloud" and "point cloud model" are widely known in the art, and should be construed to include a set of data points located spatially in some coordinate system (i.e., having an identifiable location in a space described by a respective coordinate system).The term "point cloud point" refer to a point in space (which may be dimensionless, or a miniature cellular space, e.g. 1 cm$^3$), and whose location may be described by the point cloud model using a set of coordinates (e.g. (X,Y,Z), (r,$\phi$,$\theta$)). By way of example only, the point cloud model may store additional information for some or all of its points (e.g. color information for points generated from camera images). Likewise, any other type of reconstructed three-dimensional model may store additional information for some or all of its objects. Similarly, the terms "polygon mesh" and "triangle mesh" are widely known in the art, and are to be construed to include, among other things, a set of vertices, edges and faces that define the shape of one or more 3D objects (such as a polyhedral object). The faces may include one or more of the following: triangles (triangle mesh), quadrilaterals, or other simple convex polygons, since this may simplify rendering. The faces may also include more general concave polygons, or polygons with holes. Polygon meshes may be represented using differing techniques, such as: Vertex-vertex meshes, Face-vertex meshes, Winged-edge meshes and Render dynamic meshes. Different portions of the polygon mesh (e.g., vertex, face, edge) are located spatially in some coordinate system (i.e., having an identifiable location in a space described by the respective coordinate system), either directly and/or relative to one another. The generation of the reconstructed three-dimensional model may be implemented using any standard, dedicated and/or novel photogrammetry technique, many of which are known in the art. It is noted that other types of models of the environment may be generated by the LIDAR system.

Consistent with disclosed embodiments, the LIDAR system may include at least one projecting unit with a light source configured to project light. As used herein the term "light source" broadly refers to any device configured to emit light. In one embodiment, the light source may be a laser such as a solid-state laser, laser diode, a high power laser, or an alternative light source such as, a light emitting diode (LED)-based light source. In addition, light source 112 as illustrated throughout the figures, may emit light in differing formats, such as light pulses, continuous wave (CW), quasi-CW, and so on. For example, one type of light source that may be used is a vertical-cavity surface-emitting laser (VCSEL). Another type of light source that may be used is an external cavity diode laser (ECDL). In some examples, the light source may include a laser diode configured to emit light at a wavelength between about 650 nm and 1150 nm. Alternatively, the light source may include a laser diode configured to emit light at a wavelength between about 800 nm and about 1000 nm, between about 850 nm and about 950 nm, or between about 1300 nm and about 1600 nm. Unless indicated otherwise, the term "about" with regards to a numeric value is defined as a variance of up to 5% with respect to the stated value. Additional details on the projecting unit and the at least one light source are described below with reference to FIGS. 2A-2C.

Consistent with disclosed embodiments, the LIDAR system may include at least one scanning unit with at least one light deflector configured to deflect light from the light source in order to scan the field of view. The term "light deflector" broadly includes any mechanism or module which is configured to make light deviate from its original path; for example, a mirror, a prism, controllable lens, a mechanical mirror, mechanical scanning polygons, active diffraction (e.g. controllable LCD), Risley prisms, non-mechanical-electro-optical beam steering (such as made by Vscent), polarization grating (such as offered by Boulder Non-Linear Systems), optical phased array (OPA), and more. In one embodiment, a light deflector may include a plurality of optical components, such as at least one reflecting element (e.g. a mirror), at least one refracting element (e.g. a prism, a lens), and so on. In one example, the light deflector may be movable, to cause light deviate to differing degrees (e.g. discrete degrees, or over a continuous span of degrees). The light deflector may optionally be controllable in different ways (e.g. deflect to a degree a, change deflection angle by Aa, move a component of the light deflector by M millimeters, change speed in which the deflection angle changes). In addition, the light deflector may optionally be operable to change an angle of deflection within a single plane (e.g., $\theta$ coordinate). The light deflector may optionally be operable to change an angle of deflection within two non-parallel planes (e.g., $\theta$ and $\phi$ coordinates). Alternatively or in addition, the light deflector may optionally be operable to change an angle of deflection between predetermined settings (e.g. along a predefined scanning route) or otherwise. With respect the use of light deflectors in LIDAR systems, it is noted that a light deflector may be used in the outbound direction (also referred to as transmission direction, or TX) to deflect light from the light source to at least a part of the field of view. However, a light deflector may also be used in the inbound direction (also referred to as reception direction, or RX) to deflect light from at least a part of the field of view to one or more light sensors. Additional details on the scanning unit and the at least one light deflector are described below with reference to FIGS. 3A-3C.

Disclosed embodiments may involve pivoting the light deflector in order to scan the field of view. As used herein the term "pivoting" broadly includes rotating of an object (especially a solid object) about one or more axis of rotation, while substantially maintaining a center of rotation fixed. In one embodiment, the pivoting of the light deflector may include rotation of the light deflector about a fixed axis (e.g., a shaft), but this is not necessarily so. For example, in some MEMS mirror implementation, the MEMS mirror may move by actuation of a plurality of benders connected to the mirror, the mirror may experience some spatial translation in addition to rotation. Nevertheless, such mirror may be designed to rotate about a substantially fixed axis, and therefore consistent with the present disclosure it considered to be pivoted. In other embodiments, some types of light deflectors (e.g. non-mechanical-electro-optical beam steering, OPA) do not require any moving components or internal movements in order to change the deflection angles of deflected light. It is noted that any discussion relating to moving or pivoting a light deflector is also mutatis mutandis applicable to controlling the light deflector such that it changes a deflection behavior of the light deflector. For example, controlling the light deflector may cause a change in a deflection angle of beams of light arriving from at least one direction.

Disclosed embodiments may involve receiving reflections associated with a portion of the field of view corresponding to a single instantaneous position of the light deflector. As used herein, the term "instantaneous position of the light deflector" (also referred to as "state of the light deflector") broadly refers to the location or position in space where at least one controlled component of the light deflector is situated at an instantaneous point in time, or over a short span of time. In one embodiment, the instantaneous position of light deflector may be gauged with respect to a frame of reference. The frame of reference may pertain to at least one fixed point in the LIDAR system. Or, for example, the frame of reference may pertain to at least one fixed point in the scene. In some embodiments, the instantaneous position of the light deflector may include some movement of one or more components of the light deflector (e.g. mirror, prism), usually to a limited degree with respect to the maximal degree of change during a scanning of the field of view. For example, a scanning of the entire the field of view of the LIDAR system may include changing deflection of light over a span of 30°, and the instantaneous position of the at least one light deflector may include angular shifts of the light deflector within 0.05°. In other embodiments, the term "instantaneous position of the light deflector" may refer to the positions of the light deflector during acquisition of light which is processed to provide data for a single point of a point cloud (or another type of 3D model) generated by the LIDAR system. In some embodiments, an instantaneous position of the light deflector may correspond with a fixed position or orientation in which the deflector pauses for a short time during illumination of a particular sub-region of the LIDAR field of view. In other cases, an instantaneous position of the light deflector may correspond with a certain position/orientation along a scanned range of positions/orientations of the light deflector that the light deflector passes through as part of a continuous or semi-continuous scan of the LIDAR field of view.In some embodiments, the light deflector may be moved such that during a scanning cycle of the LIDAR FOV the light deflector is located at a plurality of different instantaneous positions. In other words, during the period of time in which a scanning cycle occurs, the deflector may be moved through a series of different instantaneous positions/orientations, and the deflector may reach each different instantaneous position/orientation at a different time during the scanning cycle.

Consistent with disclosed embodiments, the LIDAR system may include at least one sensing unit with at least one sensor configured to detect reflections from objects in the field of view. The term "sensor" broadly includes any device, element, or system capable of measuring properties (e.g., power, frequency, phase, pulse timing, pulse duration) of electromagnetic waves and to generate an output relating to the measured properties. In some embodiments, the at least one sensor may include a plurality of detectors constructed from a plurality of detecting elements. The at least one sensor may include light sensors of one or more types. It is noted that the at least one sensor may include multiple sensors of the same type which may differ in other characteristics (e.g., sensitivity, size). Other types of sensors may also be used. Combinations of several types of sensors can be used for different reasons, such as improving detection over a span of ranges (especially in close range); improving the dynamic range of the sensor; improving the temporal response of the sensor; and improving detection in varying environmental conditions (e.g. atmospheric temperature, rain, etc.),In one embodiment, the at least one sensor includes a SiPM (Silicon photomultipliers) which is a solid-state single-photon-sensitive device built from an array of avalanche photodiode (APD), single photon avalanche diode (SPAD), serving as detection elements on a common silicon substrate. In one example, a typical distance between SPADs may be between about 10 µm and about 50 µm, wherein each SPAD may have a recovery time of between about 20 ns and about 100 ns. Similar photomultipliers from other, non-silicon materials may also be used. Although a SiPM device works in digital/switching mode, the SiPM is an analog device because all the microcells may be read in parallel, making it possible to generate signals within a dynamic range from a single photon to hundreds and thousands of photons detected by the different SPADs. It is noted that outputs from different types of sensors (e.g., SPAD, APD, SiPM, PIN diode, Photodetector) may be combined together to a single output which may be processed by a processor of the LIDAR system. Additional details on the sensing unit and the at least one sensor are described below with reference to FIGS. 4A-4C.

Consistent with disclosed embodiments, the LIDAR system may include or communicate with at least one processor configured to execute differing functions. The at least one processor may constitute any physical device having an electric circuit that performs a logic operation on input or inputs. For example, the at least one processor may include one or more integrated circuits (IC), including Application-specific integrated circuit (ASIC), microchips, microcontrollers, microprocessors, all or part of a central processing unit (CPU), graphics processing unit (GPU), digital signal processor (DSP), field-programmable gate array (FPGA), or other circuits suitable for executing instructions or performing logic operations. The instructions executed by at least one processor may, for example, be pre-loaded into a memory integrated with or embedded into the controller or may be stored in a separate memory. The memory may comprise a Random Access Memory (RAM), a Read-Only Memory (ROM), a hard disk, an optical disk, a magnetic medium, a flash memory, other permanent, fixed, or volatile memory, or any other mechanism capable of storing instructions. In some embodiments, the memory is configured to store information representative data about objects in the environment of the LIDAR system. In some embodiments, the at least one processor may include more than one processor. Each processor may have a similar construction or the processors may be of differing constructions that are electrically connected or disconnected from each other. For example, the processors may be separate circuits or integrated in a single circuit. When more than one processor is used, the processors may be configured to operate independently or collaboratively. The processors may be coupled electrically, magnetically, optically, acoustically, mechanically or by other means that permit them to interact. Additional details on the processing unit and the at least one processor are described below with reference to FIGS. 5A-5C.

System Overview

FIG. 1A illustrates a LIDAR system 100 including a projecting unit 102, a scanning unit 104, a sensing unit 106, and a processing unit 108. LIDAR system 100 may be mountable on a vehicle 110. Consistent with embodiments of the present disclosure, projecting unit 102 may include at least one light source 112, scanning unit 104 may include at least one light deflector 114, sensing unit 106 may include at least one sensor 116, and processing unit 108 may include at least one processor 118. In one embodiment, at least one processor 118 may be configured to coordinate operation of the at least one light source 112 with the movement of at least one light deflector 114 in order to scan a field of view 120. During a scanning cycle, each instantaneous position of at least one light deflector 114 may be associated with a particular portion 122 of field of view 120. In addition, LIDAR system 100 may include at least one optional optical window 124 for directing light projected towards field of view 120 and/or receiving light reflected from objects in field of view 120. Optional optical window 124 may serve different purposes, such as collimation of the projected light and focusing of the reflected light. In one embodiment, optional optical window 124 may be an opening, a flat window, a lens, or any other type of optical window.

Consistent with the present disclosure, LIDAR system 100 may be used in autonomous or semi-autonomous road-vehicles (for example, cars, buses, vans, trucks and any other terrestrial vehicle). Autonomous road-vehicles with LIDAR system 100 may scan their environment and drive to a destination vehicle without human input Similarly, LIDAR system 100 may also be used in autonomous/semi-autonomous aerial-vehicles (for example, UAV, drones, quadcopters, and any other airborne vehicle or device); or in an autonomous or semi-autonomous water vessel (e.g., boat, ship, submarine, or any other watercraft). Autonomous aerial-vehicles and water craft with LIDAR system 100 may scan their environment and navigate to a destination autonomously or using a remote human operator. According to one embodiment, vehicle 110 (either a road-vehicle, aerial-vehicle, or watercraft) may use LIDAR system 100 to aid in detecting and scanning the environment in which vehicle 110 is operating.

It should be noted that LIDAR system 100 or any of its components may be used together with any of the example embodiments and methods disclosed herein.Further, while some aspects of LIDAR system 100 are described relative to an exemplary vehicle-based LIDAR platform, LIDAR system 100, any of its components, or any of the processes described herein may be applicable to LIDAR systems of other platform types.

In some embodiments, LIDAR system 100 may include one or more scanning units 104 to scan the environment around vehicle 110. LIDAR system 100 may be attached or mounted to any part of vehicle 110. Sensing unit 106 may receive reflections from the surroundings of vehicle 110, and transfer reflections signals indicative of light reflected from objects in field of view 120 to processing unit 108. Consistent with the present disclosure, scanning units 104 may be mounted to or incorporated into a bumper, a fender, a side panel, a spoiler, a roof, a headlight assembly, a taillight assembly, a rear-view mirror assembly, a hood, a trunk or any other suitable part of vehicle 110 capable of housing at least a portion of the LIDAR system. In some cases, LIDAR system 100 may capture a complete surround view of the environment of vehicle 110. Thus, LIDAR system 100 may have a 360-degree horizontal field of view. In one example, as shown in FIG. 1A, LIDAR system 100 may include a single scanning unit 104 mounted on a roof vehicle 110. Alternatively, LIDAR system 100 may include multiple scanning units (e.g., two, three, four, or more scanning units 104) each with a field of few such that in the aggregate the horizontal field of view is covered by a 360-degree scan around vehicle 110. One skilled in the art will appreciate that LIDAR system 100 may include any number of scanning units 104 arranged in any manner, each with an 80° to 120° field of view or less, depending on the number of units employed. Moreover, a 360-degree horizontal field of view may be also obtained by mounting a multiple LIDAR systems 100 on vehicle 110, each with a single scanning unit 104. It is nevertheless noted, that the one or more LIDAR systems 100 do not have to provide a complete 360° field of view, and that narrower fields of view may be useful in some situations. For example, vehicle 110 may require a first LIDAR system 100 having an field of view of 75° looking ahead of the vehicle, and possibly a second LIDAR system 100 with a similar FOV looking backward (optionally with a lower detection range). It is also noted that different vertical field of view angles may also be implemented.

Figure 1B:
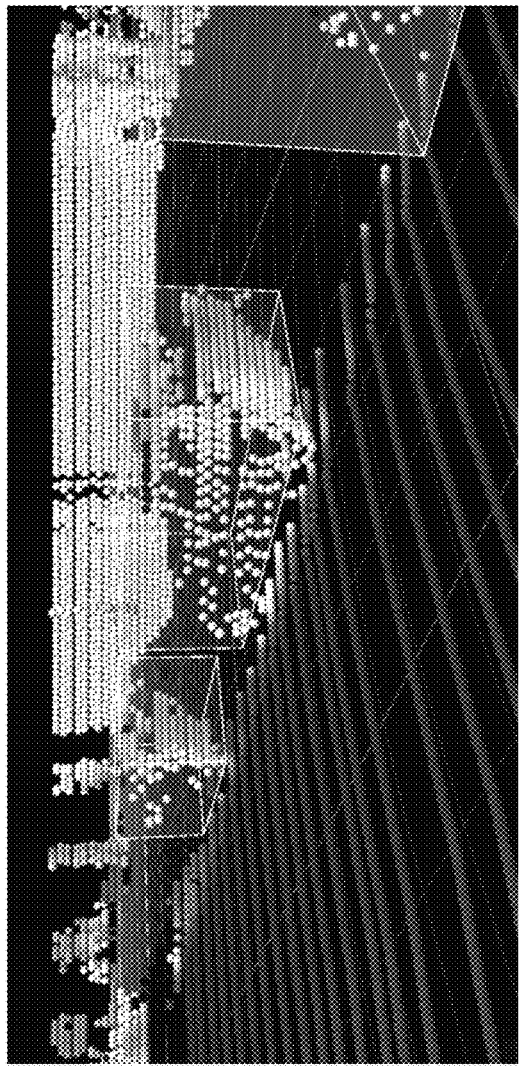
FIG. 1B is an image showing an exemplary output of single scanning cycle of a LIDAR system mounted on a vehicle consistent with disclosed embodiments.

FIG. 1B is an image showing an exemplary output from a single scanning cycle of LIDAR system 100 mounted on vehicle 110 consistent with disclosed embodiments. In this example, scanning unit 104 is incorporated into a right headlight assembly of vehicle 110. Every gray dot in the image corresponds to a location in the environment around vehicle 110 determined from reflections detected by sensing unit 106. In addition to location, each gray dot may also be associated with different types of information, for example, intensity (e.g., how much light returns back from that location), reflectivity, proximity to other dots, and more. In one embodiment, LIDAR system 100 may generate a plurality of point-cloud data entries from detected reflections of multiple scanning cycles of the field of view to enable, for example, determining a point cloud model of the environment around vehicle 110.

Figure 1C:
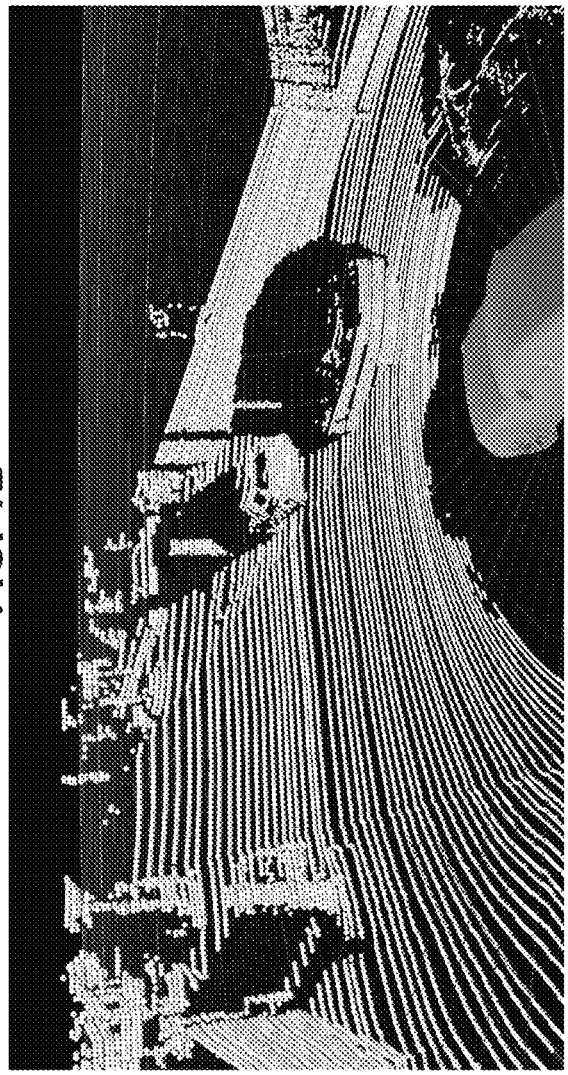
FIG. 1C is another image showing a representation of a point cloud model determined from output of a LIDAR system consistent with disclosed embodiments.

FIG. 1C is an image showing a representation of the point cloud model determined from the output of LIDAR system 100. Consistent with disclosed embodiments, by processing the generated point-cloud data entries of the environment around vehicle 110, a surround-view image may be produced from the point cloud model. In one embodiment, the point cloud model may be provided to a feature extraction module, which processes the point cloud information to identify a plurality of features. Each feature may include data about different aspects of the point cloud and/or of objects in the environment around vehicle 110 (e.g. cars, trees, people, and roads). Features may have the same resolution of the point cloud model (i.e. having the same number of data points, optionally arranged into similar sized 2D arrays), or may have different resolutions. The features may be stored in any kind of data structure (e.g. raster, vector, 2D array, 1D array). In addition, virtual features, such as a representation of vehicle 110, border lines, or bounding boxes separating regions or objects in the image (e.g., as depicted in FIG. 1B), and icons representing one or more identified objects, may be overlaid on the representation of the point cloud model to form the final surround-view image. For example, a symbol of vehicle 110 may be overlaid at a center of the surround-view image.

The Projecting Unit

Figure 2A:
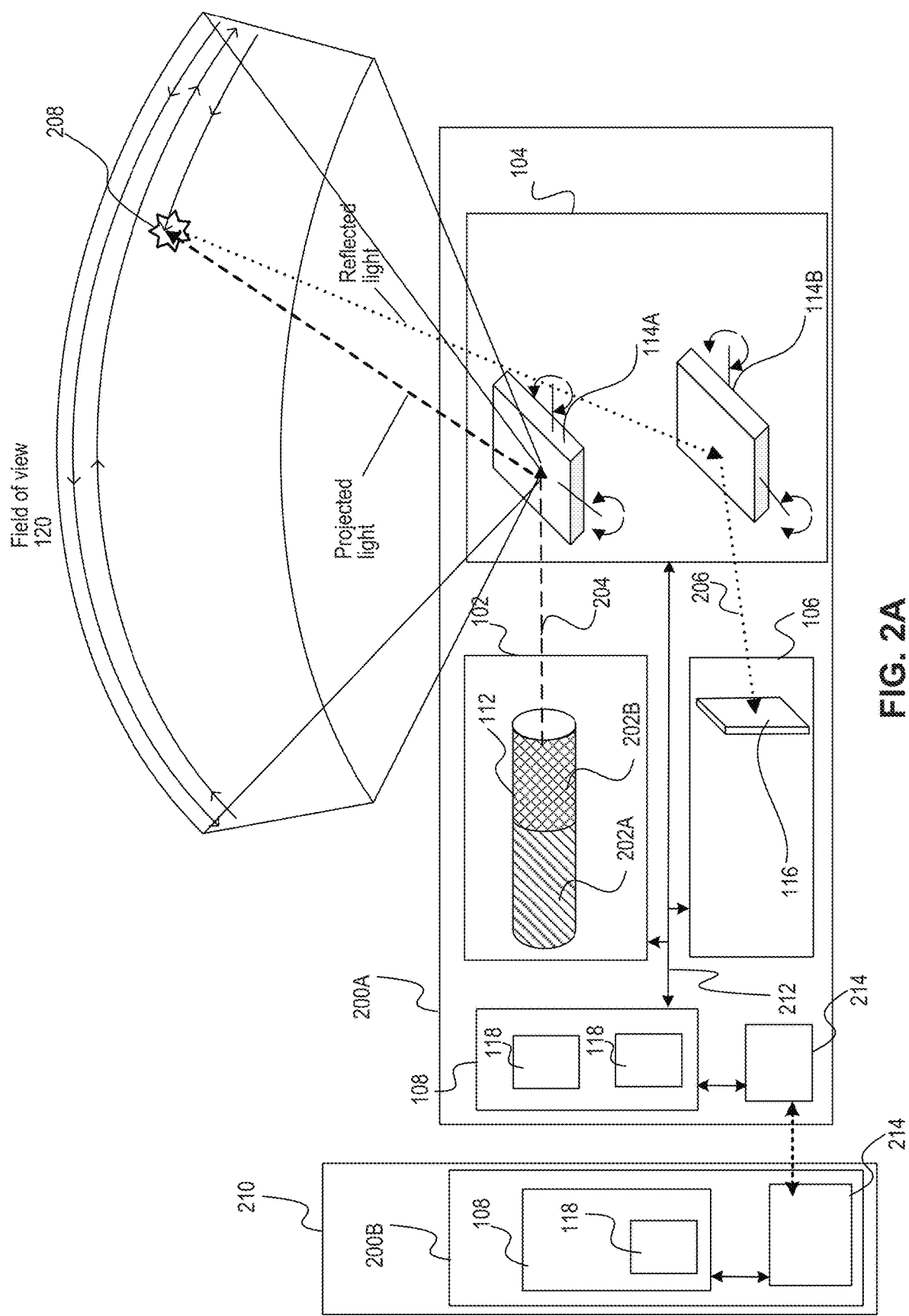
FIGS. 2A, 2B, 2C, 2D, 2E, 2F, and 2G are diagrams illustrating different configurations of projecting units in accordance with some embodiments of the present disclosure.
Figure 2B:
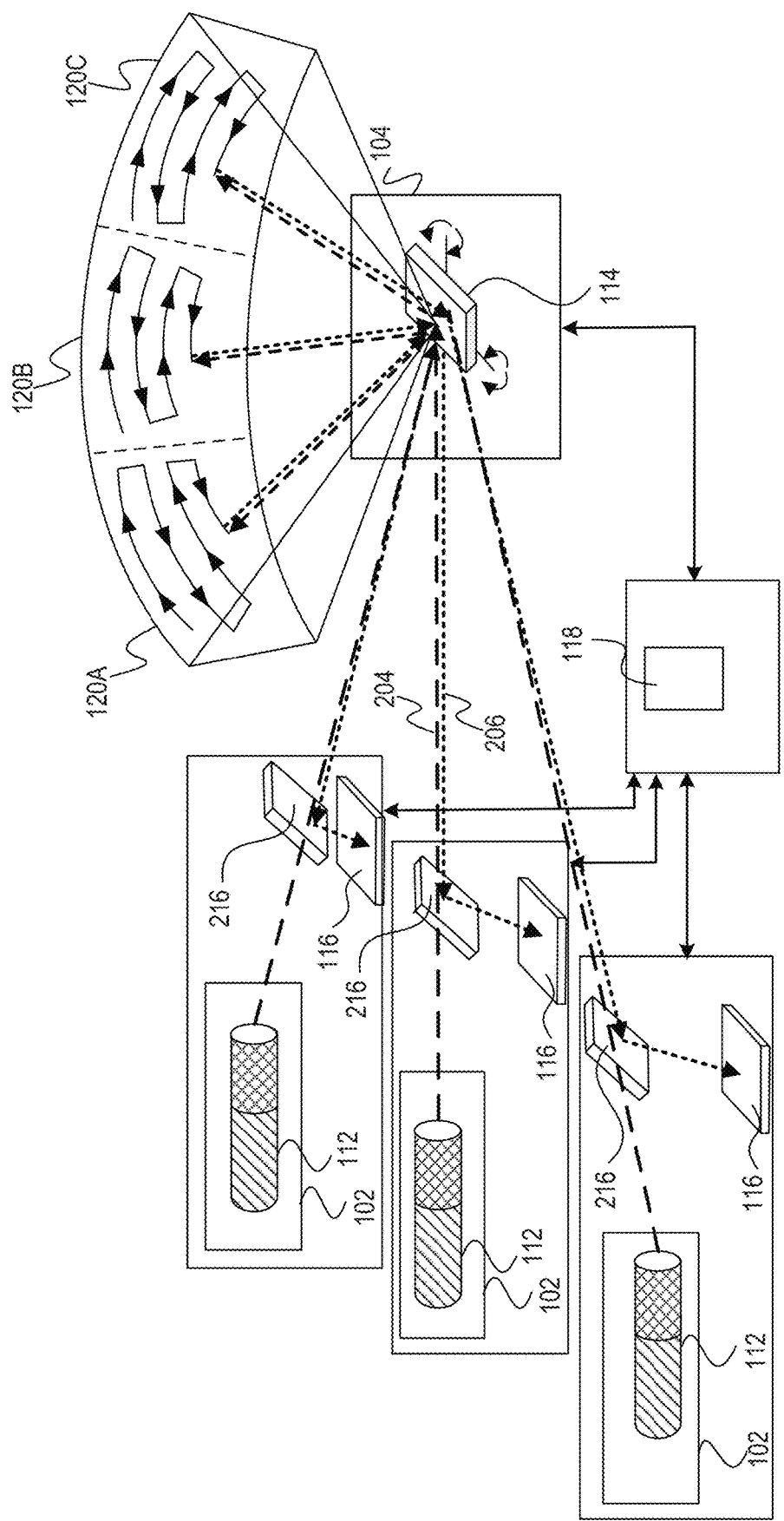
Figure 2C:
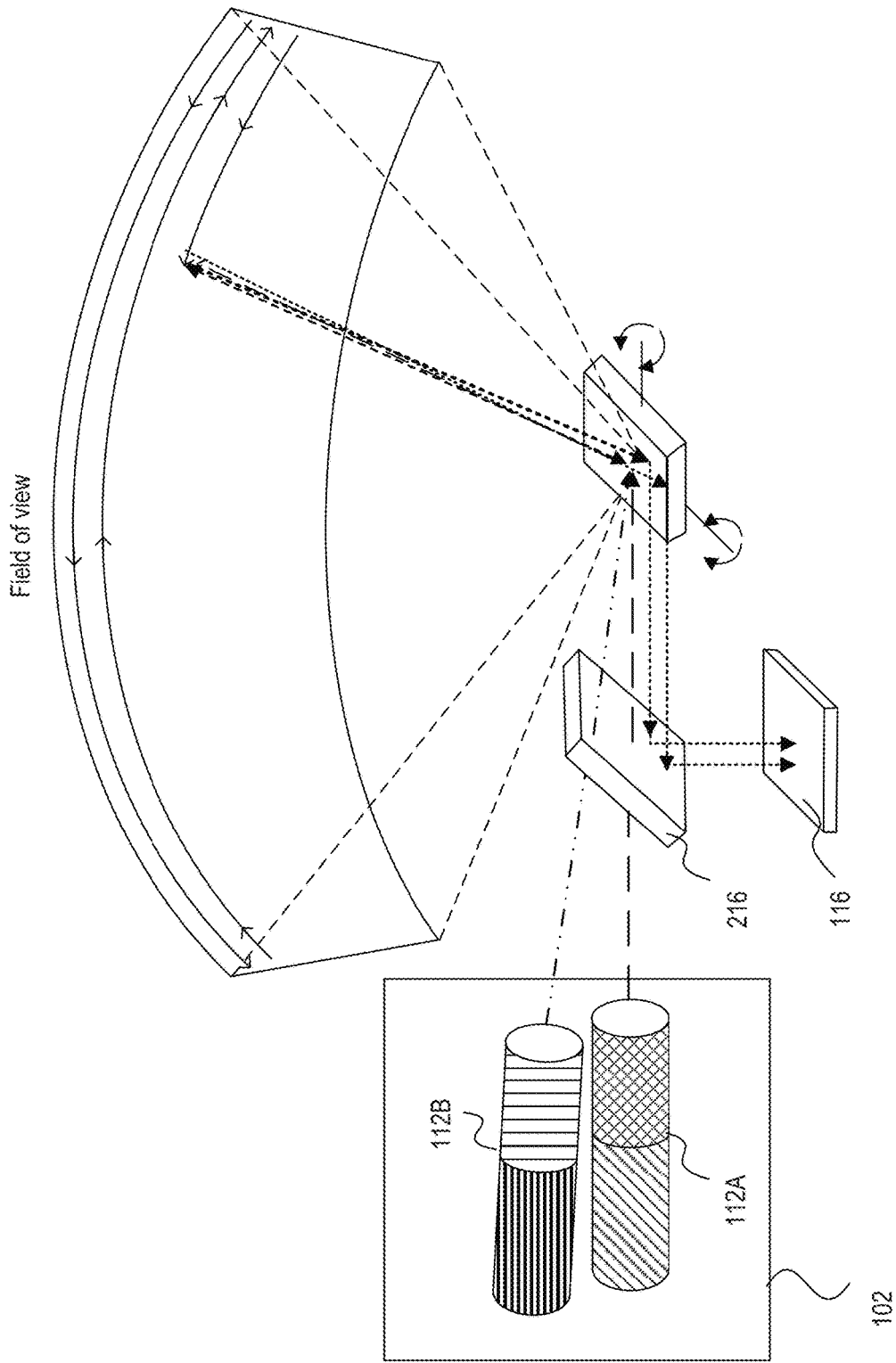
Figure 2D:
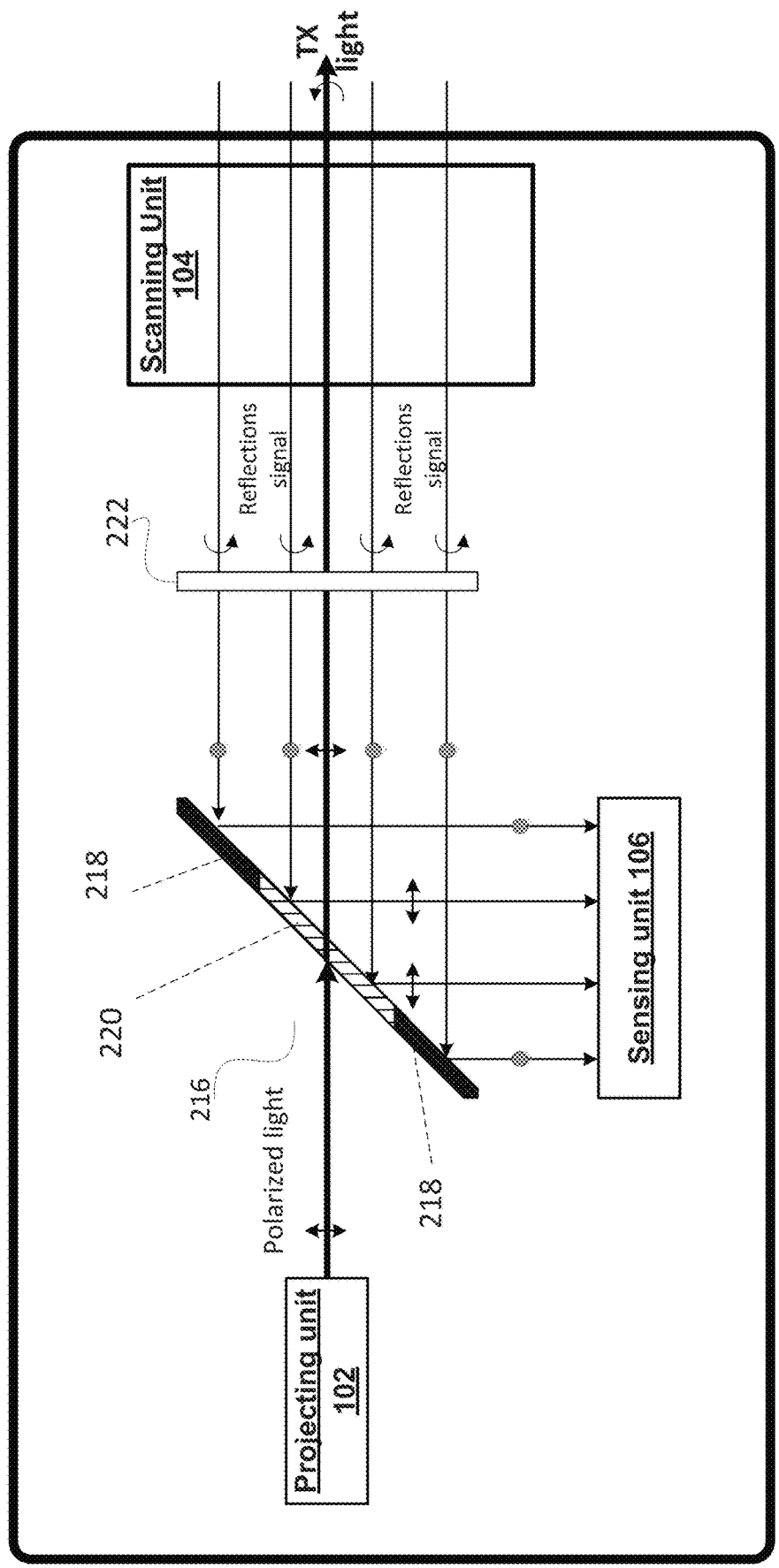
Figure 2E:
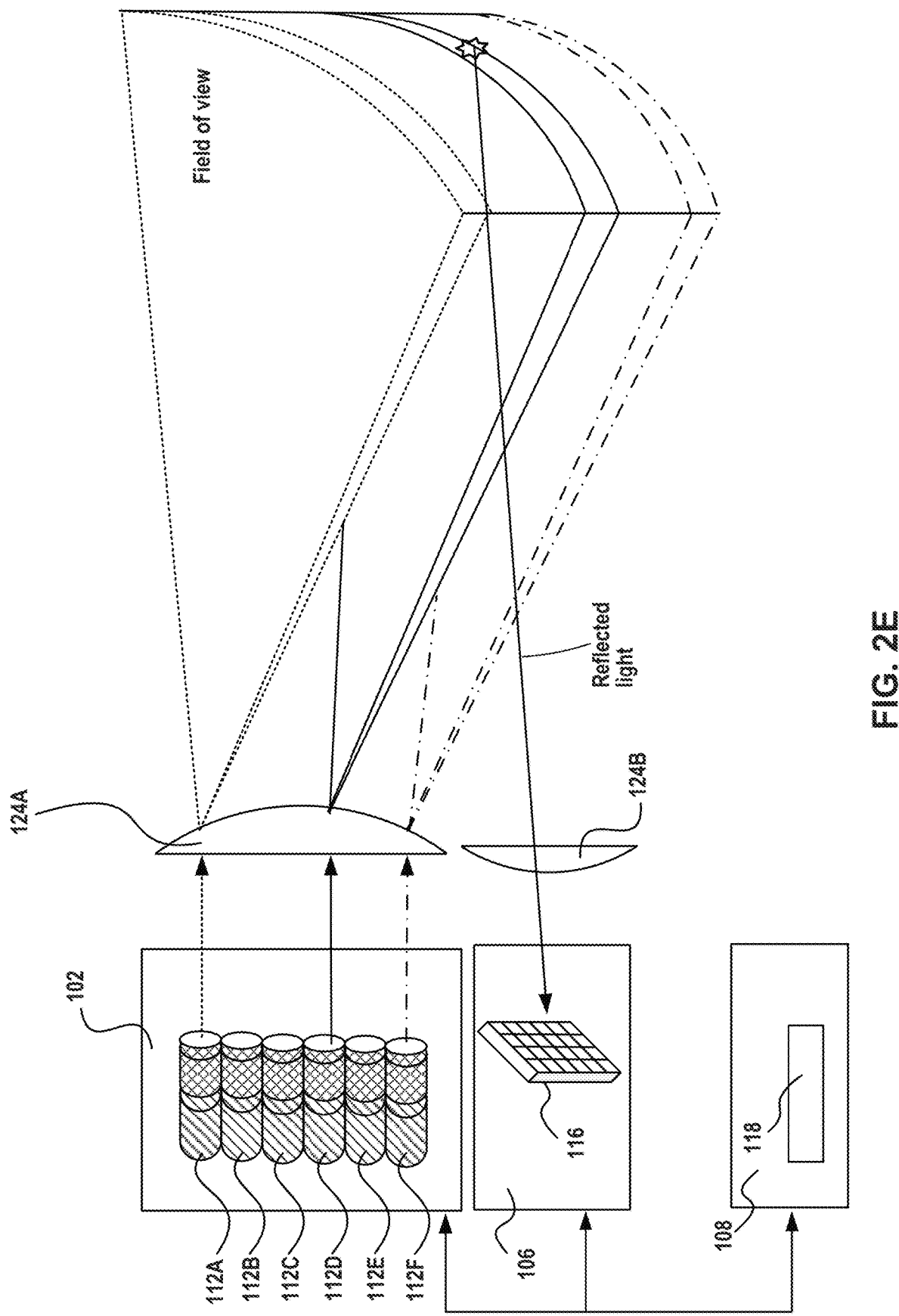
Figure 2F:
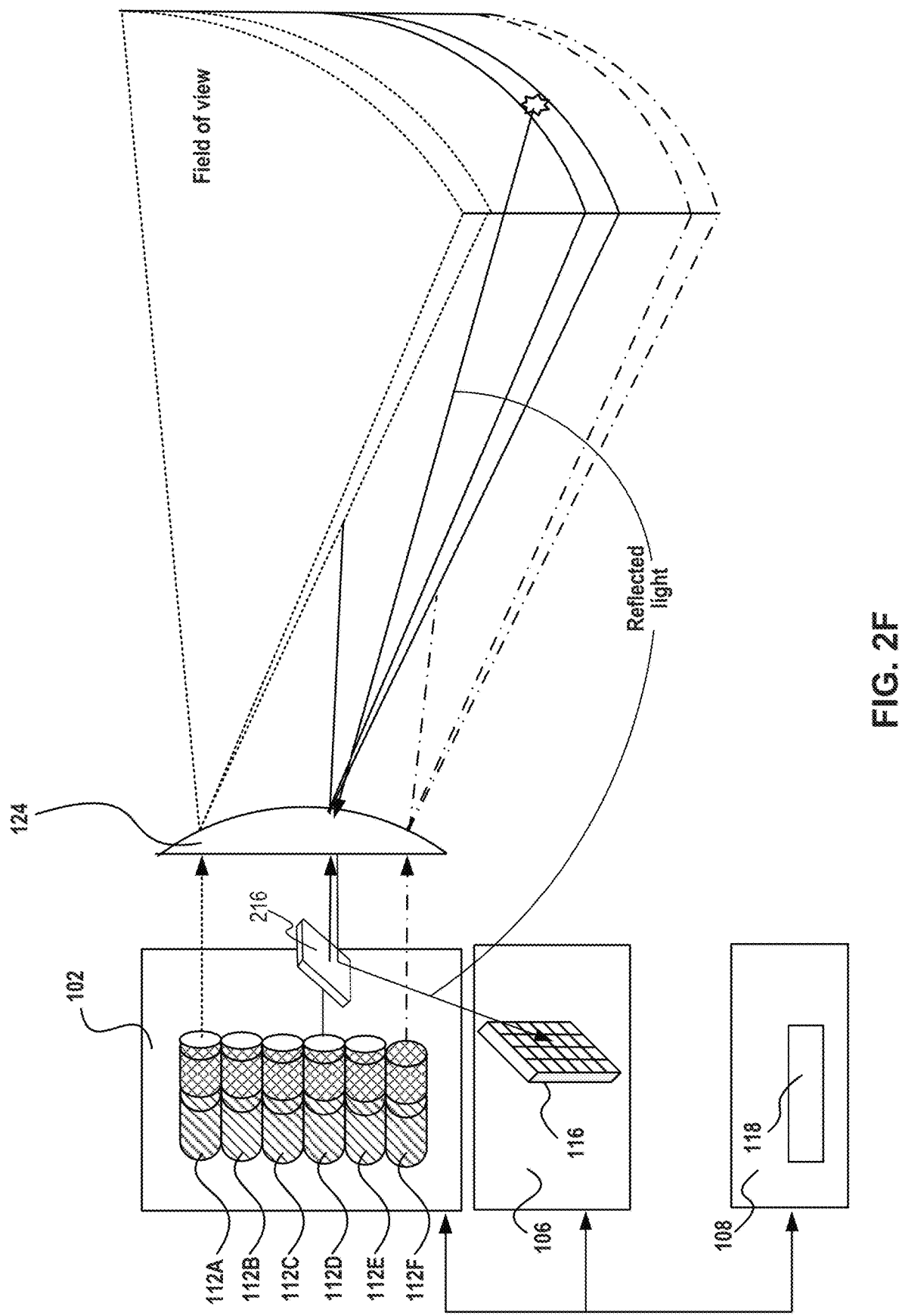
Figure 2G:
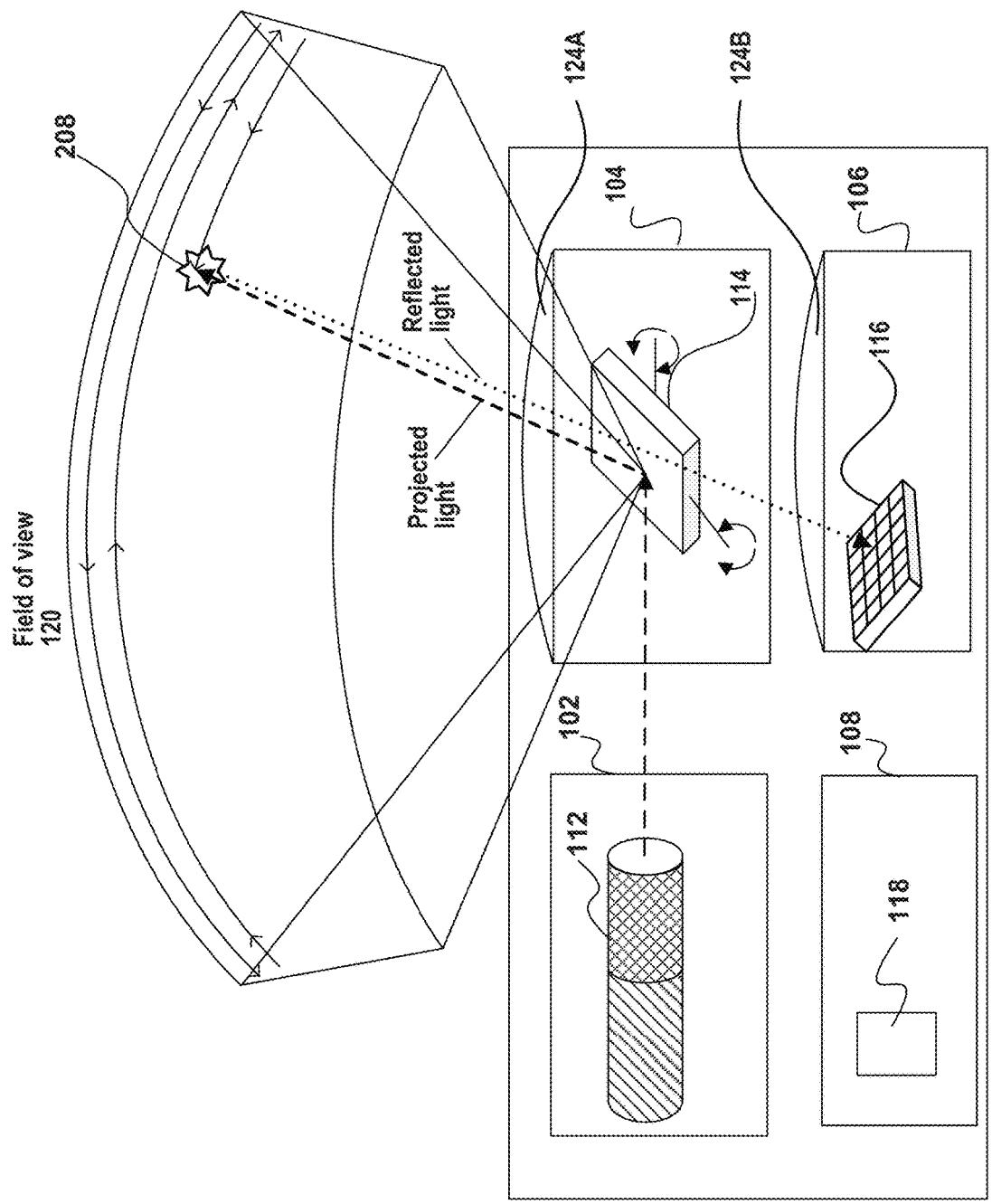

FIGS. 2A-2G depict various configurations of projecting unit 102 and its role in LIDAR system 100. Specifically, FIG. 2A is a diagram illustrating projecting unit 102 with a single light source; FIG. 2B is a diagram illustrating a plurality of projecting units 102 with a plurality of light sources aimed at a common light deflector 114; FIG. 2C is a diagram illustrating projecting unit 102 with a primary and a secondary light sources 112; FIG. 2D is a diagram illustrating an asymmetrical deflector used in some configurations of projecting unit 102; FIG. 2E is a diagram illustrating a first configuration of a non-scanning LIDAR system; FIG. 2F is a diagram illustrating a second configuration of a non-scanning LIDAR system; and FIG. 2G is a diagram illustrating a LIDAR system that scans in the outbound direction and does not scan in the inbound direction. One skilled in the art will appreciate that the depicted configurations of projecting unit 102 may have numerous variations and modifications.

FIG. 2A illustrates an example of a bi-static configuration of LIDAR system 100 in which projecting unit 102 includes a single light source 112. The term "bi-static configuration" broadly refers to LIDAR systems configurations in which the projected light exiting the LIDAR system and the reflected light entering the LIDAR system pass through substantially different optical paths. In some embodiments, a bi-static configuration of LIDAR system 100 may include a separation of the optical paths by using completely different optical components, by using parallel but not fully separated optical components, or by using the same optical components for only part of the of the optical paths (optical components may include, for example, windows, lenses, mirrors, beam splitters, etc.). In the example depicted in FIG. 2A, the bi-static configuration includes a configuration where the outbound light and the inbound light pass through a single optical window 124 but scanning unit 104 includes two light deflectors, a first light deflector 114A for outbound light and a second light deflector 114B for inbound light (the inbound light in LIDAR system includes emitted light reflected from objects in the scene, and may also include ambient light arriving from other sources). In the examples depicted in FIGS. 2E and 2G, the bi-static configuration includes a configuration where the outbound light passes through a first optical window 124A, and the inbound light passes through a second optical window 124B. In all the example configurations above, the inbound and outbound optical paths differ from one another.

In this embodiment, all the components of LIDAR system 100 may be contained within a single housing 200, or may be divided among a plurality of housings. As shown, projecting unit 102 is associated with a single light source 112 that includes a laser diode 202A (or one or more laser diodes coupled together) configured to emit light (projected light 204). In one non-limiting example, the light projected by light source 112 may be at a wavelength between about 800 nm and 950 nm, have an average power between about 50 mW and about 500 mW, have a peak power between about 50 W and about 200 W, and a pulse width of between about 2 ns and about 100 ns. In addition, light source 112 may optionally be associated with optical assembly 202B used for manipulation of the light emitted by laser diode 202A (e.g. for collimation, focusing, etc.). It is noted that other types of light sources 112 may be used, and that the disclosure is not restricted to laser diodes. In addition, light source 112 may emit its light in different formats, such as light pulses, frequency modulated, continuous wave (CW), quasi-CW, or any other form corresponding to the particular light source employed. The projection format and other parameters may be changed by the light source from time to time based on different factors, such as instructions from processing unit 108. The projected light is projected towards an outbound deflector 114A that functions as a steering element for directing the projected light in field of view 120. In this example, scanning unit 104 also include a pivotable return deflector 114B that direct photons (reflected light 206) reflected back from an object 208 within field of view 120 toward sensor 116. The reflected light is detected by sensor 116 and information about the object (e.g., the distance to object 212) is determined by processing unit 108.

In this figure, LIDAR system 100 is connected to a host 210. Consistent with the present disclosure, the term "host" refers to any computing environment that may interface with LIDAR system 100, it may be a vehicle system (e.g., part of vehicle 110), a testing system, a security system, a surveillance system, a traffic control system, an urban modelling system, or any system that monitors its surroundings. Such computing environment may include at least one processor and/or may be connected LIDAR system 100 via the cloud. In some embodiments, host 210 may also include interfaces to external devices such as camera and sensors configured to measure different characteristics of host 210 (e.g., acceleration, steering wheel deflection, reverse drive, etc.). Consistent with the present disclosure, LIDAR system 100 may be fixed to a stationary object associated with host 210 (e.g. a building, a tripod) or to a portable system associated with host 210 (e.g., a portable computer, a movie camera). Consistent with the present disclosure, LIDAR system 100 may be connected to host 210, to provide outputs of LIDAR system 100 (e.g., a 3D model, a reflectivity image) to host 210. Specifically, host 210 may use LIDAR system 100 to aid in detecting and scanning the environment of host 210 or any other environment. In addition, host 210 may integrate, synchronize or otherwise use together the outputs of LIDAR system 100 with outputs of other sensing systems (e.g. cameras, microphones, radar systems). In one example, LIDAR system 100 may be used by a security system.

LIDAR system 100 may also include a bus 212 (or other communication mechanisms) that interconnect subsystems and components for transferring information within LIDAR system 100. Optionally, bus 212 (or another communication mechanism) may be used for interconnecting LIDAR system 100 with host 210. In the example of FIG. 2A, processing unit 108 includes two processors 118 to regulate the operation of projecting unit 102, scanning unit 104, and sensing unit 106 in a coordinated manner based, at least partially, on information received from internal feedback of LIDAR system 100. In other words, processing unit 108 may be configured to dynamically operate LIDAR system 100 in a closed loop. A closed loop system is characterized by having feedback from at least one of the elements and updating one or more parameters based on the received feedback. Moreover, a closed loop system may receive feedback and update its own operation, at least partially, based on that feedback. A dynamic system or element is one that may be updated during operation.

According to some embodiments, scanning the environment around LIDAR system 100 may include illuminating field of view 120 with light pulses. The light pulses may have parameters such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. Scanning the environment around LIDAR system 100 may also include detecting and characterizing various aspects of the reflected light. Characteristics of the reflected light may include, for example: time-of-flight (i.e., time from emission until detection), instantaneous power (e.g., power signature), average power across entire return pulse, and photon distribution/signal over return pulse period. By comparing characteristics of a light pulse with characteristics of corresponding reflections, a distance and possibly a physical characteristic, such as reflected intensity of object 212 may be estimated. By repeating this process across multiple adjacent portions 122, in a predefined pattern (e.g., raster, Lissajous or other patterns) an entire scan of field of view 120 may be achieved. As discussed below in greater detail, in some situations LIDAR system 100 may direct light to only some of the portions 122 in field of view 120 at every scanning cycle. These portions may be adjacent to each other, but not necessarily so.

In another embodiment, LIDAR system 100 may include network interface 214 for communicating with host 210 (e.g., a vehicle controller). The communication between LIDAR system 100 and host 210 is represented by a dashed arrow. In one embodiment, network interface 214 may include an integrated service digital network (ISDN) card, cable modem, satellite modem, or a modem to provide a data communication connection to a corresponding type of telephone line. As another example, network interface 214 may include a local area network (LAN) card to provide a data communication connection to a compatible LAN. In another embodiment, network interface 214 may include an Ethernet port connected to radio frequency receivers and transmitters and/or optical (e.g., infrared) receivers and transmitters. The specific design and implementation of network interface 214 depends on the communications network(s) over which LIDAR system 100 and host 210 are intended to operate. For example, network interface 214 may be used, for example, to provide outputs of LIDAR system 100 to the external system, such as a 3D model, operational parameters of LIDAR system 100, and so on. In other embodiment, the communication unit may be used, for example, to receive instructions from the external system, to receive information regarding the inspected environment, to receive information from another sensor, etc.

FIG. 2B illustrates an example of a monostatic configuration of LIDAR system 100 including a plurality projecting units 102. The term "monostatic configuration" broadly refers to LIDAR system configurations in which the projected light exiting from the LIDAR system and the reflected light entering the LIDAR system pass through substantially similar optical paths. In one example, the outbound light beam and the inbound light beam may share at least one optical assembly through which both outbound and inbound light beams pass. In another example, the outbound light may pass through an optical window (not shown) and the inbound light radiation may pass through the same optical window. A monostatic configuration may include a configuration where the scanning unit 104 includes a single light deflector 114 that directs the projected light towards field of view 120 and directs the reflected light towards a sensor 116. As shown, both projected light 204 and reflected light 206 hits an asymmetrical deflector 216. The term "asymmetrical deflector" refers to any optical device having two sides capable of deflecting a beam of light hitting it from one side in a different direction than it deflects a beam of light hitting it from the second side. In one example, the asymmetrical deflector does not deflect projected light 204 and deflects reflected light 206 towards sensor 116. One example of an asymmetrical deflector may include a polarization beam splitter. In another example, asymmetrical 216 may include an optical isolator that allows the passage of light in only one direction. A diagrammatic representation of asymmetrical deflector 216 is illustrated in FIG. 2D. Consistent with the present disclosure, a monostatic configuration of LIDAR system 100 may include an asymmetrical deflector to prevent reflected light from hitting light source 112, and to direct all the reflected light toward sensor 116, thereby increasing detection sensitivity.

In the embodiment of FIG. 2B, LIDAR system 100 includes three projecting units 102 each with a single of light source 112 aimed at a common light deflector 114. In one embodiment, the plurality of light sources 112 (including two or more light sources) may project light with substantially the same wavelength and each light source 112 is generally associated with a differing area of the field of view (denoted in the figure as 120A, 120B, and 120C). This enables scanning of a broader field of view than can be achieved with a light source 112. In another embodiment, the plurality of light sources 102 may project light with differing wavelengths, and all the light sources 112 may be directed to the same portion (or overlapping portions) of field of view 120.

FIG. 2C illustrates an example of LIDAR system 100 in which projecting unit 102 includes a primary light source 112A and a secondary light source 112B. Primary light source 112A may project light with a longer wavelength than is sensitive to the human eye in order to optimize SNR and detection range. For example, primary light source 112A may project light with a wavelength between about 750 nm and 1100 nm. In contrast, secondary light source 112B may project light with a wavelength visible to the human eye. For example, secondary light source 112B may project light with a wavelength between about 400 nm and 700 nm. In one embodiment, secondary light source 112B may project light along substantially the same optical path the as light projected by primary light source 112A. Both light sources may be time-synchronized and may project light emission together or in interleaved pattern. An interleave pattern means that the light sources are not active at the same time which may mitigate mutual interference. A person who is of skill in the art would readily see that other combinations of wavelength ranges and activation schedules may also be implemented.

Consistent with some embodiments, secondary light source 112B may cause human eyes to blink when it is too close to the LIDAR optical output port. This may ensure an eye safety mechanism not feasible with typical laser sources that utilize the near-infrared light spectrum. In another embodiment, secondary light source 112B may be used for calibration and reliability at a point of service, in a manner somewhat similar to the calibration of headlights with a special reflector/pattern at a certain height from the ground with respect to vehicle 110. An operator at a point of service could examine the calibration of the LIDAR by simple visual inspection of the scanned pattern over a featured target such a test pattern board at a designated distance from LIDAR system 100. In addition, secondary light source 112B may provide means for operational confidence that the LIDAR is working for the end-user. For example, the system may be configured to permit a human to place a hand in front of light deflector 114 to test its operation.

Secondary light source 112B may also have a non-visible element that can double as a backup system in case primary light source 112A fails. This feature may be useful for fail-safe devices with elevated functional safety ratings. Given that secondary light source 112B may be visible and also due to reasons of cost and complexity, secondary light source 112B may be associated with a smaller power compared to primary light source 112A. Therefore, in case of a failure of primary light source 112A, the system functionality will fall back to secondary light source 112B set of functionalities and capabilities. While the capabilities of secondary light source 112B may be inferior to the capabilities of primary light source 112A, LIDAR system 100 system may be designed in such a fashion to enable vehicle 110 to safely arrive its destination.

FIG. 2D illustrates asymmetrical deflector 216 that may be part of LIDAR system 100. In the illustrated example, asymmetrical deflector 216 includes a reflective surface 218 (such as a mirror) and a one-way deflector 220. While not necessarily so, asymmetrical deflector 216 may optionally be a static deflector. Asymmetrical deflector 216 may be used in a monostatic configuration of LIDAR system 100, in order to allow a common optical path for transmission and for reception of light via the at least one deflector 114, e.g. as illustrated in FIGS. 2B and 2C. However, typical asymmetrical deflectors such as beam splitters are characterized by energy losses, especially in the reception path, which may be more sensitive to power loses than the transmission path.

As depicted in FIG. 2D, LIDAR system 100 may include asymmetrical deflector 216 positioned in the transmission path, which includes one-way deflector 220 for separating between the transmitted and received light signals. Optionally, one-way deflector 220 may be substantially transparent to the transmission light and substantially reflective to the received light. The transmitted light is generated by projecting unit 102 and may travel through one-way deflector 220 to scanning unit 104 which deflects it towards the optical outlet. The received light arrives through the optical inlet, to the at least one deflecting element 114, which deflects the reflections signal into a separate path away from the light source and towards sensing unit 106. Optionally, asymmetrical deflector 216 may be combined with a polarized light source 112 which is linearly polarized with the same polarization axis as one-way deflector 220. Notably, the cross-section of the outbound light beam is much smaller than that of the reflections signals. Accordingly, LIDAR system 100 may include one or more optical components (e.g. lens, collimator) for focusing or otherwise manipulating the emitted polarized light beam to the dimensions of the asymmetrical deflector 216. In one embodiment, one-way deflector 220 may be a polarizing beam splitter that is virtually transparent to the polarized light beam.

Consistent with some embodiments, LIDAR system 100 may further include optics 222 (e.g., a quarter wave plate retarder) for modifying a polarization of the emitted light. For example, optics 222 may modify a linear polarization of the emitted light beam to circular polarization. Light reflected back to system 100 from the field of view would arrive back through deflector 114 to optics 222, bearing a circular polarization with a reversed handedness with respect to the transmitted light. Optics 222 would then convert the received reversed handedness polarization light to a linear polarization that is not on the same axis as that of the polarized beam splitter 216. As noted above, the received light-patch is larger than the transmitted light-patch, due to optical dispersion of the beam traversing through the distance to the target.

Some of the received light will impinge on one-way deflector 220 that will reflect the light towards sensor 106 with some power loss. However, another part of the received patch of light will fall on a reflective surface 218 which surrounds one-way deflector 220 (e.g., polarizing beam splitter slit). Reflective surface 218 will reflect the light towards sensing unit 106 with substantially zero power loss. One-way deflector 220 would reflect light that is composed of various polarization axes and directions that will eventually arrive at the detector. Optionally, sensing unit 106 may include sensor 116 that is agnostic to the laser polarization, and is primarily sensitive to the amount of impinging photons at a certain wavelength range.

It is noted that the proposed asymmetrical deflector 216 provides far superior performances when compared to a simple mirror with a passage hole in it. In a mirror with a hole, all of the reflected light which reaches the hole is lost to the detector. However, in deflector 216, one-way deflector 220 deflects a significant portion of that light (e.g., about 50%) toward the respective sensor 116. In LIDAR systems, the number photons reaching the LIDAR from remote distances is very limited, and therefore the improvement in photon capture rate is important.

According to some embodiments, a device for beam splitting and steering is described. A polarized beam may be emitted from a light source having a first polarization. The emitted beam may be directed to pass through a polarized beam splitter assembly. The polarized beam splitter assembly includes on a first side a one-directional slit and on an opposing side a mirror. The one-directional slit enables the polarized emitted beam to travel toward a quarter-waveplate/wave-retarder which changes the emitted signal from a polarized signal to a linear signal (or vice versa) so that subsequently reflected beams cannot travel through the one-directional slit.

FIG. 2E shows an example of a bi-static configuration of LIDAR system 100 without scanning unit 104. In order to illuminate an entire field of view (or substantially the entire field of view) without deflector 114, projecting unit 102 may optionally include an array of light sources (e.g., 112A-112F). In one embodiment, the array of light sources may include a linear array of light sources controlled by processor 118. For example, processor 118 may cause the linear array of light sources to sequentially project collimated laser beams towards first optional optical window 124A. First optional optical window 124A may include a diffuser lens for spreading the projected light and sequentially forming wide horizontal and narrow vertical beams. Optionally, some or all of the at least one light source 112 of system 100 may project light concurrently. For example, processor 118 may cause the array of light sources to simultaneously project light beams from a plurality of non-adjacent light sources 112. In the depicted example, light source 112A, light source 112D, and light source 112F simultaneously project laser beams towards first optional optical window 124A thereby illuminating the field of view with three narrow vertical beams. The light beam from fourth light source 112D may reach an object in the field of view. The light reflected from the object may be captured by second optical window 124B and may be redirected to sensor 116. The configuration depicted in FIG. 2E is considered to be a bi-static configuration because the optical paths of the projected light and the reflected light are substantially different. It is noted that projecting unit 102 may also include a plurality of light sources 112 arranged in non-linear configurations, such as a two dimensional array, in hexagonal tiling, or in any other way.

FIG. 2F illustrates an example of a monostatic configuration of LIDAR system 100 without scanning unit 104. Similar to the example embodiment represented in FIG. 2E, in order to illuminate an entire field of view without deflector 114, projecting unit 102 may include an array of light sources (e.g., 112A-112F). But, in contrast to FIG. 2E, this configuration of LIDAR system 100 may include a single optical window 124 for both the projected light and for the reflected light. Using asymmetrical deflector 216, the reflected light may be redirected to sensor 116. The configuration depicted in FIG. 2E is considered to be a monostatic configuration because the optical paths of the projected light and the reflected light are substantially similar to one another. The term "substantially similar" in the context of the optical paths of the projected light and the reflected light means that the overlap between the two optical paths may be more than 80%, more than 85%, more than 90%, or more than 95%.

FIG. 2G illustrates an example of a bi-static configuration of LIDAR system 100. The configuration of LIDAR system 100 in this figure is similar to the configuration shown in FIG. 2A. For example, both configurations include a scanning unit 104 for directing projected light in the outbound direction toward the field of view. But, in contrast to the embodiment of FIG. 2A, in this configuration, scanning unit 104 does not redirect the reflected light in the inbound direction. Instead the reflected light passes through second optical window 124B and enters sensor 116. The configuration depicted in FIG. 2G is considered to be a bi-static configuration because the optical paths of the projected light and the reflected light are substantially different from one another. The term "substantially different" in the context of the optical paths of the projected light and the reflected light means that the overlap between the two optical paths may be less than 10%, less than 5%, less than 1%, or less than 0.25%.

The Scanning Unit

Figure 3A:
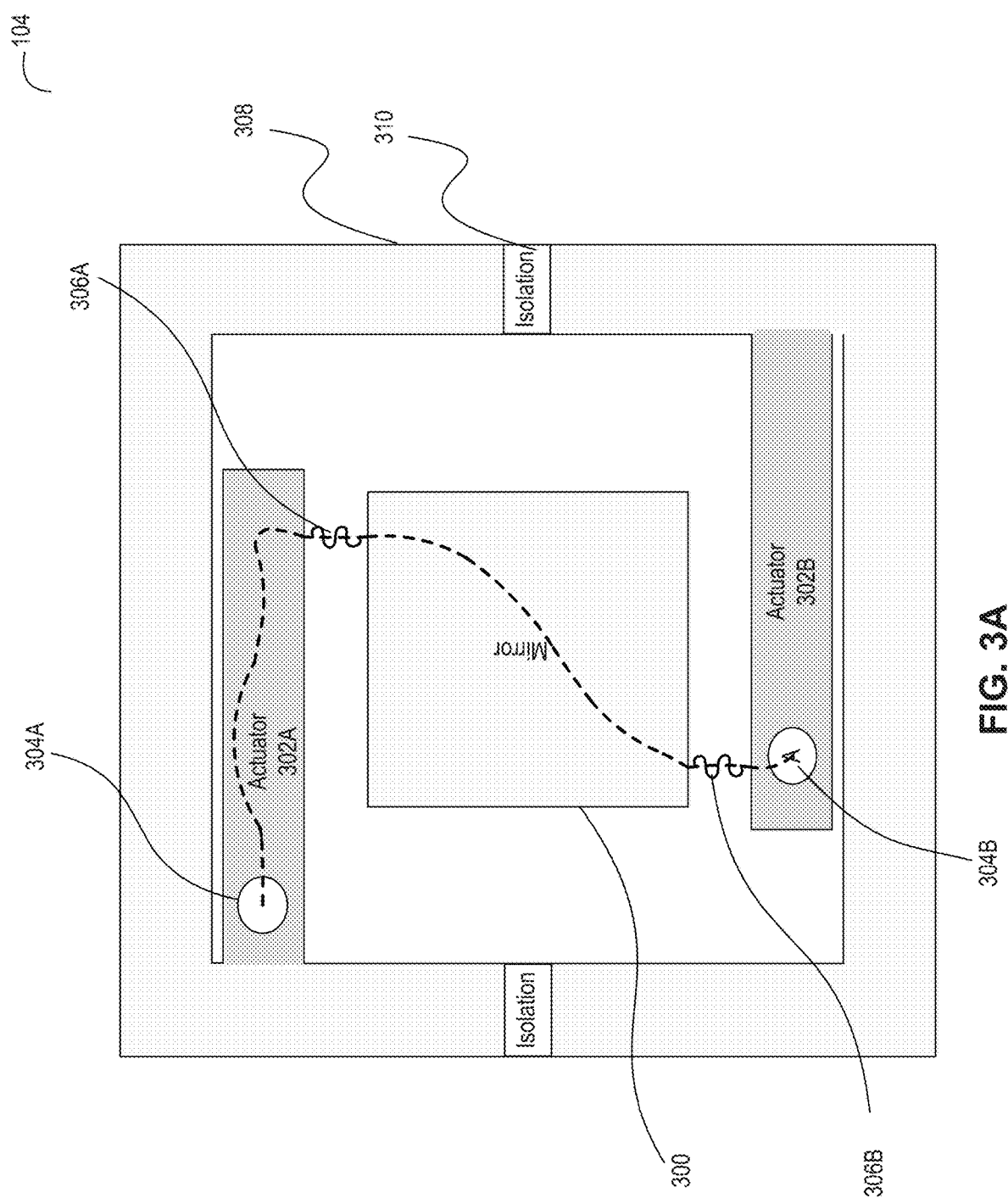
Figure 3B:
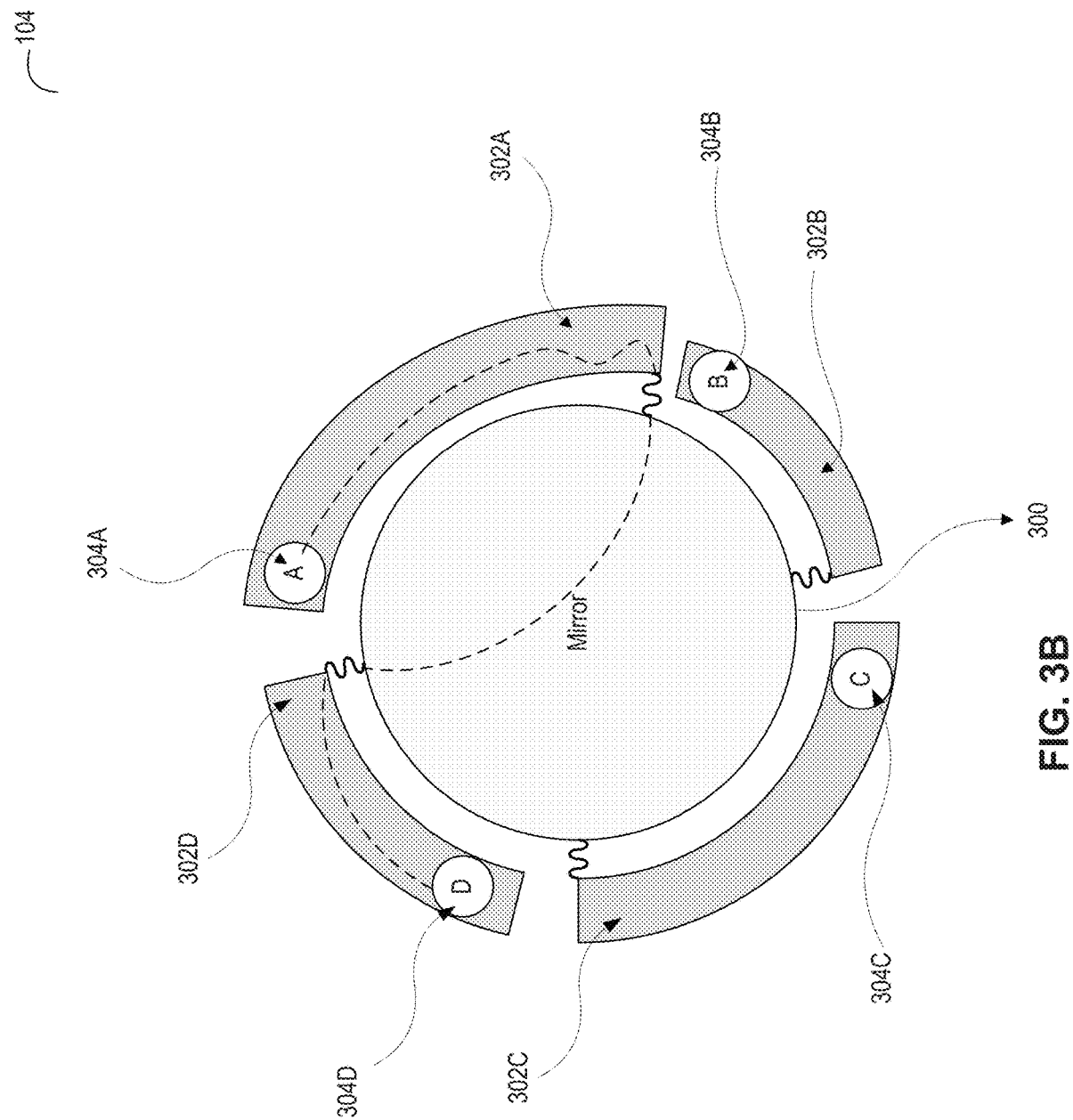
Figure 3C:
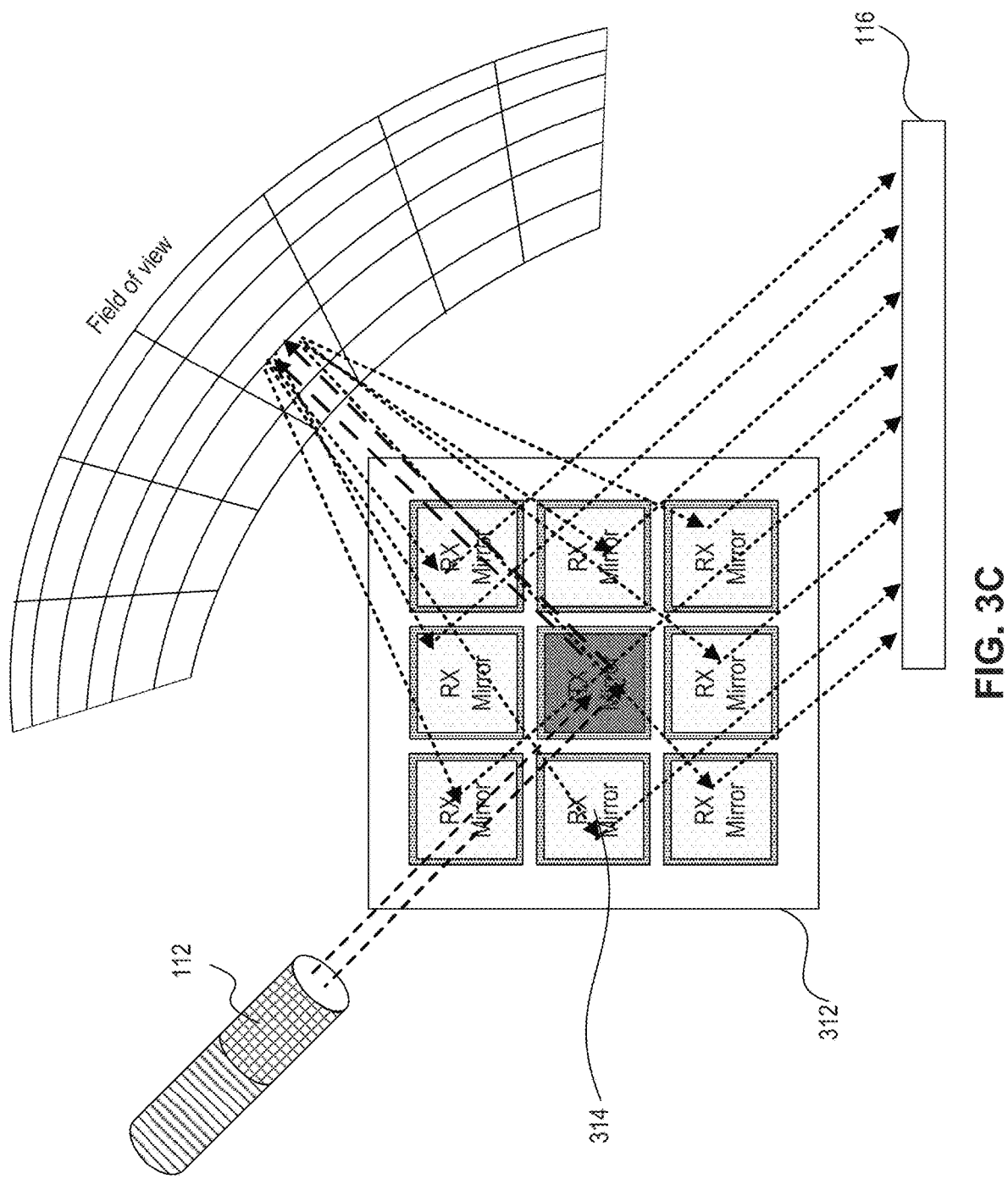

FIGS. 3A-3D depict various configurations of scanning unit 104 and its role in LIDAR system 100. Specifically, FIG. 3A is a diagram illustrating scanning unit 104 with a MEMS mirror (e.g., square shaped), FIG. 3B is a diagram illustrating another scanning unit 104 with a MEMS mirror (e.g., round shaped), FIG. 3C is a diagram illustrating scanning unit 104 with an array of reflectors used for monostatic scanning LIDAR system, and FIG. 3D is a diagram illustrating an example LIDAR system 100 that mechanically scans the environment around LIDAR system 100. One skilled in the art will appreciate that the depicted configurations of scanning unit 104 are exemplary only, and may have numerous variations and modifications within the scope of this disclosure.

FIG. 3A illustrates an example scanning unit 104 with a single axis square MEMS mirror 300. In this example MEMS mirror 300 functions as at least one deflector 114. As shown, scanning unit 104 may include one or more actuators 302 (specifically, 302A and 302B). In one embodiment, actuator 302 may be made of semiconductor (e.g., silicon) and includes a piezoelectric layer (e.g. PZT, Lead zirconate titanate, aluminum nitride), which changes its dimension in response to electric signals applied by an actuation controller, a semi conductive layer, and a base layer. In one embodiment, the physical properties of actuator 302 may determine the mechanical stresses that actuator 302 experiences when electrical current passes through it. When the piezoelectric material is activated it exerts force on actuator 302 and causes it to bend. In one embodiment, the resistivity of one or more actuators 302 may be measured in an active state (Ractive) when mirror 300 is deflected at a certain angular position and compared to the resistivity at a resting state (Rrest). Feedback including Ractive may provide information to determine the actual mirror deflection angle compared to an expected angle, and, if needed, mirror 300 deflection may be corrected. The difference between Rrest and Ractive may be correlated by a mirror drive into an angular deflection value that may serve to close the loop. This embodiment may be used for dynamic tracking of the actual mirror position and may optimize response, amplitude, deflection efficiency, and frequency for both linear mode and resonant mode MEMS mirror schemes.

During scanning, current (represented in the figure as the dashed line) may flow from contact 304A to contact 304B (through actuator 302A, spring 306A, mirror 300, spring 306B, and actuator 302B). Isolation gaps in semiconducting frame 308 such as isolation gap 310 may cause actuator 302A and 302B to be two separate islands connected electrically through springs 306 and frame 308. The current flow, or any associated electrical parameter (voltage, current frequency, capacitance, relative dielectric constant, etc.), may be monitored by an associated position feedback. In case of a mechanical failure—where one of the components is damaged—the current flow through the structure would alter and change from its functional calibrated values. At an extreme situation (for example, when a spring is broken), the current would stop completely due to a circuit break in the electrical chain by means of a faulty element.

FIG. 3B illustrates another example scanning unit 104 with a dual axis round MEMS mirror 300. In this example MEMS mirror 300 functions as at least one deflector 114. In one embodiment, MEMS mirror 300 may have a diameter of between about 1 mm to about 5 mm. As shown, scanning unit 104 may include four actuators 302 (302A, 302B, 302C, and 302D) each may be at a differing length. In the illustrated example, the current (represented in the figure as the dashed line) flows from contact 304A to contact 304D, but in other cases current may flow from contact 304A to contact 304B, from contact 304A to contact 304C, from contact 304B to contact 304C, from contact 304B to contact 304D, or from contact 304C to contact 304D. Consistent with some embodiments, a dual axis MEMS mirror may be configured to deflect light in a horizontal direction and in a vertical direction. For example, the angles of deflection of a dual axis MEMS mirror may be between about 0° to 30° in the vertical direction and between about 0° to 50° in the horizontal direction. One skilled in the art will appreciate that the depicted configuration of mirror 300 may have numerous variations and modifications. In one example, at least of deflector 114 may have a dual axis square-shaped mirror or single axis round-shaped mirror. Examples of round and square mirror are depicted in FIG. 3A and 3B as examples only. Any shape may be employed depending on system specifications. In one embodiment, actuators 302 may be incorporated as an integral part of at least of deflector 114, such that power to move MEMS mirror 300 is applied directly towards it. In addition, MEMS mirror 300 may be connected to frame 308 by one or more rigid supporting elements. In another embodiment, at least of deflector 114 may include an electrostatic or electromagnetic MEMS mirror.

As described above, a monostatic scanning LIDAR system utilizes at least a portion of the same optical path for emitting projected light 204 and for receiving reflected light 206. The light beam in the outbound path may be collimated and focused into a narrow beam while the reflections in the return path spread into a larger patch of light, due to dispersion. In one embodiment, scanning unit 104 may have a large reflection area in the return path and asymmetrical deflector 216 that redirects the reflections (i.e., reflected light 206) to sensor 116. In one embodiment, scanning unit 104 may include a MEMS mirror with a large reflection area and negligible impact on the field of view and the frame rate performance. Additional details about the asymmetrical deflector 216 are provided below with reference to FIG. 2D.

In some embodiments (e.g. as exemplified in FIG. 3C), scanning unit 104 may include a deflector array (e.g. a reflector array) with small light deflectors (e.g. mirrors). In one embodiment, implementing light deflector 114 as a group of smaller individual light deflectors working in synchronization may allow light deflector 114 to perform at a high scan rate with larger angles of deflection. The deflector array may essentially act as a large light deflector (e.g. a large mirror) in terms of effective area. The deflector array may be operated using a shared steering assembly configuration that allows sensor 116 to collect reflected photons from substantially the same portion of field of view 120 being concurrently illuminated by light source 112. The term "concurrently" means that the two selected functions occur during coincident or overlapping time periods, either where one begins and ends during the duration of the other, or where a later one starts before the completion of the other.

FIG. 3C illustrates an example of scanning unit 104 with a reflector array 312 having small mirrors. In this embodiment, reflector array 312 functions as at least one deflector 114. Reflector array 312 may include a plurality of reflector units 314 configured to pivot (individually or together) and steer light pulses toward field of view 120. For example, reflector array 312 may be a part of an outbound path of light projected from light source 112. Specifically, reflector array 312 may direct projected light 204 towards a portion of field of view 120. Reflector array 312 may also be part of a return path for light reflected from a surface of an object located within an illumined portion of field of view 120. Specifically, reflector array 312 may direct reflected light 206 towards sensor 116 or towards asymmetrical deflector 216. In one example, the area of reflector array 312 may be between about 75 to about 150 mm$^2$, where each reflector units 314 may have a width of about 10 μm and the supporting structure may be lower than 100 μm.

According to some embodiments, reflector array 312 may include one or more sub-groups of steerable deflectors. Each sub-group of electrically steerable deflectors may include one or more deflector units, such as reflector unit 314. For example, each steerable deflector unit 314 may include at least one of a MEMS mirror, a reflective surface assembly, and an electromechanical actuator. In one embodiment, each reflector unit 314 may be individually controlled by an individual processor (not shown), such that it may tilt towards a specific angle along each of one or two separate axes. Alternatively, reflector array 312 may be associated with a common controller (e.g., processor 118) configured to synchronously manage the movement of reflector units 314 such that at least part of them will pivot concurrently and point in approximately the same direction.

In addition, at least one processor 118 may select at least one reflector unit 314 for the outbound path (referred to hereinafter as "TX Mirror") and a group of reflector units 314 for the return path (referred to hereinafter as "RX Mirror"). Consistent with the present disclosure, increasing the number of TX Mirrors may increase a reflected photons beam spread. Additionally, decreasing the number of RX Mirrors may narrow the reception field and compensate for ambient light conditions (such as clouds, rain, fog, extreme heat, and other environmental conditions) and improve the signal to noise ratio. Also, as indicated above, the emitted light beam is typically narrower than the patch of reflected light, and therefore can be fully deflected by a small portion of the deflection array. Moreover, it is possible to block light reflected from the portion of the deflection array used for transmission (e.g. the TX mirror) from reaching sensor 116, thereby reducing an effect of internal reflections of the LIDAR system 100 on system operation. In addition, at least one processor 118 may pivot one or more reflector units 314 to overcome mechanical impairments and drifts due, for example, to thermal and gain effects. In an example, one or more reflector units 314 may move differently than intended (frequency, rate, speed etc.) and their movement may be compensated for by electrically controlling the deflectors appropriately.

FIG. 3D illustrates an exemplary LIDAR system 100 that mechanically scans the environment of LIDAR system 100. In this example, LIDAR system 100 may include a motor or other mechanisms for rotating housing 200 about the axis of the LIDAR system 100. Alternatively, the motor (or other mechanism) may mechanically rotate a rigid structure of LIDAR system 100 on which one or more light sources 112 and one or more sensors 116 are installed, thereby scanning the environment. As described above, projecting unit 102 may include at least one light source 112 configured to project light emission. The projected light emission may travel along an outbound path towards field of view 120. Specifically, the projected light emission may be reflected by deflector 114A through an exit aperture 314 when projected light 204 travel towards optional optical window 124. The reflected light emission may travel along a return path from object 208 towards sensing unit 106. For example, the reflected light 206 may be reflected by deflector 114B when reflected light 206 travels towards sensing unit 106. A person skilled in the art would appreciate that a LIDAR system with a rotation mechanism for synchronically rotating one or more light sources or one or more sensors, may use this synchronized rotation instead of (or in addition to) steering an internal light deflector.

In embodiments in which the scanning of field of view 120 is mechanical, the projected light emission may be directed to exit aperture 314 that is part of a wall 316 separating projecting unit 102 from other parts of LIDAR system 100. In some examples, wall 316 can be formed from a transparent material (e.g., glass) coated with a reflective material to form deflector 114B. In this example, exit aperture 314 may correspond to the portion of wall 316 that is not coated by the reflective material. Additionally or alternatively, exit aperture 314 may include a hole or cut-away in the wall 316. Reflected light 206 may be reflected by deflector 114B and directed towards an entrance aperture 318 of sensing unit 106. In some examples, an entrance aperture 318 may include a filtering window configured to allow wavelengths in a certain wavelength range to enter sensing unit 106 and attenuate other wavelengths. The reflections of object 208 from field of view 120 may be reflected by deflector 114B and hit sensor 116. By comparing several properties of reflected light 206 with projected light 204, at least one aspect of object 208 may be determined. For example, by comparing a time when projected light 204 was emitted by light source 112 and a time when sensor 116 received reflected light 206, a distance between object 208 and LIDAR system 100 may be determined. In some examples, other aspects of object 208, such as shape, color, material, etc. may also be determined.

In some examples, the LIDAR system 100 (or part thereof, including at least one light source 112 and at least one sensor 116) may be rotated about at least one axis to determine a three-dimensional map of the surroundings of the LIDAR system 100. For example, the LIDAR system 100 may be rotated about a substantially vertical axis as illustrated by arrow 320 in order to scan field of 120. Although FIG. 3D illustrates that the LIDAR system 100 is rotated clock-wise about the axis as illustrated by the arrow 320, additionally or alternatively, the LIDAR system 100 may be rotated in a counter clockwise direction. In some examples, the LIDAR system 100 may be rotated 360 degrees about the vertical axis. In other examples, the LIDAR system 100 may be rotated back and forth along a sector smaller than 360-degree of the LIDAR system 100.

For example, the LIDAR system 100 may be mounted on a platform that wobbles back and forth about the axis without making a complete rotation.

The Sensing Unit

Figure 4A:
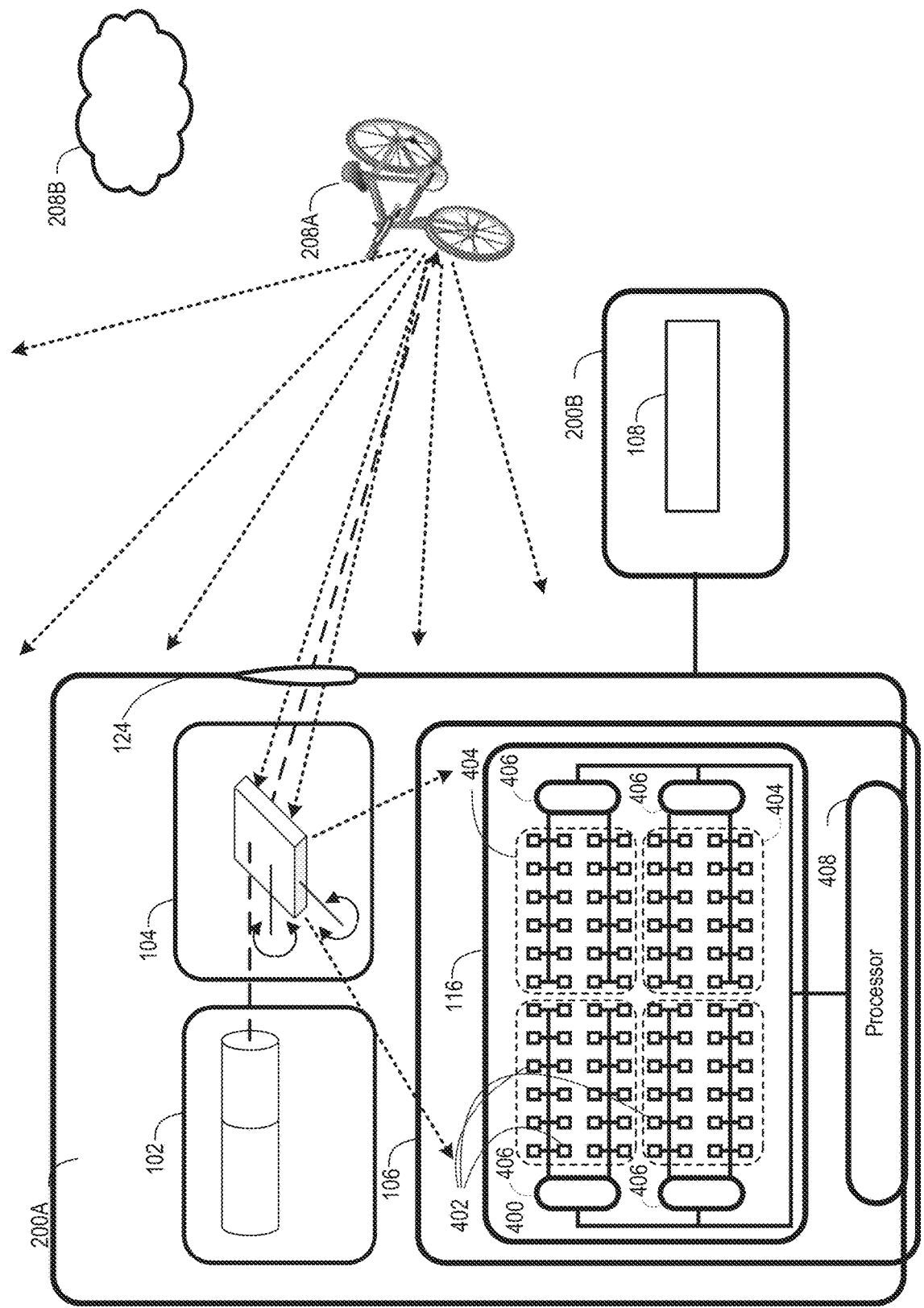
FIGS. 4A, 4B, 4C, 4D, and 4E are diagrams illustrating different configurations of sensing units in accordance with some embodiments of the present disclosure.
Figure 4B:
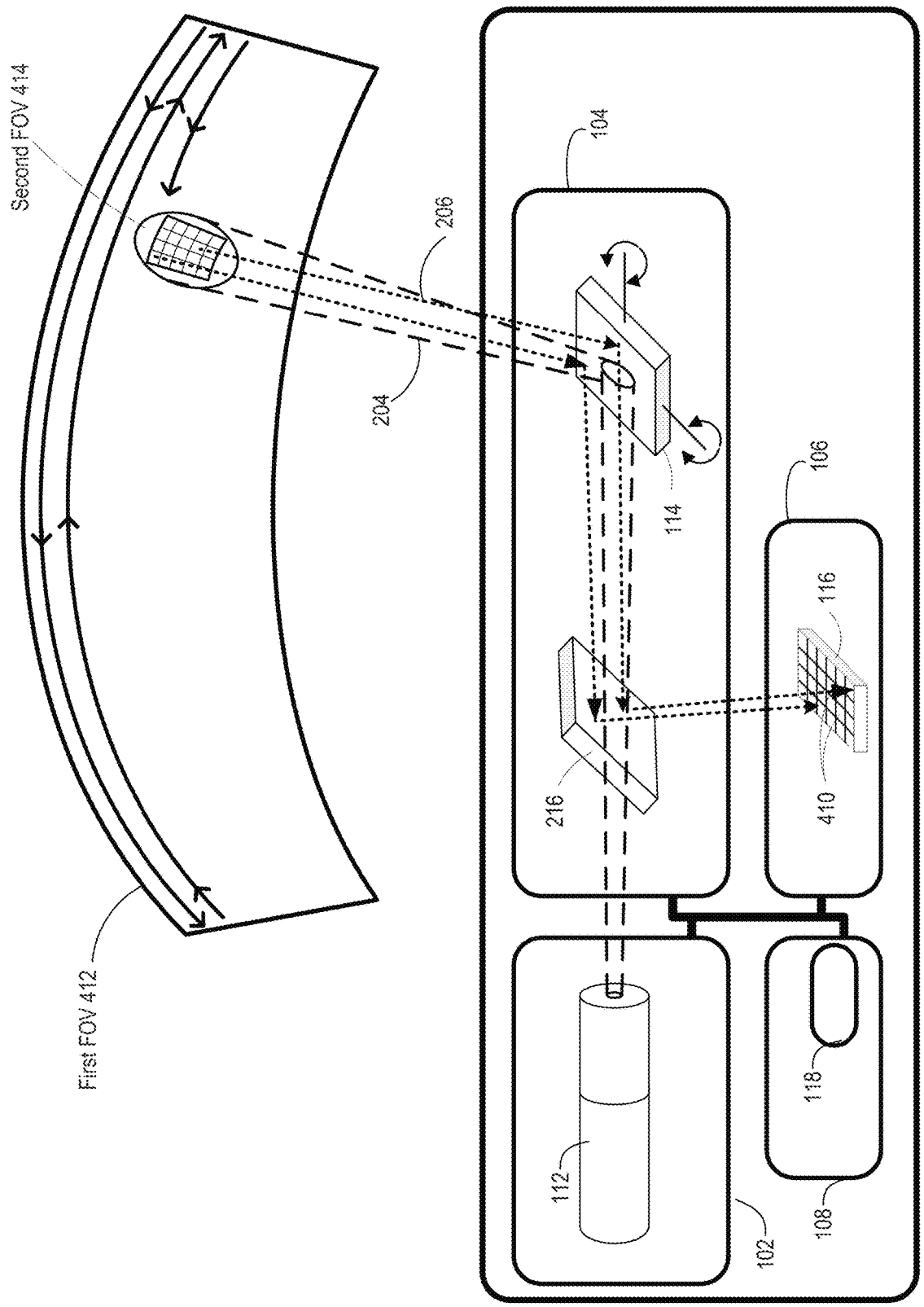
Figure 4C:
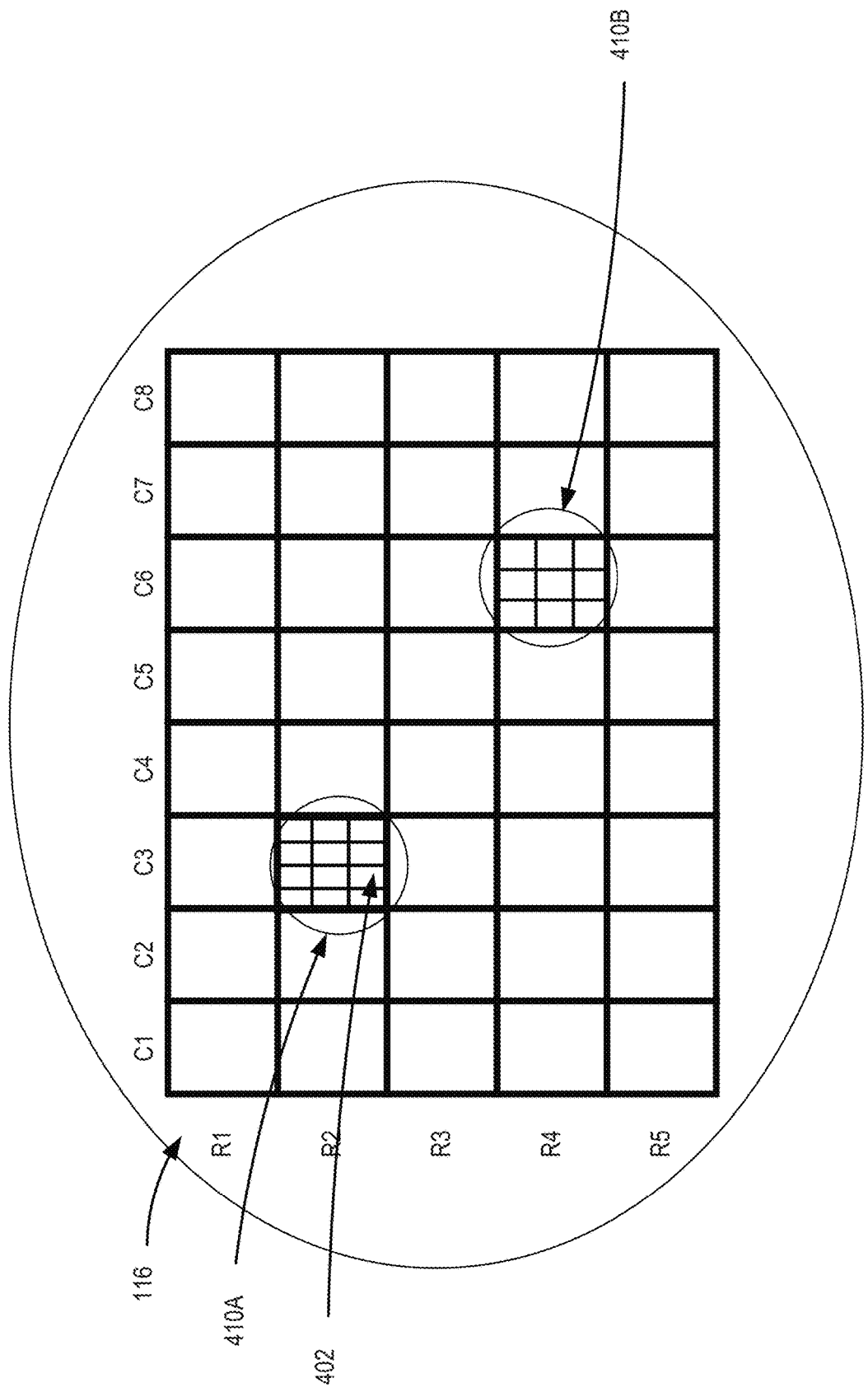
Figure 4D:
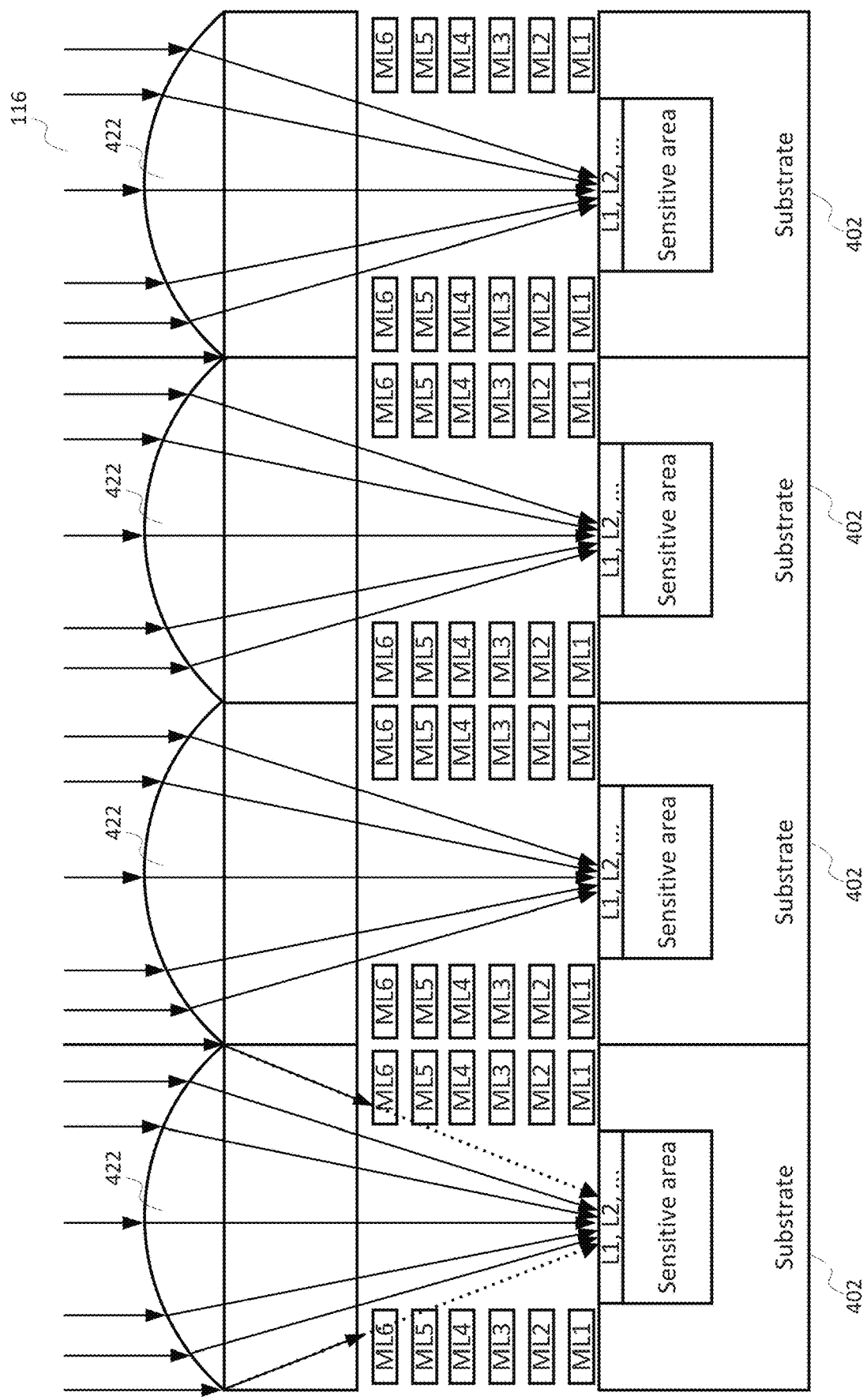

FIGS. 4A-4E depict various configurations of sensing unit 106 and its role in LIDAR system 100. Specifically, FIG. 4A is a diagram illustrating an example sensing unit 106 with a detector array, FIG. 4B is a diagram illustrating monostatic scanning using a two-dimensional sensor, FIG. 4C is a diagram illustrating an example of a two-dimensional sensor 116, FIG. 4D is a diagram illustrating a lens array associated with sensor 116, and FIG. 4E includes three diagram illustrating the lens structure. One skilled in the art will appreciate that the depicted configurations of sensing unit 106 are exemplary only and may have numerous alternative variations and modifications consistent with the principles of this disclosure.

FIG. 4A illustrates an example of sensing unit 106 with detector array 400. In this example, at least one sensor 116 includes detector array 400. LIDAR system 100 is configured to detect objects (e.g., bicycle 208A and cloud 208) in field of view 120 located at different distances from LIDAR system 100 (could be meters or more). Objects 208 may be a solid object (e.g. a road, a tree, a car, a person), fluid object (e.g. fog, water, atmosphere particles), or object of another type (e.g. dust or a powdery illuminated object). When the photons emitted from light source 112 hit object 208 they either reflect, refract, or get absorbed. Typically, as shown in the figure, only a portion of the photons reflected from object 208A enters optional optical window 124. As each ~15 cm change in distance results in a travel time difference of 1 ns (since the photons travel at the speed of light to and from object 208), the time differences between the travel times of different photons hitting the different objects may be detectable by a time-of-flight sensor with sufficiently quick response.

Sensor 116 includes a plurality of detection elements 402 for detecting photons of a photonic pulse reflected back from field of view 120. The detection elements may all be included in detector array 400, which may have a rectangular arrangement (e.g. as shown) or any other arrangement. Detection elements 402 may operate concurrently or partially concurrently with each other. Specifically, each detection element 402 may issue detection information for every sampling duration (e.g. every 1 nanosecond). In one example, detector array 400 may be a SiPM (Silicon photomultipliers) which is a solid-state single-photon-sensitive device built from an array of single photon avalanche diodes (SPADs, serving as detection elements 402) on a common silicon substrate. Similar photomultipliers from other, non-silicon materials may also be used. Although a SiPM device works in digital/switching mode, the SiPM is an analog device because all the microcells are read in parallel, making it possible to generate signals within a dynamic range from a single photon to hundreds and thousands of photons detected by the different SPADs. As mentioned above, more than one type of sensor may be implemented (e.g. SiPM and APD). Possibly, sensing unit 106 may include at least one APD integrated into an SiPM array and/or at least one APD detector located next to a SiPM on a separate or common silicon substrate.

In one embodiment, detection elements 402 may be grouped into a plurality of regions 404. The regions are geometrical locations or environments within sensor 116 (e.g. within detector array 400)—and may be shaped in different shapes (e.g. rectangular as shown, squares, rings, and so on, or in any other shape). While not all of the individual detectors, which are included within the geometrical area of a region 404, necessarily belong to that region, in most cases they will not belong to other regions 404 covering other areas of the sensor 310—unless some overlap is desired in the seams between regions. As illustrated in FIG. 4A, the regions may be non-overlapping regions 404, but alternatively, they may overlap. Every region may be associated with a regional output circuitry 406 associated with that region. The regional output circuitry 406 may provide a region output signal of a corresponding group of detection elements 402. For example, the region of output circuitry 406 may be a summing circuit, but other forms of combined output of the individual detector into a unitary output (whether scalar, vector, or any other format) may be employed. Optionally, each region 404 is a single SiPM, but this is not necessarily so, and a region may be a sub-portion of a single SiPM, a group of several SiPMs, or even a combination of different types of detectors.

In the illustrated example, processing unit 108 is located at a separated housing 200B (within or outside) host 210 (e.g. within vehicle 110), and sensing unit 106 may include a dedicated processor 408 for analyzing the reflected light. Alternatively, processing unit 108 may be used for analyzing reflected light 206. It is noted that LIDAR system 100 may be implemented multiple housings in other ways than the illustrated example. For example, light deflector 114 may be located in a different housing than projecting unit 102 and/or sensing module 106. In one embodiment, LIDAR system 100 may include multiple housings connected to each other in different ways, such as: electric wire connection, wireless connection (e.g., RF connection), fiber optics cable, and any combination of the above.

In one embodiment, analyzing reflected light 206 may include determining a time of flight for reflected light 206, based on outputs of individual detectors of different regions. Optionally, processor 408 may be configured to determine the time of flight for reflected light 206 based on the plurality of regions of output signals. In addition to the time of flight, processing unit 108 may analyze reflected light 206 to determine the average power across an entire return pulse, and the photon distribution/signal may be determined over the return pulse period ("pulse shape"). In the illustrated example, the outputs of any detection elements 402 may not be transmitted directly to processor 408, but rather combined (e.g. summed) with signals of other detectors of the region 404 before being passed to processor 408. However, this is only an example and the circuitry of sensor 116 may transmit information from a detection element 402 to processor 408 via other routes (not via a region output circuitry 406).

FIG. 4B is a diagram illustrating LIDAR system 100 configured to scan the environment of LIDAR system 100 using a two-dimensional sensor 116. In the example of FIG. 4B, sensor 116 is a matrix of 4X6 detectors 410 (also referred to as "pixels"). In one embodiment, a pixel size may be about 1x1mm. Sensor 116 is two-dimensional in the sense that it has more than one set (e.g. row, column) of detectors 410 in two non-parallel axes (e.g. orthogonal axes, as exemplified in the illustrated examples). The number of detectors 410 in sensor 116 may vary between differing implementations, e.g. depending on the desired resolution, signal to noise ratio (SNR), desired detection distance, and so on. For example, sensor 116 may have anywhere between 5 and 5,000 pixels. In another example (not shown in the figure) Also, sensor 116 may be a one-dimensional matrix (e.g. 1×8 pixels).

It is noted that each detector 410 may include a plurality of detection elements 402, such as Avalanche Photo Diodes (APD), Single Photon Avalanche Diodes (SPADs), combination of Avalanche Photo Diodes (APD) and Single Photon Avalanche Diodes (SPADs)or detecting elements that measure both the time of flight from a laser pulse transmission event to the reception event and the intensity of the received photons. For example, each detector 410 may include anywhere between 20 and 5,000 SPADs. The outputs of detection elements 402 in each detector 410 may be summed, averaged, or otherwise combined to provide a unified pixel output.

In the illustrated example, sensing unit 106 may include a two-dimensional sensor 116 (or a plurality of two-dimensional sensors 116), whose field of view is smaller than field of view 120 of LIDAR system 100. In this discussion, field of view 120 (the overall field of view which can be scanned by LIDAR system 100 without moving, rotating or rolling in any direction) is denoted "first FOV 412", and the smaller FOV of sensor 116 is denoted "second FOV 412" (interchangeably "instantaneous FOV"). The coverage area of second FOV 414 relative to the first FOV 412 may differ, depending on the specific use of LIDAR system 100, and may be, for example, between 0.5% and 50%. In one example, second FOV 412 may be between about 0.05° and 1° elongated in the vertical dimension. Even if LIDAR system 100 includes more than one two-dimensional sensor 116, the combined field of view of the sensors array may still be smaller than the first FOV 412, e.g. by a factor of at least 5, by a factor of at least 10, by a factor of at least 20, or by a factor of at least 50, for example.

In order to cover first FOV 412, scanning unit 106 may direct photons arriving from different parts of the environment to sensor 116 at different times. In the illustrated monostatic configuration, together with directing projected light 204 towards field of view 120 and when least one light deflector 114 is located in an instantaneous position, scanning unit 106 may also direct reflected light 206 to sensor 116. Typically, at every moment during the scanning of first FOV 412, the light beam emitted by LIDAR system 100 covers part of the environment which is larger than the second FOV 414 (in angular opening) and includes the part of the environment from which light is collected by scanning unit 104 and sensor 116.

FIG. 4C is a diagram illustrating an example of a two-dimensional sensor 116. In this embodiment, sensor 116 is a matrix of 8×5 detectors 410 and each detector 410 includes a plurality of detection elements 402. In one example, detector 410A is located in the second row (denoted "R2") and third column (denoted "C3") of sensor 116, which includes a matrix of 4×3 detection elements 402. In another example, detector 410B located in the fourth row (denoted "R4") and sixth column (denoted "C6") of sensor 116 includes a matrix of 3×3 detection elements 402. Accordingly, the number of detection elements 402 in each detector 410 may be constant, or may vary, and differing detectors 410 in a common array may have a different number of detection elements 402. The outputs of all detection elements 402 in each detector 410 may be summed, averaged, or otherwise combined to provide a single pixel-output value. It is noted that while detectors 410 in the example of FIG. 4C are arranged in a rectangular matrix (straight rows and straight columns), other arrangements may also be used, e.g. a circular arrangement or a honeycomb arrangement.

According to some embodiments, measurements from each detector 410 may enable determination of the time of flight from a light pulse emission event to the reception event and the intensity of the received photons. The reception event may be the result of the light pulse being reflected from object 208. The time of flight may be a timestamp value that represents the distance of the reflecting object to optional optical window 124. Time of flight values may be realized by photon detection and counting methods, such as Time Correlated Single Photon Counters (TCSPC), analog methods for photon detection such as signal integration and qualification (via analog to digital converters or plain comparators) or otherwise.

In some embodiments and with reference to FIG. 4B, during a scanning cycle, each instantaneous position of at least one light deflector 114 may be associated with a particular portion 122 of field of view 120. The design of sensor 116 enables an association between the reflected light from a single portion of field of view 120 and multiple detectors 410. Therefore, the scanning resolution of LIDAR system may be represented by the number of instantaneous positions (per scanning cycle) times the number of detectors 410 in sensor 116. The information from each detector 410 (i.e., each pixel) represents the basic data element that from which the captured field of view in the three-dimensional space is built. This may include, for example, the basic element of a point cloud representation, with a spatial position and an associated reflected intensity value. In one embodiment, the reflections from a single portion of field of view 120 that are detected by multiple detectors 410 may be returning from different objects located in the single portion of field of view 120. For example, the single portion of field of view 120 may be greater than 50×50 cm at the far field, which can easily include two, three, or more objects partly covered by each other.

FIG. 4D is a cross cut diagram of a part of sensor 116, in accordance with examples of the presently disclosed subject matter. The illustrated part of sensor 116 includes a part of a detector array 400 which includes four detection elements 402 (e.g., four SPADs, four APDs). Detector array 400 may be a photodetector sensor realized in complementary metal—oxide—semiconductor (CMOS). Each of the detection elements 402 has a sensitive area, which is positioned within a substrate surrounding. While not necessarily so, sensor 116 may be used in a monostatic LiDAR system having a narrow field of view (e.g., because scanning unit 104 scans different parts of the field of view at different times). The narrow field of view for the incoming light beam—if implemented—eliminates the problem of out-of-focus imaging. As exemplified in FIG. 4D, sensor 116 may include a plurality of lenses 422 (e.g., microlenses), each lens 422 may direct incident light toward a different detection element 402 (e.g., toward an active area of detection element 402), which may be usable when out-of-focus imaging is not an issue. Lenses 422 may be used for increasing an optical fill factor and sensitivity of detector array 400, because most of the light that reaches sensor 116 may be deflected toward the active areas of detection elements 402

Detector array 400, as exemplified in FIG. 4D, may include several layers built into the silicon substrate by various methods (e.g., implant) resulting in a sensitive area, contact elements to the metal layers and isolation elements (e.g., shallow trench implant STI, guard rings, optical trenches, etc.). The sensitive area may be a volumetric element in the CMOS detector that enables the optical conversion of incoming photons into a current flow given an adequate voltage bias is applied to the device. In the case of a APD/SPAD, the sensitive area would be a combination of an electrical field that pulls electrons created by photon absorption towards a multiplication area where a photon induced electron is amplified creating a breakdown avalanche of multiplied electrons.

A front side illuminated detector (e.g., as illustrated in FIG. 4D) has the input optical port at the same side as the metal layers residing on top of the semiconductor (Silicon). The metal layers are required to realize the electrical connections of each individual photodetector element (e.g., anode and cathode) with various elements such as: bias voltage, quenching/ballast elements, and other photodetectors in a common array. The optical port through which the photons impinge upon the detector sensitive area is comprised of a passage through the metal layer. It is noted that passage of light from some directions through this passage may be blocked by one or more metal layers (e.g., metal layer ML6, as illustrated for the leftmost detector elements 402 in FIG. 4D). Such blockage reduces the total optical light absorbing efficiency of the detector.

Figure 4E:
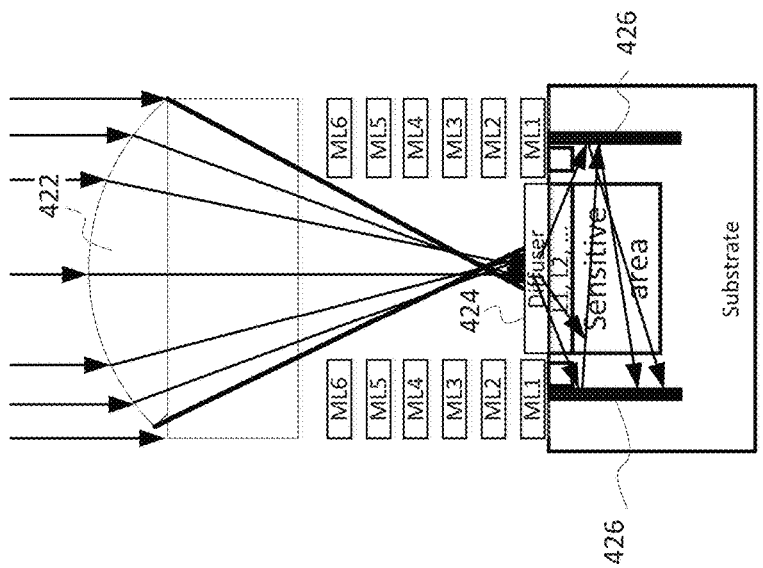
Figure 4E:
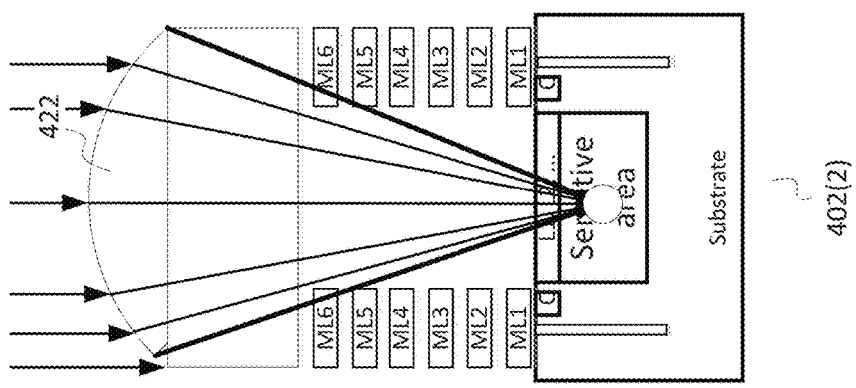
Figure 4E:
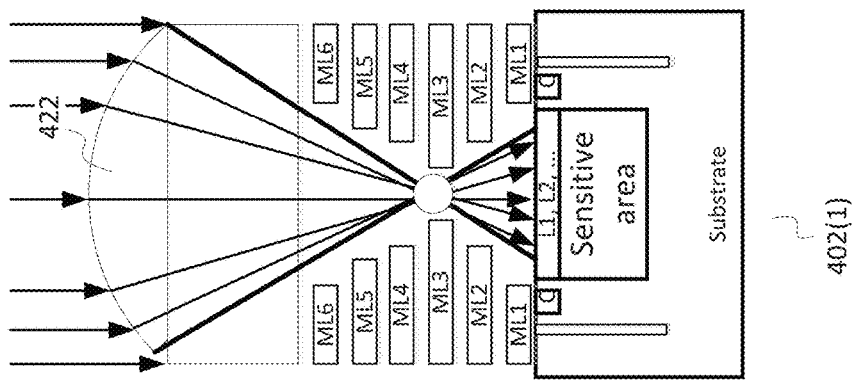

FIG. 4E illustrates three detection elements 402, each with an associated lens 422, in accordance with examples of the presenting disclosed subject matter. Each of the three detection elements of FIG. 4E, denoted 402(1), 402(2), and 402(3), illustrates a lens configuration which may be implemented in associated with one or more of the detecting elements 402 of sensor 116. It is noted that combinations of these lens configurations may also be implemented.

In the lens configuration illustrated with regards to detection element 402(1), a focal point of the associated lens 422 may be located above the semiconductor surface. Optionally, openings in different metal layers of the detection element may have different sizes aligned with the cone of focusing light generated by the associated lens 422. Such a structure may improve the signal-to-noise and resolution of the array 400 as a whole device. Large metal layers may be important for delivery of power and ground shielding. This approach may be useful, e.g., with a monostatic LiDAR design with a narrow field of view where the incoming light beam is comprised of parallel rays and the imaging focus does not have any consequence to the detected signal.

In the lens configuration illustrated with regards to detection element 402(2), an efficiency of photon detection by the detection elements 402 may be improved by identifying a sweet spot. Specifically, a photodetector implemented in CMOS may have a sweet spot in the sensitive volume area where the probability of a photon creating an avalanche effect is the highest. Therefore, a focal point of lens 422 may be positioned inside the sensitive volume area at the sweet spot location, as demonstrated by detection elements 402(2). The lens shape and distance from the focal point may take into account the refractive indices of all the elements the laser beam is passing along the way from the lens to the sensitive sweet spot location buried in the semiconductor material.

In the lens configuration illustrated with regards to the detection element on the right of FIG. 4E, an efficiency of photon absorption in the semiconductor material may be improved using a diffuser and reflective elements. Specifically, a near IR wavelength requires a significantly long path of silicon material in order to achieve a high probability of absorbing a photon that travels through. In a typical lens configuration, a photon may traverse the sensitive area and may not be absorbed into a detectable electron. A long absorption path that improves the probability for a photon to create an electron renders the size of the sensitive area towards less practical dimensions (tens of um for example) for a CMOS device fabricated with typical foundry processes. The rightmost detector element in FIG. 4E demonstrates a technique for processing incoming photons. The associated lens 422 focuses the incoming light onto a diffuser element 424. In one embodiment, light sensor 116 may further include a diffuser located in the gap distant from the outer surface of at least some of the detectors. For example, diffuser 424 may steer the light beam sideways (e.g., as perpendicular as possible) towards the sensitive area and the reflective optical trenches 426. The diffuser is located at the focal point, above the focal point, or below the focal point. In this embodiment, the incoming light may be focused on a specific location where a diffuser element is located. Optionally, detector element 422 is designed to optically avoid the inactive areas where a photon induced electron may get lost and reduce the effective detection efficiency. Reflective optical trenches 426 (or other forms of optically reflective structures) cause the photons to bounce back and forth across the sensitive area, thus increasing the likelihood of detection. Ideally, the photons will get trapped in a cavity consisting of the sensitive area and the reflective trenches indefinitely until the photon is absorbed and creates an electron/hole pair.

Consistent with the present disclosure, a long path is created for the impinging photons to be absorbed and contribute to a higher probability of detection. Optical trenches may also be implemented in detecting element 422 for reducing cross talk effects of parasitic photons created during an avalanche that may leak to other detectors and cause false detection events. According to some embodiments, a photo detector array may be optimized so that a higher yield of the received signal is utilized, meaning, that as much of the received signal is received and less of the signal is lost to internal degradation of the signal. The photo detector array may be improved by: (a) moving the focal point at a location above the semiconductor surface, optionally by designing the metal layers above the substrate appropriately; (b) by steering the focal point to the most responsive/sensitive area (or "sweet spot") of the substrate and (c) adding a diffuser above the substrate to steer the signal toward the "sweet spot" and/or adding reflective material to the trenches so that deflected signals are reflected back to the "sweet spot."

While in some lens configurations, lens 422 may be positioned so that its focal point is above a center of the corresponding detection element 402, it is noted that this is not necessarily so. In other lens configuration, a position of the focal point of the lens 422 with respect to a center of the corresponding detection element 402 is shifted based on a distance of the respective detection element 402 from a center of the detection array 400. This may be useful in relatively larger detection arrays 400, in which detector elements further from the center receive light in angles which are increasingly off-axis. Shifting the location of the focal points (e.g., toward the center of detection array 400) allows correcting for the incidence angles. Specifically, shifting the location of the focal points (e.g., toward the center of detection array 400) allows correcting for the incidence angles while using substantially identical lenses 422 for all detection elements, which are positioned at the same angle with respect to a surface of the detector.

Adding an array of lenses 422 to an array of detection elements 402 may be useful when using a relatively small sensor 116 which covers only a small part of the field of view because in such a case, the reflection signals from the scene reach the detectors array 400 from substantially the same angle, and it is, therefore, easy to focus all the light onto individual detectors. It is also noted, that in one embodiment, lenses 422 may be used in LIDAR system 100 for favoring about increasing the overall probability of detection of the entire array 400 (preventing photons from being "wasted" in the dead area between detectors/sub-detectors) at the expense of spatial distinctiveness. This embodiment is in contrast to prior art implementations such as CMOS RGB camera, which prioritize spatial distinctiveness (i.e., light that propagates in the direction of detection element A is not allowed to be directed by the lens toward detection element B, that is, to "bleed" to another detection element of the array). Optionally, sensor 116 includes an array of lens 422, each being correlated to a corresponding detection element 402, while at least one of the lenses 422 deflects light which propagates to a first detection element 402 toward a second detection element 402 (thereby it may increase the overall probability of detection of the entire array).

Specifically, consistent with some embodiments of the present disclosure, light sensor 116 may include an array of light detectors (e.g., detector array 400), each light detector (e.g., detector 410) being configured to cause an electric current to flow when light passes through an outer surface of a respective detector. In addition, light sensor 116 may include at least one micro-lens configured to direct light toward the array of light detectors, the at least one micro-lens having a focal point. Light sensor 116 may further include at least one layer of conductive material interposed between the at least one micro-lens and the array of light detectors and having a gap therein to permit light to pass from the at least one micro-lens to the array, the at least one layer being sized to maintain a space between the at least one micro-lens and the array to cause the focal point (e.g., the focal point may be a plane) to be located in the gap, at a location spaced from the detecting surfaces of the array of light detectors.

In related embodiments, each detector may include a plurality of Single Photon Avalanche Diodes (SPADs) or a plurality of Avalanche Photo Diodes (APD). The conductive material may be a multi-layer metal constriction, and the at least one layer of conductive material may be electrically connected to detectors in the array. In one example, the at least one layer of conductive material includes a plurality of layers. In addition, the gap may be shaped to converge from the at least one micro-lens toward the focal point, and to diverge from a region of the focal point toward the array. In other embodiments, light sensor 116 may further include at least one reflector adjacent each photo detector. In one embodiment, a plurality of micro-lenses may be arranged in a lens array and the plurality of detectors may be arranged in a detector array. In another embodiment, the plurality of micro-lenses may include a single lens configured to project light to a plurality of detectors in the array.

Referring by way of a nonlimiting example to FIGS. 2E, 2F and 2G, it is noted that the one or more sensors 116 of system 100 may receive light from a scanning deflector 114 or directly from the FOV without scanning. Even if light from the entire FOV arrives to the at least one sensor 116 at the same time, in some implementations the one or more sensors 116 may sample only parts of the FOV for detection output at any given time. For example, if the illumination of projection unit 102 illuminates different parts of the FOV at different times (whether using a deflector 114 and/or by activating different light sources 112 at different times), light may arrive at all of the pixels or sensors 116 of sensing unit 106, and only pixels/sensors which are expected to detect the LIDAR illumination may be actively collecting data for detection outputs. This way, the rest of the pixels/sensors do not unnecessarily collect ambient noise. Referring to the scanning—in the outbound or in the inbound directions—it is noted that substantially different scales of scanning may be implemented. For example, in some implementations the scanned area may cover 1‰ or 0.1‰ of the FOV, while in other implementations the scanned area may cover 10% or 25% of the FOV. All other relative portions of the FOV values may also be implemented, of course.

The Processing Unit

Figure 5A:
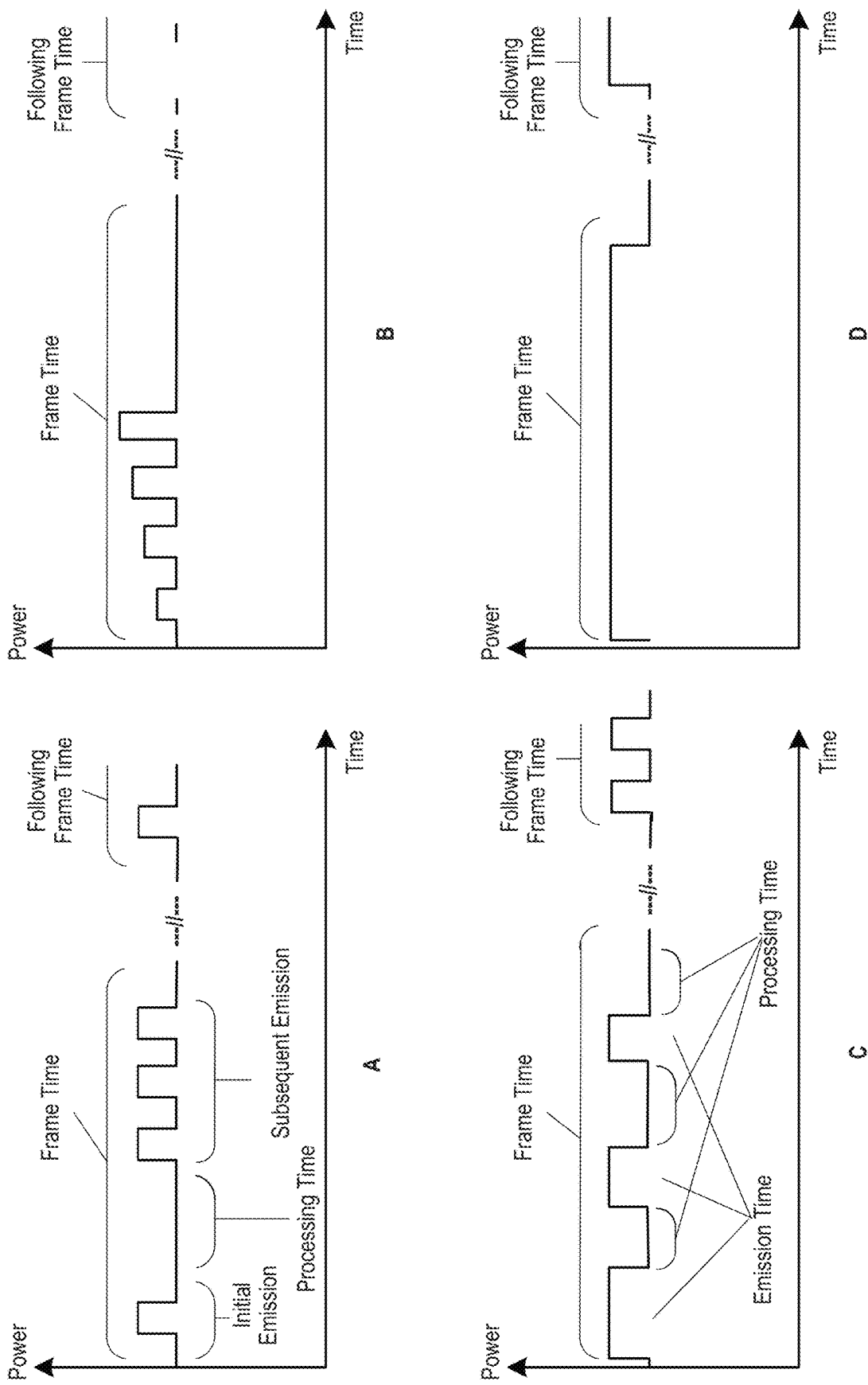
FIG. 5A includes four example diagrams illustrating emission patterns in a single frame-time for a single portion of the field of view.
Figure 5B:
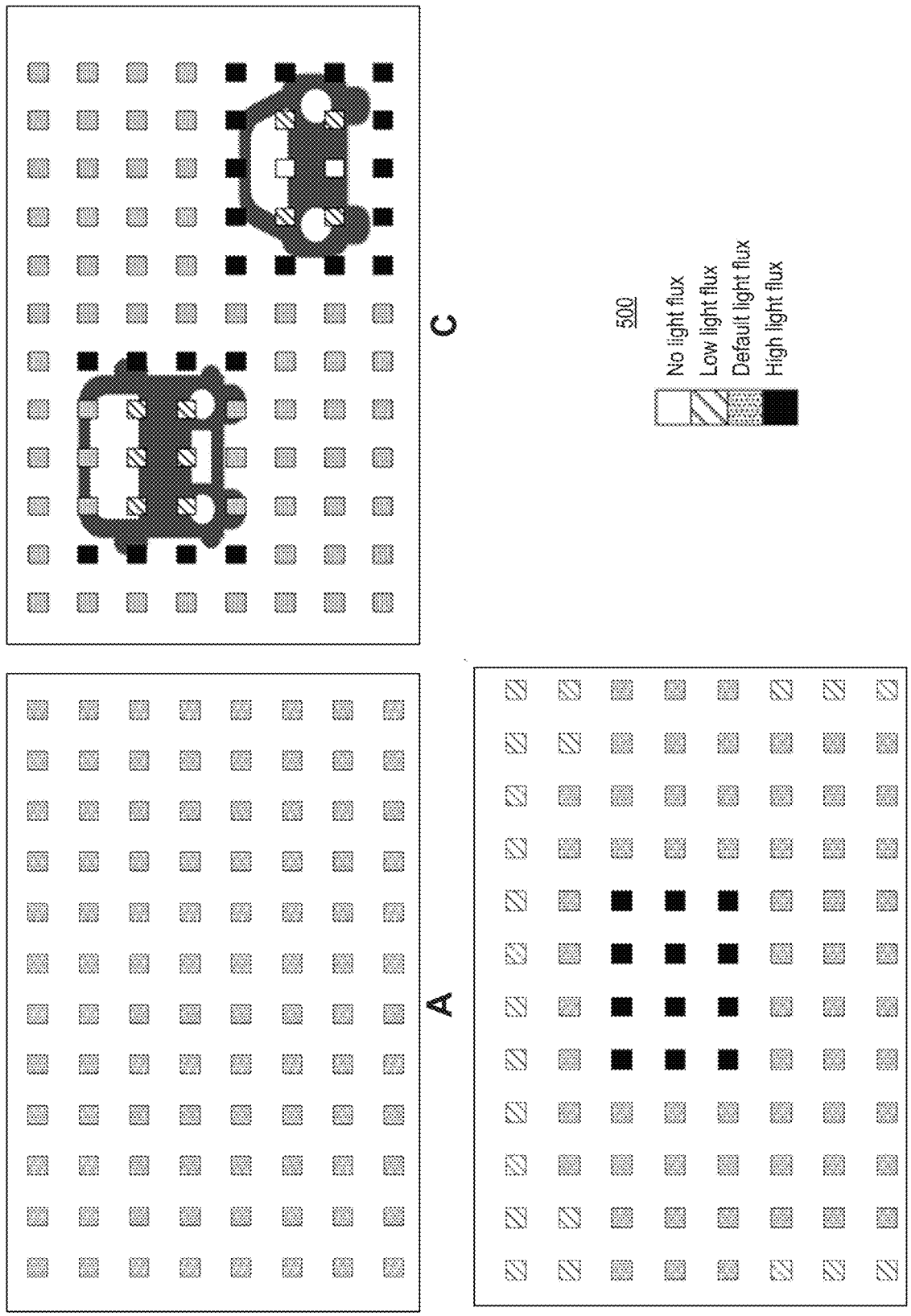
FIG. 5B includes three example diagrams illustrating emission scheme in a single frame-time for the whole field of view.

FIGS. 5A-5C depict different functionalities of processing units 108 in accordance with some embodiments of the present disclosure. Specifically, FIG. 5A is a diagram illustrating emission patterns in a single frame-time for a single portion of the field of view, FIG. 5B is a diagram illustrating emission scheme in a single frame-time for the whole field of view, and. FIG. 5C is a diagram illustrating the actual light emission projected towards field of view during a single scanning cycle.

FIG. 5A illustrates four examples of emission patterns in a single frame-time for a single portion 122 of field of view 120 associated with an instantaneous position of at least one light deflector 114. Consistent with embodiments of the present disclosure, processing unit 108 may control at least one light source 112 and light deflector 114 (or coordinate the operation of at least one light source 112 and at least one light deflector 114) in a manner enabling light flux to vary over a scan of field of view 120. Consistent with other embodiments, processing unit 108 may control only at least one light source 112 and light deflector 114 may be moved or pivoted in a fixed predefined pattern.

Diagrams A-D in FIG. 5A depict the power of light emitted towards a single portion 122 of field of view 120 over time. In Diagram A, processor 118 may control the operation of light source 112 in a manner such that during scanning of field of view 120 an initial light emission is projected toward portion 122 of field of view 120. When projecting unit 102 includes a pulsed-light light source, the initial light emission may include one or more initial pulses (also referred to as "pilot pulses"). Processing unit 108 may receive from sensor 116 pilot information about reflections associated with the initial light emission. In one embodiment, the pilot information may be represented as a single signal based on the outputs of one or more detectors (e.g. one or more SPADs, one or more APDs, one or more SiPMs, etc.) or as a plurality of signals based on the outputs of multiple detectors. In one example, the pilot information may include analog and/or digital information. In another example, the pilot information may include a single value and/or a plurality of values (e.g. for different times and/or parts of the segment).

Based on information about reflections associated with the initial light emission, processing unit 108 may be configured to determine the type of subsequent light emission to be projected towards portion 122 of field of view 120. The determined subsequent light emission for the particular portion of field of view 120 may be made during the same scanning cycle (i.e., in the same frame) or in a subsequent scanning cycle (i.e., in a subsequent frame).

In Diagram B, processor 118 may control the operation of light source 112 in a manner such that during scanning of field of view 120 light pulses in different intensities are projected towards a single portion 122 of field of view 120. In one embodiment, LIDAR system 100 may be operable to generate depth maps of one or more different types, such as any one or more of the following types: point cloud model, polygon mesh, depth image (holding depth information for each pixel of an image or of a 2D array), or any other type of 3D model of a scene. The sequence of depth maps may be a temporal sequence, in which different depth maps are generated at a different time. Each depth map of the sequence associated with a scanning cycle (interchangeably "frame") may be generated within the duration of a corresponding subsequent frame-time. In one example, a typical frame-time may last less than a second. In some embodiments, LIDAR system 100 may have a fixed frame rate (e.g. 10 frames per second, 25 frames per second, 50 frames per second) or the frame rate may be dynamic. In other embodiments, the frame-times of different frames may not be identical across the sequence. For example, LIDAR system 100 may implement a 10 frames-per-second rate that includes generating a first depth map in 100 milliseconds (the average), a second frame in 92 milliseconds, a third frame at 142 milliseconds, and so on.

In Diagram C, processor 118 may control the operation of light source 112 in a manner such that during scanning of field of view 120 light pulses associated with different durations are projected towards a single portion 122 of field of view 120. In one embodiment, LIDAR system 100 may be operable to generate a different number of pulses in each frame. The number of pulses may vary between 0 to 32 pulses (e.g., 1, 5, 12, 28, or more pulses) and may be based on information derived from previous emissions. The time between light pulses may depend on desired detection range and can be between 500 ns and 5000 ns. In one example, processing unit 108 may receive from sensor 116 information about reflections associated with each light-pulse. Based on the information (or the lack of information), processing unit 108 may determine if additional light pulses are needed. It is noted that the durations of the processing times and the emission times in diagrams A-D are not in-scale. Specifically, the processing time may be substantially longer than the emission time. In diagram D, projecting unit 102 may include a continuous-wave light source. In one embodiment, the initial light emission may include a period of time where light is emitted and the subsequent emission may be a continuation of the initial emission, or there may be a discontinuity. In one embodiment, the intensity of the continuous emission may change over time.

Consistent with some embodiments of the present disclosure, the emission pattern may be determined per each portion of field of view 120. In other words, processor 118 may control the emission of light to allow differentiation in the illumination of different portions of field of view 120. In one example, processor 118 may determine the emission pattern for a single portion 122 of field of view 120, based on detection of reflected light from the same scanning cycle (e.g., the initial emission), which makes LIDAR system 100 extremely dynamic. In another example, processor 118 may determine the emission pattern for a single portion 122 of field of view 120, based on detection of reflected light from a previous scanning cycle. The differences in the patterns of the subsequent emissions may result from determining different values for light-source parameters for the subsequent emission, such as any one of the following:
a. Overall energy of the subsequent emission.
b. Energy profile of the subsequent emission.
c. A number of light-pulse-repetition per frame.
d. Light modulation characteristics such as duration, rate, peak, average power, and pulse shape.
e. Wave properties of the subsequent emission, such as polarization, wavelength, etc.

Consistent with the present disclosure, the differentiation in the subsequent emissions may be put to different uses. In one example, it is possible to limit emitted power levels in one portion of field of view 120 where safety is a consideration, while emitting higher power levels (thus improving signal-to-noise ratio and detection range) for other portions of field of view 120. This is relevant for eye safety, but may also be relevant for skin safety, safety of optical systems, safety of sensitive materials, and more. In another example, it is possible to direct more energy towards portions of field of view 120 where it will be of greater use (e.g. regions of interest, further distanced targets, low reflection targets, etc.) while limiting the lighting energy to other portions of field of view 120 based on detection results from the same frame or previous frame. It is noted that processing unit 108 may process detected signals from a single instantaneous field of view several times within a single scanning frame time; for example, subsequent emission may be determined upon after every pulse emitted, or after a number of pulses emitted.

FIG. 5B illustrates three examples of emission schemes in a single frame-time for field of view 120. Consistent with embodiments of the present disclosure, at least on processing unit 108 may use obtained information to dynamically adjust the operational mode of LIDAR system 100 and/or determine values of parameters of specific components of LIDAR system 100. The obtained information may be determined from processing data captured in field of view 120, or received (directly or indirectly) from host 210. Processing unit 108 may use the obtained information to determine a scanning scheme for scanning the different portions of field of view 120. The obtained information may include a current light condition, a current weather condition, a current driving environment of the host vehicle, a current location of the host vehicle, a current trajectory of the host vehicle, a current topography of road surrounding the host vehicle, or any other condition or object detectable through light reflection. In some embodiments, the determined scanning scheme may include at least one of the following: (a) a designation of portions within field of view 120 to be actively scanned as part of a scanning cycle, (b) a projecting plan for projecting unit 102 that defines the light emission profile at different portions of field of view 120; (c) a deflecting plan for scanning unit 104 that defines, for example, a deflection direction, frequency, and designating idle elements within a reflector array; and (d) a detection plan for sensing unit 106 that defines the detectors sensitivity or responsivity pattern.

In addition, processing unit 108 may determine the scanning scheme at least partially by obtaining an identification of at least one region of interest within the field of view 120 and at least one region of non-interest within the field of view 120. In some embodiments, processing unit 108 may determine the scanning scheme at least partially by obtaining an identification of at least one region of high interest within the field of view 120 and at least one region of lower-interest within the field of view 120. The identification of the at least one region of interest within the field of view 120 may be determined, for example, from processing data captured in field of view 120, based on data of another sensor (e.g. camera, GPS), received (directly or indirectly) from host 210, or any combination of the above. In some embodiments, the identification of at least one region of interest may include identification of portions, areas, sections, pixels, or objects within field of view 120 that are important to monitor. Examples of areas that may be identified as regions of interest may include, crosswalks, moving objects, people, nearby vehicles or any other environmental condition or object that may be helpful in vehicle navigation. Examples of areas that may be identified as regions of non-interest (or lower-interest) may be static (non-moving) far-away buildings, a skyline, an area above the horizon and objects in the field of view. Upon obtaining the identification of at least one region of interest within the field of view 120, processing unit 108 may determine the scanning scheme or change an existing scanning scheme. Further to determining or changing the light-source parameters (as described above), processing unit 108 may allocate detector resources based on the identification of the at least one region of interest. In one example, to reduce noise, processing unit 108 may activate detectors 410 where a region of interest is expected and disable detectors 410 where regions of non-interest are expected. In another example, processing unit 108 may change the detector sensitivity, e.g., increasing sensor sensitivity for long range detection where the reflected power is low.

Diagrams A-C in FIG. 5B depict examples of different scanning schemes for scanning field of view 120. Each square in field of view 120 represents a different portion 122 associated with an instantaneous position of at least one light deflector 114. Legend 500 details the level of light flux represented by the filling pattern of the squares. Diagram A depicts a first scanning scheme in which all of the portions have the same importance/priority and a default light flux is allocated to them. The first scanning scheme may be utilized in a start-up phase or periodically interleaved with another scanning scheme to monitor the whole field of view for unexpected/new objects. In one example, the light source parameters in the first scanning scheme may be configured to generate light pulses at constant amplitudes. Diagram B depicts a second scanning scheme in which a portion of field of view 120 is allocated with high light flux while the rest of field of view 120 is allocated with default light flux and low light flux. The portions of field of view 120 that are the least interesting may be allocated with low light flux. Diagram C depicts a third scanning scheme in which a compact vehicle and a bus (see silhouettes) are identified in field of view 120. In this scanning scheme, the edges of the vehicle and bus may be tracked with high power and the central mass of the vehicle and bus may be allocated with less light flux (or no light flux). Such light flux allocation enables concentration of more of the optical budget on the edges of the identified objects and less on their center which have less importance.

FIG. 5C illustrating the emission of light towards field of view 120 during a single scanning cycle. In the depicted example, field of view 120 is represented by an 8×9 matrix, where each of the 72 cells corresponds to a separate portion 122 associated with a different instantaneous position of at least one light deflector 114. In this exemplary scanning cycle, each portion includes one or more white dots that represent the number of light pulses projected toward that portion, and some portions include black dots that represent reflected light from that portion detected by sensor 116. As shown, field of view 120 is divided into three sectors: sector I on the right side of field of view 120, sector II in the middle of field of view 120, and sector III on the left side of field of view 120. In this exemplary scanning cycle, sector I was initially allocated with a single light pulse per portion; sector II, previously identified as a region of interest, was initially allocated with three light pulses per portion; and sector III was initially allocated with two light pulses per portion. Also as shown, scanning of field of view 120 reveals four objects 208: two free-form objects in the near field (e.g., between 5 and 50 meters), a rounded-square object in the mid field (e.g., between 50 and 150 meters), and a triangle object in the far field (e.g., between 150 and 500 meters). While the discussion of FIG. 5C uses number of pulses as an example of light flux allocation, it is noted that light flux allocation to different parts of the field of view may also be implemented in other ways such as: pulse duration, pulse angular dispersion, wavelength, instantaneous power, photon density at different distances from light source 112, average power, pulse power intensity, pulse width, pulse repetition rate, pulse sequence, pulse duty cycle, wavelength, phase, polarization, and more. The illustration of the light emission as a single scanning cycle in FIG. 5C demonstrates different capabilities of LIDAR system 100. In a first embodiment, processor 118 is configured to use two light pulses to detect a first object (e.g., the rounded-square object) at a first distance, and to use three light pulses to detect a second object (e.g., the triangle object) at a second distance greater than the first distance. In a second embodiment, processor 118 is configured to allocate more light to portions of the field of view where a region of interest is identified. Specifically, in the present example, sector II was identified as a region of interest and accordingly it was allocated with three light pulses while the rest of field of view 120 was allocated with two or less light pulses. In a third embodiment, processor 118 is configured to control light source 112 in a manner such that only a single light pulse is projected toward to portions B1, B2, and C1 in FIG. 5C, although they are part of sector III that was initially allocated with two light pulses per portion. This occurs because the processing unit 108 detected an object in the near field based on the first light pulse. Allocation of less than maximal amount of pulses may also be a result of other considerations. For examples, in at least some regions, detection of object at a first distance (e.g. a near field object) may result in reducing an overall amount of light emitted to this portion of field of view 120.

Additional details and examples on different components of LIDAR system 100 and their associated functionalities are included in Applicant's U.S. patent application Ser. No. 15/391,916 filed Dec. 28, 2016; Applicant's U.S. patent application Ser. No. 15/393,749 filed Dec. 29, 2016; Applicant's U.S. patent application Ser. No. 15/393,285 filed Dec. 29, 2016; and Applicant's U.S. patent application Ser. No. 15/393,593 filed Dec. 29, 2016, which are incorporated herein by reference in their entirety.

Example Implementation: Vehicle

Figure 6C:
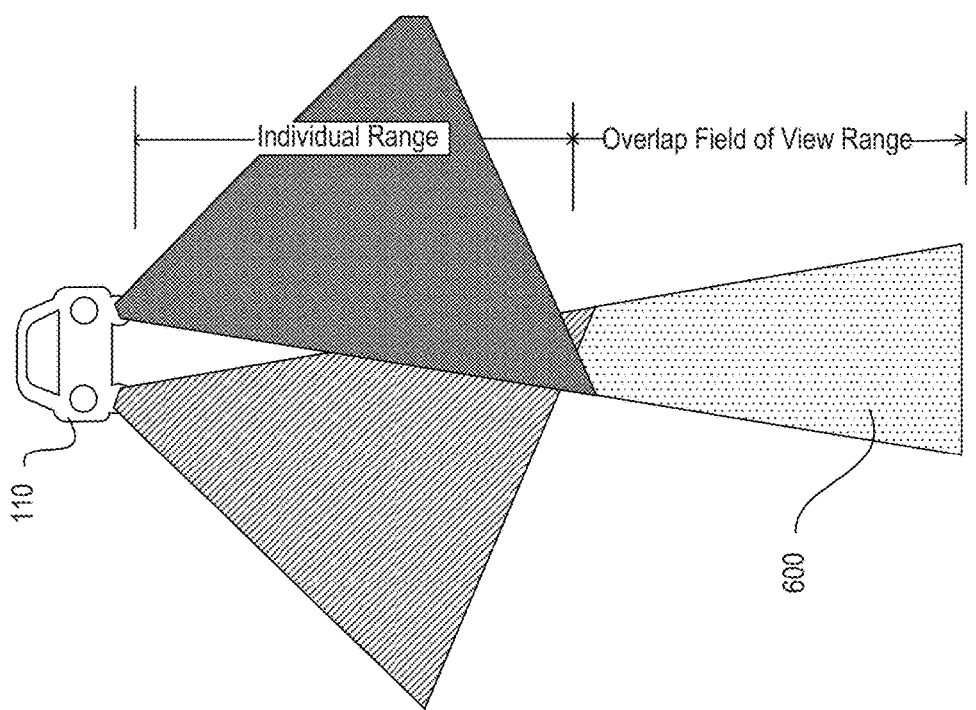
FIGS. 6A, 6B, and 6C are diagrams illustrating a first example implementation consistent with some embodiments of the present disclosure.
Figure 6A:
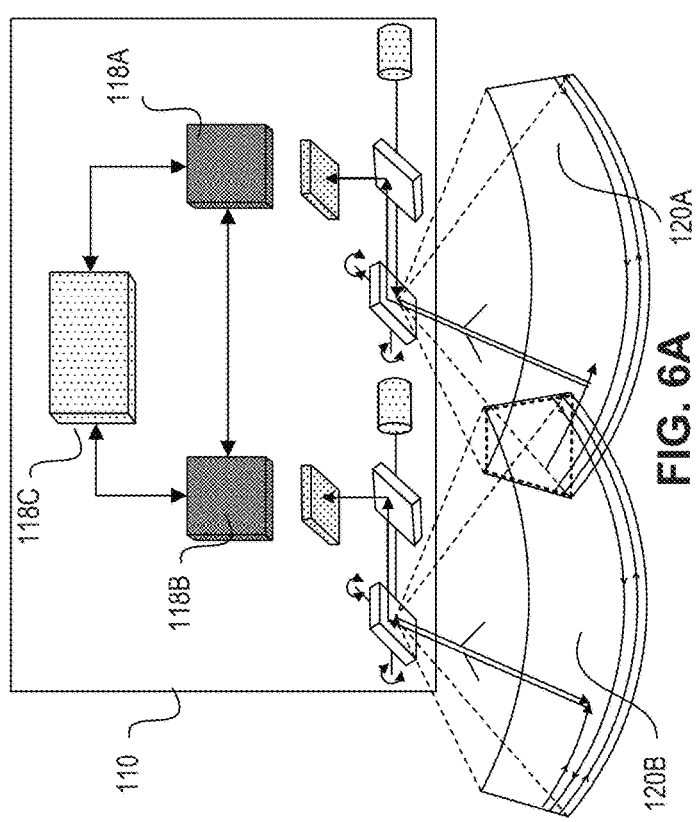
Figure 6B:
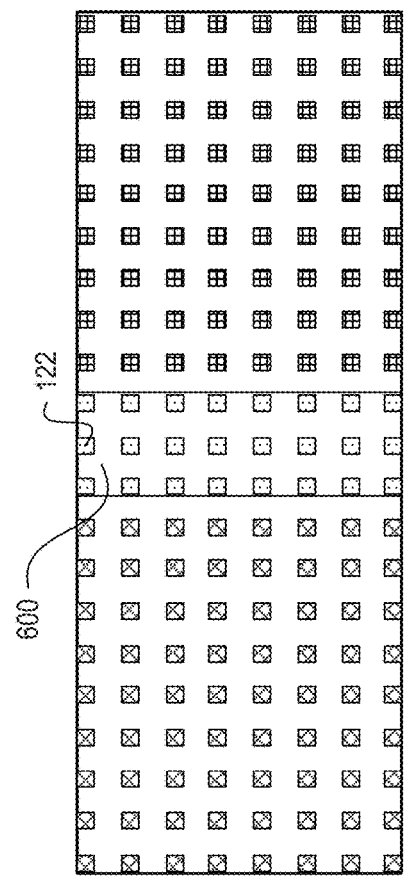

FIGS. 6A-6C illustrate the implementation of LIDAR system 100 in a vehicle (e.g., vehicle 110). Any of the aspects of LIDAR system 100 described above or below may be incorporated into vehicle 110 to provide a range-sensing vehicle. Specifically, in this example, LIDAR system 100 integrates multiple scanning units 104 and potentially multiple projecting units 102 in a single vehicle. In one embodiment, a vehicle may take advantage of such a LIDAR system to improve power, range and accuracy in the overlap zone and beyond it, as well as redundancy in sensitive parts of the FOV (e.g. the forward movement direction of the vehicle). As shown in FIG. 6A, vehicle 110 may include a first processor 118A for controlling the scanning of field of view 120A, a second processor 118 for controlling the scanning of field of view 120B, and a third processor 118C for controlling synchronization of scanning the two fields of view. In one example, processor 118C may be the vehicle controller and may have a shared interface between first processor 118A and second processor 118. The shared interface may enable an exchanging of data at intermediate processing levels and a synchronization of scanning of the combined field of view in order to form an overlap in the temporal and/or spatial space. In one embodiment, the data exchanged using the shared interface may be: (a) time of flight of received signals associated with pixels in the overlapped field of view and/or in its vicinity; (b) laser steering position status; (c) detection status of objects in the field of view.

FIG. 6B illustrates overlap region 600 between field of view 120A and field of view 120B. In the depicted example, the overlap region is associated with 24 portions 122 from field of view 120A and 24 portions 122 from field of view 120B. Given that the overlap region is defined and known by processors 118A and 118, each processor may be designed to limit the amount of light emitted in overlap region 600 in order to conform with an eye safety limit that spans multiple source lights, or for other reasons such as maintaining an optical budget. In addition, processors 118A and 118 may avoid interferences between the light emitted by the two light sources by loose synchronization between the scanning unit 104A and scanning unit 104B, and/or by control of the laser transmission timing, and/or the detection circuit enabling timing.

FIG. 6C illustrates how overlap region 600 between field of view 120A and field of view 120B may be used to increase the detection distance of vehicle 110. Consistent with the present disclosure, two or more light sources 112 projecting their nominal light emission into the overlap zone may be leveraged to increase the effective detection range. The term "detection range" may include an approximate distance from vehicle 110 at which LIDAR system 100 can clearly detect an object. In one embodiment, the maximum detection range of LIDAR system 100 is about 300 meters, about 400 meters, or about 500 meters. For example, for a detection range of 200 meters, LIDAR system 100 may detect an object located 200 meters (or less) from vehicle 110 at more than 95%, more than 99%, more than 99.5% of the times. Even when the object's reflectivity may be less than 50% (e.g., less than 20%, less than 10%, or less than 5%). In addition, LIDAR system 100 may have less than 1% false alarm rate. In one embodiment, light from projected from two light sources that are collocated in the temporal and spatial space can be utilized to improve SNR and therefore increase the range and/or quality of service for an object located in the overlap region. Processor 118C may extract high-level information from the reflected light in field of view 120A and 120B. The term "extracting information" may include any process by which information associated with objects, individuals, locations, events, etc., is identified in the captured image data by any means known to those of ordinary skill in the art. In addition, processors 118A and 118 may share the high-level information, such as objects (road delimiters, background, pedestrians, vehicles, etc.), and motion vectors, to enable each processor to become alert to the peripheral regions about to become regions of interest. For example, a moving object in field of view 120A may be determined to soon be entering field of view 120B.

Example Implementation: Surveillance System

Figure 6D:
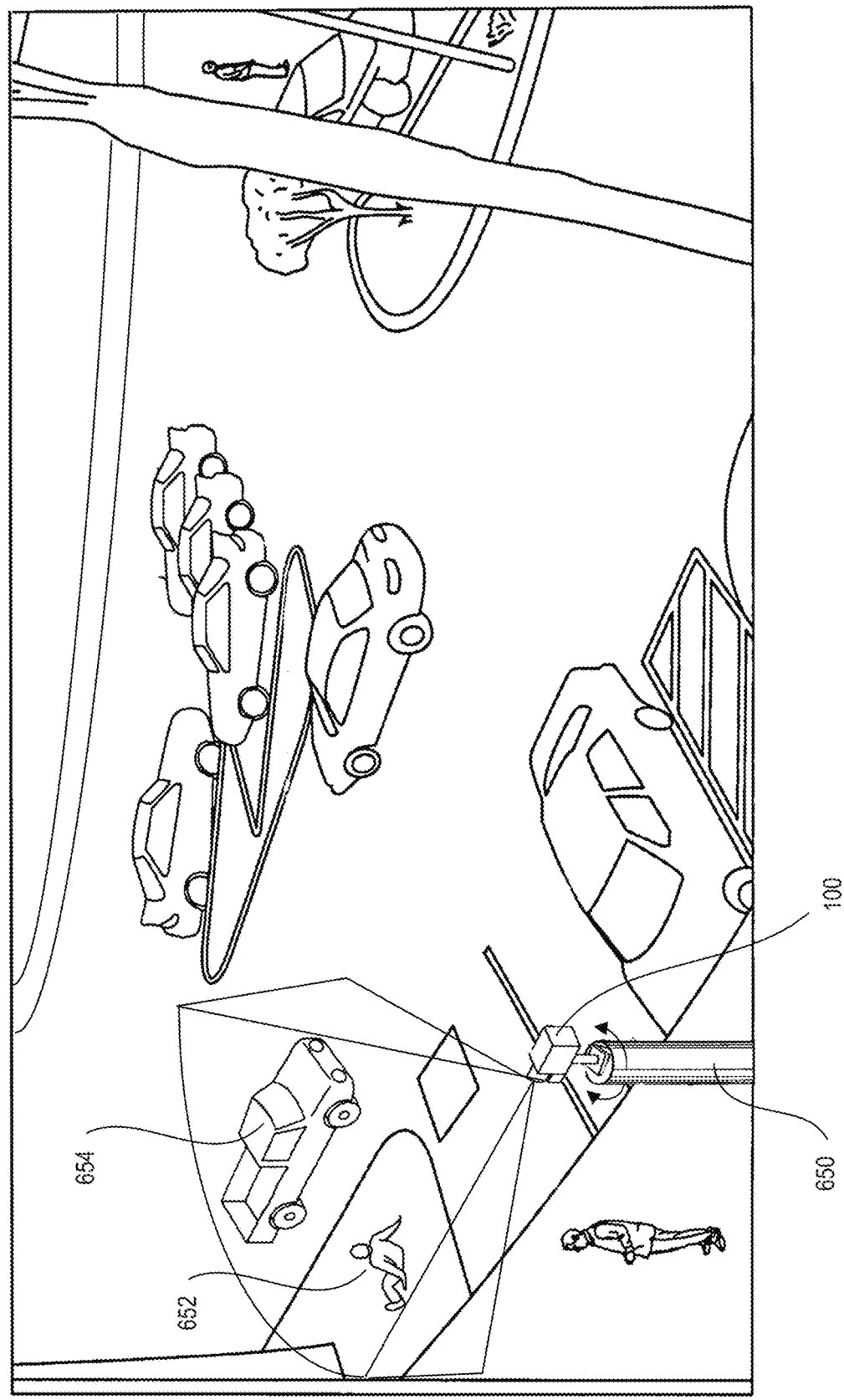
FIG. 6D is a diagram illustrating a second example implementation consistent with some embodiments of the present disclosure.

FIG. 6D illustrates the implementation of LIDAR system 100 in a surveillance system. As mentioned above, LIDAR system 100 may be fixed to a stationary object 650 that may include a motor or other mechanism for rotating the housing of the LIDAR system 100 to obtain a wider field of view. Alternatively, the surveillance system may include a plurality of LIDAR units. In the example depicted in FIG. 6D, the surveillance system may use a single rotatable LIDAR system 100 to obtain 3D data representing field of view 120 and to process the 3D data to detect people 652, vehicles 654, changes in the environment, or any other form of security-significant data.

Consistent with some embodiment of the present disclosure, the 3D data may be analyzed to monitor retail business processes. In one embodiment, the 3D data may be used in retail business processes involving physical security (e.g., detection of: an intrusion within a retail facility, an act of vandalism within or around a retail facility, unauthorized access to a secure area, and suspicious behavior around cars in a parking lot). In another embodiment, the 3D data may be used in public safety (e.g., detection of: people slipping and falling on store property, a dangerous liquid spill or obstruction on a store floor, an assault or abduction in a store parking lot, an obstruction of a fire exit, and crowding in a store area or outside of the store). In another embodiment, the 3D data may be used for business intelligence data gathering (e.g., tracking of people through store areas to determine, for example, how many people go through, where they dwell, how long they dwell, how their shopping habits compare to their purchasing habits).

Consistent with other embodiments of the present disclosure, the 3D data may be analyzed and used for traffic enforcement. Specifically, the 3D data may be used to identify vehicles traveling over the legal speed limit or some other road legal requirement. In one example, LIDAR system 100 may be used to detect vehicles that cross a stop line or designated stopping place while a red traffic light is showing. In another example, LIDAR system 100 may be used to identify vehicles traveling in lanes reserved for public transportation. In yet another example, LIDAR system 100 may be used to identify vehicles turning in intersections where specific turns are prohibited on red.

MEMS Mirror Assembly with Built-in Heating Resistor

In order to allow microelectromechanical systems (MEMS) that includes moving components, and especially a MEMS mirror or other large surface, to operate in lower temperatures, novel MEMS systems are described below, which include one or more built-in heating resistors. Having one or more built-in heating elements configured to heat one or more components of the MEMS system (e.g., an actuator) may help to maintain the optimal environment in which the MEMS system operates.

While the present disclosure provides examples of MEMS mirror assembly of MEMS systems that may be part of a scanning LIDAR system, it should be noted that aspects of the disclosure in their broadest sense, are not limited to MEMS assembly for a LIDAR system. Rather, it is contemplated that the forgoing principles may be applied to other types of electro-optic systems as well (e.g., a camera, range-finder, electronic microscope).

FIGS. 3A-3D depict exemplary MEMS scanning devices 104. In addition, while the present disclosure describes MEMS systems that include a MEMS mirror, other types of MEMS systems that include MEMS function surfaces such as a piston or valve are also contemplated. For example, instead of including a MEMS mirror, a MEMS system may include a piezoelectrically activated component (e.g., a piston, a valve) configured to pivot the surface directing light. By way of example, a MEMS system may include a piezoelectrically activated pivoting surface.

In some embodiments, an exemplary MEMS system may include a MEMS assembly that includes a MEMS mirror configured to move about at least one axis and at least one actuator configured to cause the movement of the MEMS mirror. The MEMS mirror assembly may also include at least one heating element configured to heat at least part of the actuator when an electric current passes through the heating element. In some embodiments, the MEMS mirror assembly may be made from a single wafer die. In other embodiments, the MEMS mirror assembly may be made from two or more wafer dies fixed together (e.g., a glass wafer and a silicon wafer being glued together to from a sealed compartment).

Figure 7A:
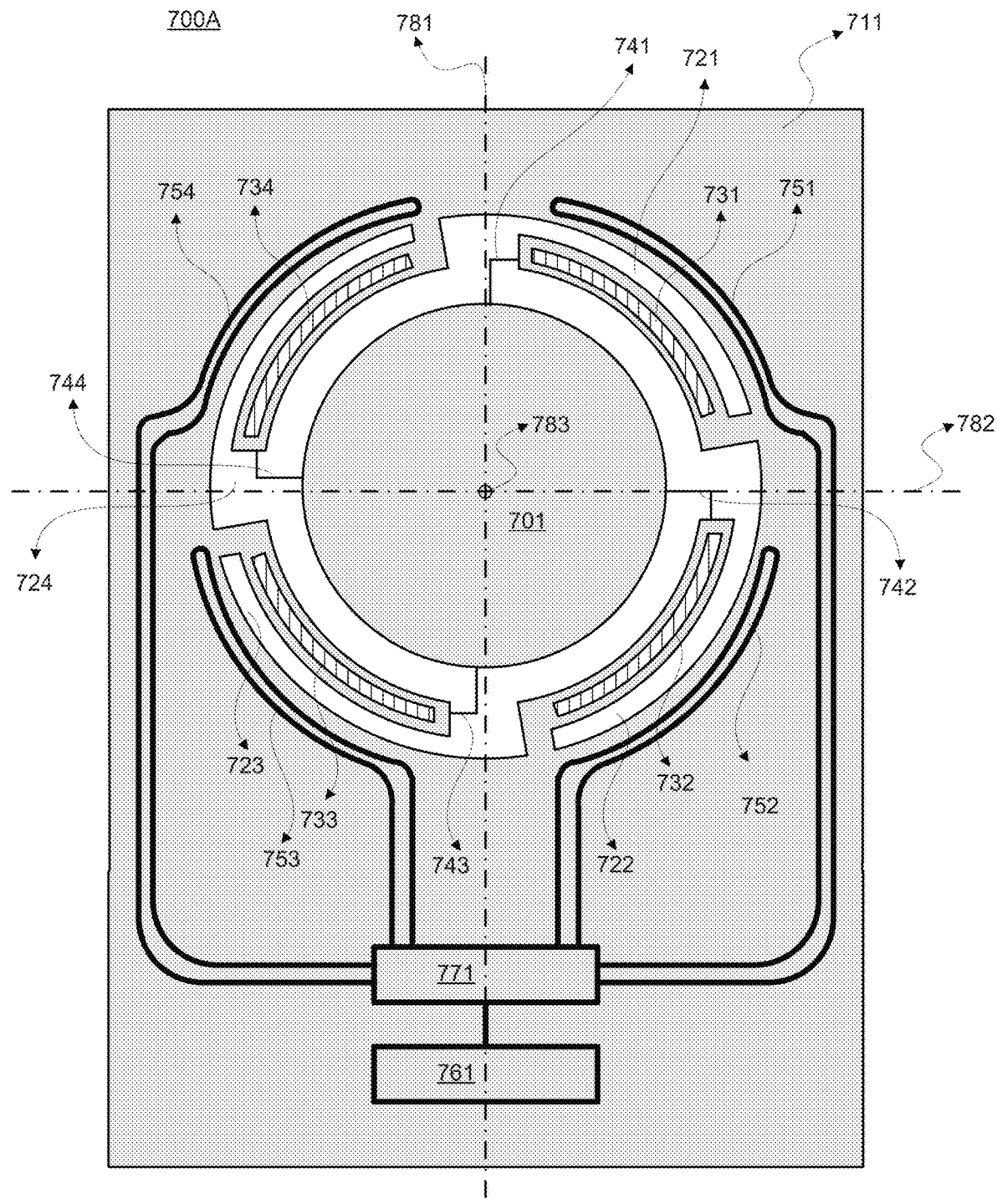
FIGS. 7A and 7B are diagrams illustrating exemplary MEMS mirror assemblies consistent with some embodiments of the present disclosure.
Figure 7B:
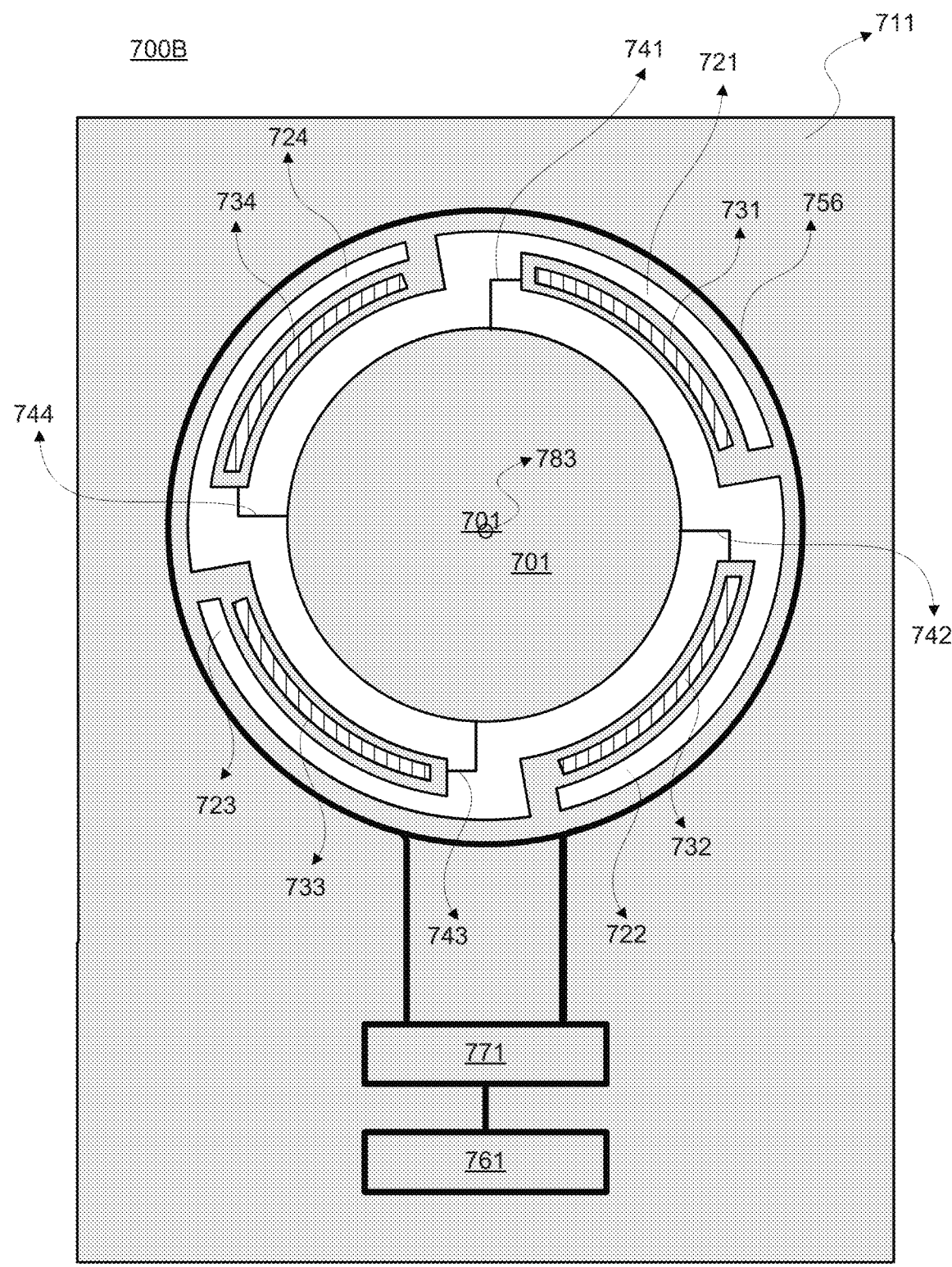
Figure 8:
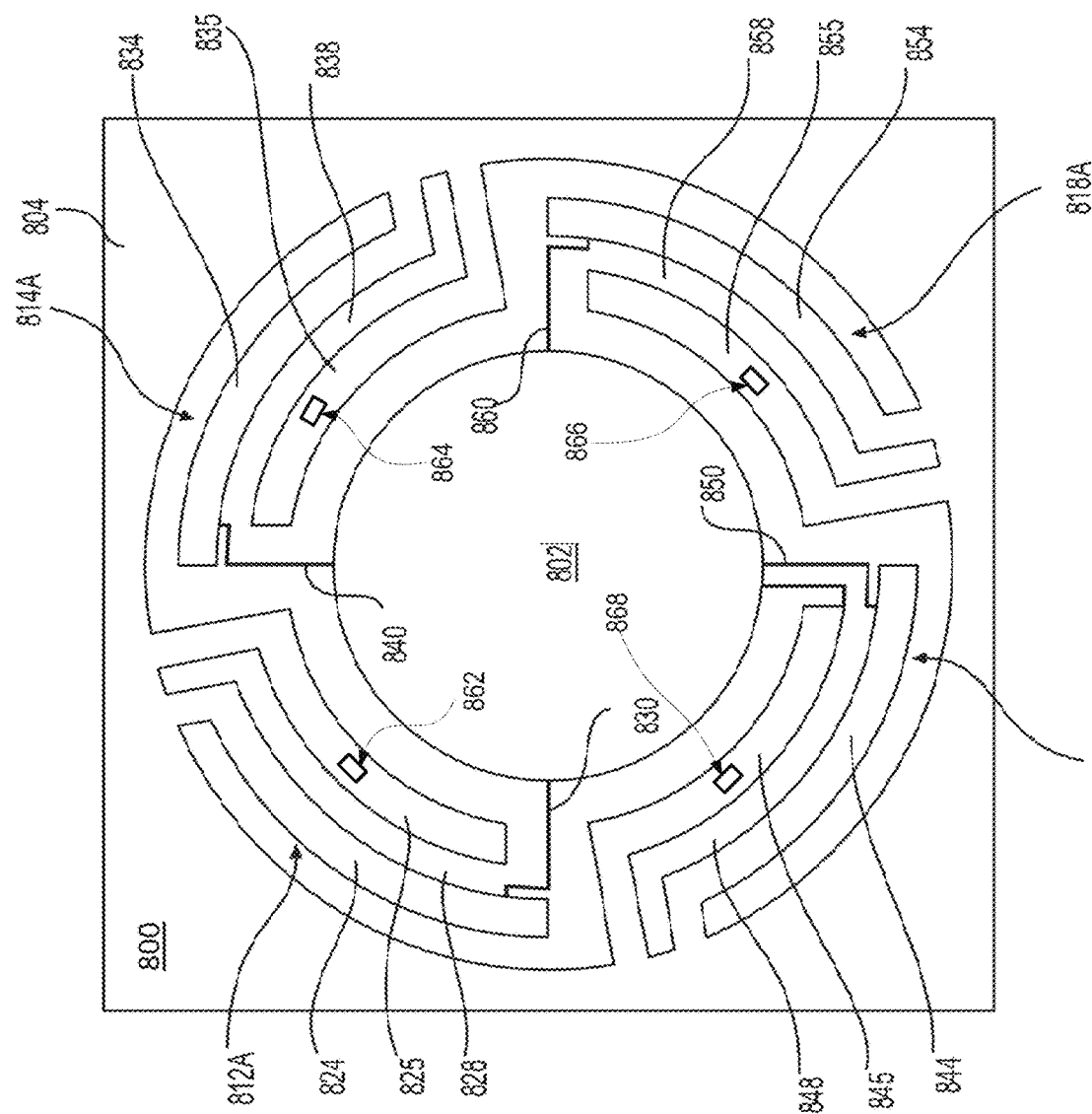
FIG. 8 is a diagram illustrating an exemplary MEMS mirror assembly consistent with some embodiments of the present disclosure.

FIGS. 7A, 7B and 8 illustrate exemplary MEMS mirror assemblies 700A, 700B, and 800, in accordance with some embodiments of the present disclosure. Although MEMS mirror assemblies 700A, 700B, and 800 are described individually in some instances, one or more components of one MEMS mirror assembly may be used in other MEMS mirror assemblies. MEMS mirror assembly 700A may include a frame 711, a MEMS mirror 701, one or more actuators (e.g., actuators 721, 722, 723, 724), one or more interconnect elements 741, 742, 743, 744, and one or more heating elements (e.g., heating resistors 751, 752, 753, 754). Frame 711 may structurally support the MEMS mirror while allowing MEMS mirror 701 to pivot about one or more axes of rotation relative to frame 711. MEMS mirror 701 may include a reflective surface. MEMS mirror 701 may be a movable MEMS mirror in that MEMS mirror 701 may be translatable relative to frame 711 and/or rotatable about one or more axes relative to frame 711. Interconnect elements 741, 742, 743, and 744 may be connected to MEMS mirror 701 and configured to facilitate rotation of MEMS mirror 701 about at least one rotational axis. Actuators 721, 722, 723, and 724 may apply mechanical force on one or more of interconnect elements 741, 742, 743, and 744, causing translational or rotational movement of the MEMS mirror relative to the frame. Heating resistors 751, 752, 753, and 754 may be configured to heat one or more of actuators 721, 722, 723, and 724. While not necessarily so, MEMS mirror assembly 700A may implement any structure or functionality discussed with respect to scanning unit 104 and/or to light deflector 114 (e.g., with respect to FIGS. 3A and 3B).

In some embodiments, MEMS mirror assembly 700A may also include a controller 761, a power source 771, and one or more sensors (not shown). Controller 761 may be configured to control the activation of one or more of the heating resistors. For example, controller 761 may control the appliance of an electric current to heating resistor 751, thereby heating an actuator nearby (e.g., actuator 721). In some embodiments, controller 761 may also be configured to control activation of one or more the actuators. Power source 771 may be configured to provide the electric power for the heating. In some embodiments, power source 771 may also provide power to controller 761. One or more sensors may be configured to monitor the conditions under which MEMS mirror assembly 700A operates. For example, MEMS mirror assembly 700A may include one or more temperature sensors configured to monitor the temperature of one or more components of MEMS mirror assembly 700A. The sensor may also be configured to transmit the signal and/or information relating to the condition(s) it monitors to controller 761.

Frame 711 may include any supporting structure to which the MEMS mirror may be attached such that the MEMS mirror may be capable of rotating and/or translating relative to the frame. For example, frame 711 may include portions of a wafer die used to manufacture the MEMS mirror that may structurally support the MEMS mirror while allowing the MEMS mirror to pivot about one or more axes of rotation relative to the frame.

In some embodiments, frame 711 may be spaced from the active area of MEMS mirror 701 (any part of which can move from the plane of frame 711, or otherwise more with respect to frame 711) with the exception of one or more actuators (e.g., actuators 721, 722, 723, and 724) and/or interconnect element (e.g., interconnect elements 741, 742, 743, 744). Frame 711 may include a continuous frame or a frame consisting of two or more separate parts. For example, the frame may be made from wafer layers which include one or more silicon layers, the one or more silicon layers possibly including at least one silicon layer which is a part of the MEMS mirror. Layers of materials other than silicon may also be used.

MEMS mirror 701 may be configured to allow light to deviate from its original path. MEMS mirror 701 may be a movable MEMS mirror in that MEMS mirror 701 may be translatable relative to frame 711 and/or rotatable about one or more axes relative to frame 711. For example, MEMS mirror 701 may be translatable or rotatable about exemplary axes 781, 782, and/or 783 (going into the plane of the figure) as illustrated in FIG. 7A. For example, MEMS mirror 701 may be rotated within the plane of frame 711.

In some embodiments, MEMS mirror 701 may include a MEMS structure with a rotatable part which rotates with respect to a plane of a wafer (or frame 711). Alternatively or additionally, MEMS mirror 701 may include a MEMS structure with a translatable part which translates with respect to a plane of a wafer (or frame 711). In some exemplary embodiments, the rotatable part (and/or the translatable part) may include a reflective coating or surface to form a MEMS mirror capable of reflecting or deflecting light from a light source. Although MEMS mirror 701 has been illustrated as having a circular shape in FIG. 7A (and FIG. 7B), it is contemplated that MEMS mirror 701 may have a square shape, a polygonal shape (e.g. octagonal), an elliptical shape, or any other geometrical shape suitable for use with the MEMS assembly. While the present disclosure describes examples of a MEMS mirror and frame, it should be noted that aspects of the disclosure in their broadest sense are not limited to the disclosed examples of the MEMS mirror and/or frame.

MEMS mirror assembly 700A may include one or more actuators configured to cause pivoting of MEMS mirror 701 about at least one axis (e.g., axes 781, 782, and/or 783). An actuator (e.g., actuator 721, 722, 723, 724) may include one or more movable structural members of the MEMS mirror assembly that may be capable of causing translational and/or rotational movement of the MEMS mirror relative to the frame. The disclosed actuator may be an integral part of the MEMS mirror assembly or may be separate and distinct from the MEMS mirror assembly. The disclosed actuator may be directly or indirectly attached to the disclosed MEMS mirror. In some embodiments, the one or more actuators of mirror assembly 700A may be one or more of the actuators disclosed in International Application No. PCT/IB2018/001467, entitled "LIDAR SYSTEMS AND METHODS," filed Nov. 28, 2018, which is incorporated herein by reference in its entirety.

In some embodiments, an actuator may include an actuator-body (e.g., made of silicon) and a piezoelectric element. By way of example, actuator 721 may include a body (a part number thereof not shown) and a piezoelectric element 731. Similarly, each of actuators 722, 723, and 724 may include a body and a corresponding piezoelectric element 732, 733, or 734. A piezoelectric element may be configured to bend the body and move the active area when it is subjected to an electrical field.

In some embodiments, MEMS mirror assembly 700A may include two or more types of actuators. The different types of actuators allow moving of the active area in different directions. Actuators 721 and 722 may be different types of actuators. Piezoelectric element 731 may be configured to bend the body of actuator 721 and move MEMS mirror 701 at a first direction when it is subjected to a first electrical field, and piezoelectric element 732 may be configured to bend the body of actuator 722 and move MEMS mirror 701 at a second direction when it is subjected to a second electrical field.

MEMS mirror assembly 700A may also include one or more interconnect elements (e.g., interconnect elements 741, 742, 743, 744) via which one or more actuators are connected to MEMS mirror 701. For example, interconnect element 741 may provide electrical and/or mechanical connections between one or more actuating arms of actuator 721, springs associated with the actuating arms (not shown), and MEMS mirror 701. In some exemplary embodiments, an interconnect element may be directly attached to one or more of actuating arms, to springs, and/or to MEMS mirror 701. Alternatively or additionally, an interconnect element may include more than one connector member that may be connected to each other and may be attached to the one or more actuating arms, to springs, and/or to MEMS mirror 701. In some embodiments, an interconnect element 741 may include one or more connectors disclosed in International Application No. PCT/IB2018/001467, entitled "LIDAR SYSTEMS AND METHODS," filed Nov. 28, 2018, which is incorporated herein by reference in its entirety. The interconnect elements may be made from silicon, metal, or any other material which is used in MEMS mirror assembly 700A. The interconnect elements may be made as a continuation of one or more wafer layer which are present in the actuators, in MEMS mirror 701, or both.

MEMS mirror assembly 700A further includes one or more heating elements (e.g., heating resistors 751, 752, 753, and 754) configured to heat one or more components (or part thereof) of the MEMS mirror assembly. For example, a heating element may be a heating resistor 751 configured to heat piezoelectric element 731 of actuator 721 when an electrical current passes through heating resistor 751. Similarly, heating resistors 752, 753, and 754 may be configured to heat piezoelectric elements 732, 733, and 734, respectively when an electrical current passes through the corresponding heating resistor.

In some embodiments, e.g., as illustrated in FIG. 7A, a MEMS mirror assembly may include a plurality of heating resistors, each of which may be configured to heat one component of the MEMS mirror assembly. Alternatively or additionally, the MEMS mirror assembly may include two or more heating resistors to heat one component. For example, MEMS mirror assembly 700A may include a heating resistor 751 and another heating resistor (not shown) to heat piezoelectric element 731. Controller 761 may control the heat resistors to heat piezoelectric element 731 as described elsewhere in this disclosure. For example, controller 761 may determine to activate the heat resistors if the temperature of piezoelectric element 731 is below a threshold. Controller 761 may also control power source 771 to pass an electric current through each of the heating resistors via a circuitry. The heating resistors may be implemented on (or close to) the component homogenously. Alternatively, the heating resistors may not be implemented on (or close to) the component homogenously. For example, a first heating resistor may be implemented near interconnect element 741 (i.e., the connection of actuator 721 to frame 711), and a second heating resistor 751 may be implemented on (or close to) an arm of actuator 721. In some embodiments, the first and second heating resistors may be the same type or different types. Alternatively or additionally, controller 761 may control power source 771 to supply the same electric current or different electric current to the first and second heating resistors.

In some embodiments, controller 761 may control power source 771 to supply different electric currents to different heating resistors. For example, power source 771 may supply a first electric current to heating resistor 751 and a second electric current, which is different from the first electric current (e.g., a larger or smaller electric current), to heating resistor 751.

In some embodiments, a MEMS mirror assembly may include one heating element configured to heat two or more components. By way of example, as illustrated in FIG. 7B, MEMS mirror assembly 700B may include a heating resistor 756 configured to heat actuators 721, 722, 723, and 724 (or piezoelectric elements 731, 732, 733, and 734) when an electric current passes through heating resistor 756. In some embodiments, heating resistors 751, 752, 753, and/or 754 may be configured to heat one or more components of MEMS mirror assembly 700A (e.g., actuator 721 and/or piezoelectric element 731 thereof) in response information indicative of the temperature of the component. For instance, controller 761 may receive information indicating that the temperature of piezoelectric element 731 is below a threshold. Controller 761 may also control power source 771 to supply an electric current to heating resistor 751 for heating piezoelectric element 731.

In some embodiments, the heating resistors of MEMS mirror assembly 700A may be the same type. Alternatively, MEMS mirror assembly 700A may include two or more different types of heating resistors. For example, heating resistor 751 may have a different total resistance, heating power, or the like, or a combination thereof, from heating resistor 752 (or other heating resistors).

In some embodiments, a heating resistor (e.g., one of heating resistors 751, 752, 753, 754, and 756) may have a total resistance in a range between ¼ and 5 kiloohms. In some embodiments, the total resistance of a heating resistor may be limited in a subrange of ¼ to 1 ohm, 1-10 ohm, 10-50 ohms, 50-100 ohms, 100-500 ohms, 500-1000 ohms, 1-2 kiloohms, and 2-5 kiloohms.

In some embodiments, a heating resistor (e.g., heating resistors 751, 752, 753, 754, and 756) may have a heat power in a range between 5 and 5000 milliwatts. In some embodiments, the heat power of a heating resistor may be limited in a subrange of 5 to 10 milliwatts, 10-50 milliwatts, 50-100 milliwatts, and 100-500 milliwatts.

In some embodiments, MEMS mirror assembly 700A may include various sensors (not shown) configured to monitor the conditions under which MEMS mirror assembly 700A operates. For example, MEMS mirror assembly 700A may include one or more temperature sensors configured to monitor the temperature of one or more components of MEMS mirror assembly 700A. For example, a temperature sensor (e.g., a resistive temperature sensor) may be configured to measure the temperature of actuator 721 (and/or piezoelectric element 731). Alternatively or additionally, the temperature sensor may be configured to monitor the ambient temperature of MEMS mirror assembly 700A.

A sensor may be configured to transmit the signal and/or information relating to the condition(s) it monitors to controller 761. For example, the sensor may transmit information indicative of the temperature of piezoelectric element 731 to controller 761, which may determine whether to activate one or more heating resistors to heat piezoelectric element 731 based on the information received. The measurement (or monitor) of temperature by a sensor may be continuous or intermittently. Alternatively or additionally, the sensor may receive a control signal from controller 761 to measure temperature and transmit the temperature information it acquires to controller 761. The sensor may measure the temperature directly or indirectly, e.g., by measuring effects of varying temperatures on operations of one or more components of the MEMS mirror assembly. By way of example, controller 761 may receive information indicative of a voltage for actuating MEMS mirror 701 by actuator 721 and generate a control signal transmitted to a sensor. Controller 761 may also use data from other sensors for generating the temperature indicative data. For example, the information regarding the voltage required for moving the MEMS mirror may be used together with movement feedback data indicative of the degree of movement caused by the actuators to assess the temperature. After receiving the control signal, the sensor may measure the temperature of actuator 721 (or piezoelectric element 731) and transmit the temperature information to controller 761.

In some embodiments, a sensor may be implemented as part of MEMS mirror assembly 700A. For example, a sensor may be implemented on (or close to) a component of MEMS mirror assembly 700A. By way of example, a sensor may be implemented on frame 711, MEMS mirror 701, one of the actuators 721, 722, 723, and 724 (or the piezoelectric element thereof), controller 761, or the like, or a combination thereof. In other embodiments, a sensor may be implemented outside of MEMS mirror assembly 700A (e.g., a temperature sensor external to MEMS mirror assembly 700A configured to measure the ambient temperature around MEMS mirror assembly 700A).

In some embodiments, MEMS mirror assembly 700A may also include a controller 761 and a power source 771. Controller 761 may include one or more processors, microprocessors, or the like, or a combination thereof. Controller 761 may be configured to control activation of one or more heating resistors 751, 752, 753, and 754. For example, controller 761 may control power source 771 to supply an electric current to one or more of the heating resistors. Alternatively or additionally, controller 761 may control actuation of one or more actuators 721, 722, 723, and 724. For example, controller 761 may control the electrical field applied to an actuator, thereby activating (or deactivating) the actuation of the actuator. In some embodiments, controller 761 may be implemented on the same chip as at least one of the actuators, the heating resistors, and power 771. In other embodiments, controller 761 may be implemented as an external component to the MEMS mirror assembly (e.g., part of processor 118 of the LIDAR system).

Power source 771 may be configured to supply one or more heating resistors the electric power for heating. Power source 771 may be a battery, AC power source, DC power source, chargeable capacitor, or the like, or a combination thereof. In some embodiments, power source 771 may include a power source being part of MEMS mirror assembly 700A (e.g., an internal power source). Alternatively or additionally, power source 771 may include a power source external to MEMS mirror assembly 700A.

In some embodiments, power source 771 may be electrically coupled to various components of MEMS mirror assembly 700A (e.g., the actuators, heating resistors, controller, various sensors). Power source 771 may be external to controller 761. Alternatively, power source 771 and controller 761 may be integrated as a signal unit. In some embodiments, controller 761 and power source 771 may be electrically coupled to, but external to, the MEMS mirror assembly. For example, controller 761 (and/or power source 771) may be implemented outside MEMS mirror assembly 700A (e.g., as another part of a LIDAR system which includes the MEMS mirror assembly).

In some embodiments, controller 761 may selectively cause power source 771 to apply an electric current passing through a heating resistor based on a temperature reading from the MEMS mirror assembly (or a component thereof). For example, controller 761 may be configured to control power source 771 to selectively supply an electric current to heating resistor 751 (but not to heating resistors 752, 753, or 754) based on a temperature reading from MEMS mirror assembly 700A (e.g., a temperature reading from piezoelectric element 731). By way of example, controller 761 may selectively cause power source 771 to apply an electric current passing through heating resistor 751 when the temperature reading is lower than a threshold temperature.

In some embodiments, two or more components of MEMS mirror assembly 700A (e.g., one or more of frame 711, MEMS mirror 701, actuator 721, heating resistor 751) may be fabricated on a single wafer and may share common layers (e.g., a common silicon layer, a common lead zirconate titanate (PZT) layer). For example, one or more of heating resistors 751, 752, 753, and 754 may be implemented on a metal layer of a wafer of MEMS mirror assembly 700A. Alternatively or additionally, one or more of heating resistors 751, 752, 753, and 754 may be implemented on a doped area of a silicon-based layer of the wafer of MEMS mirror assembly 700A. The silicone-based layer may be made of silicon, polysilicon, doped (or partly-doped) silicon, doped (or partly-doped) polysilicon, or any other silicon-based material such as Silicide. As another example, at least one electrode used for applying the electrical field to a piezoelectric element is implemented on the metal layer of the wafer of MEMS mirror assembly 700A, and one or more of heating resistors 751, 752, 753, and 754 may be implemented on the same metal layer as the electrode used for piezoelectric actuation.

MEMS mirror assembly 700A may also include additional components, such as controller 761, power source 771, sensors (e.g., a temperature sensor), optical components, structural elements, casing, etc. Such additional components may be implemented on the same wafer as the MEMS mirror, on another wafer, or be otherwise integrated with the wafer of MEMS mirror 701.

In some embodiments, one or more heating resistors may be implemented on a component of the MEMS mirror assembly. For example, one or more heating resistors may be implemented on an actuator. Alternatively or additionally, one or more heating resistors may be implemented on the frame. By way of example, one or more heating resistors may be implemented on an edge of the frame adjacent to an actuator.

In some embodiments, one or more heating resistors may be implemented on a non-movable part of the MEMS mirror assembly, for example, adjacent to an actuator. For instance, the MEMS mirror assembly may include one or more stationary silicon strips, and one or more heating resistors may be implemented on at least one of the stationary silicon strips.

FIG. 8 illustrates an exemplary MEMS mirror assembly 800 including four stationary silicon strips. Similar to MEMS mirror assembly 700A illustrated in FIG. 7A, the exemplary MEMS mirror assembly 800 of FIG. 8 may include MEMS mirror 802, frame 804, and actuators 812A, 814A, 816A, and 818A. Actuator 812A of MEMS mirror assembly 800 of FIG. 8 may include actuating arm 824 and silicon strip 825. Silicon strip 825 may be stationary and non-movable relative to MEMS mirror assembly 800. Silicon strip 825 may be positioned adjacent actuating arm 824 and may be separated from actuating arm 824 by gap 828. Actuating arm 824 may be connected to MEMS mirror 802 via interconnect element 830. Silicon strip 825, however, may not be mechanically or electrically connected to MEMS mirror 802. Silicon strip 825 of MEMS mirror assembly 800 may be disposed between and spaced apart from actuating arm 824 and MEMS mirror 802. Further, silicon strip 825 may be similar to second actuating arm 826 of MEMS mirror assembly 800 when not connected to MEMS mirror 802.

Similarly, actuators 814A, 816A, and 818A each may include one actuating arm 834, 844, and 854, respectively. As also illustrated in FIG. 8, actuators 814A, 816A, and 818A may include silicon strips 835, 845, and 855, respectively, separated from respective actuating arms 834, 844, and 854 by gaps 838, 848, and 858, respectively. Additionally, actuating arms 834, 844, and 854 may be connected to MEMS mirror 802 via interconnect elements 840, 850, and 860, respectively. Silicon strips 835, 845, and 855 may be similar to actuating arms 836, 846, and 856, respectively, when actuating arms 836, 846, and 856 are not connected to MEMS mirror 802. In some embodiments, one or more of the silicon strips 825, 835, 845, and 855 may belong to the silicon layer on which the actuator and the mirror are implemented.

One or more heating resistors (e.g., heating resistors 862, 864, 866, and 868) may be implemented on each of silicon strips 825, 835, 845, and 855, which may be stationary. The heating resistors may be configured to heat the corresponding actuator (and/or the piezoelectric element thereof) when an electric current passes.

Figure 9:
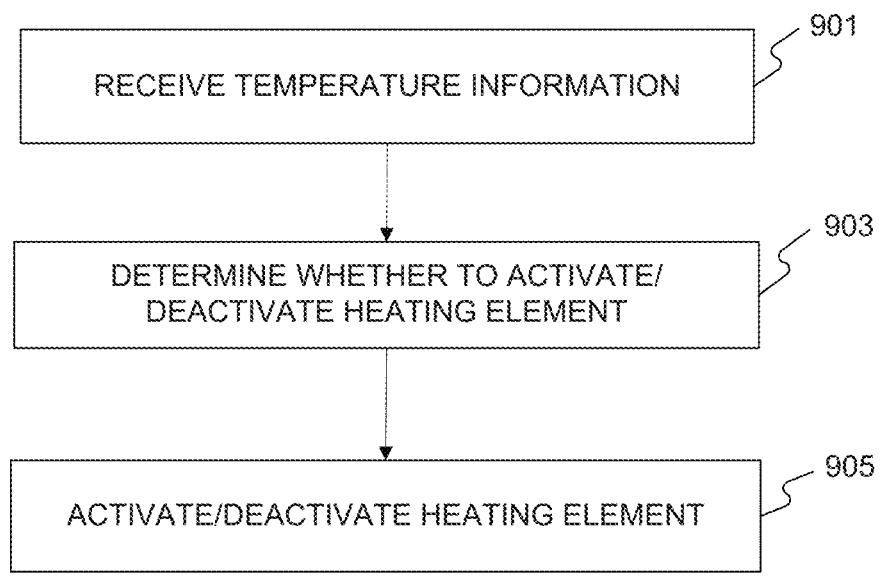
FIG. 9 is a flowchart of an exemplary process for operating a MEMS mirror assembly consistent with some embodiments of the present disclosure.

FIG. 9 is a flowchart of an exemplary heating process 900 consistent with disclosed embodiments. One or more steps of heating process 900 may be performed by controller 761 (and/or other embodiments of the controller described herein, e.g., processor 118 of the LIDAR system). While the heating process is described herein using the components of MEMS mirror assembly 700A illustrated in FIG. 7A, it may apply to other exemplary MEMS mirror assemblies described in this disclosure.

At step 901, the temperature information may be received. In some embodiments, step 901 may be performed by a controller (e.g., controller 761, processor 118). For example, controller 761 may receive temperature information. In some embodiments, controller 761 may receive information indicative of a component of MEMS mirror assembly 700A from a temperature sensor. For example, a sensor close to actuator 721 may measure the temperature of actuator 721 (or piezoelectric element 731) and transmit the information indicative of the temperature to controller 761. As another example, controller 761 may receive information indicative of the ambient temperature in surroundings of MEMS mirror assembly 700A from a sensor external to MEMS mirror assembly 700A.

In some embodiments, a sensor may continuously measure the temperature of one or more components (e.g., one or more actuators or the piezoelectric element thereof) and transmit the information to controller 761 continuously. Alternatively or additionally, the sensor may measure the temperature intermittently and transmit the temperature information to controller 761 if it is available. For example, the sensor may be configured to measure the temperature once over a pre-determined period, which may be in a range of 0.1 seconds to 10 minutes. In some embodiments, the period may be restricted in a subrange of 0.1 to 1 second, 1 to 10 seconds, 10 to 60 seconds, and 1 to 10 minutes. Alternatively or additionally, the sensor may be configured to measure the temperature on demand. For example, the sensor may receive a control signal from controller 761. In response, the sensor may measure the temperature (continuously or intermittently) and transmit the temperature information to controller 761. In some embodiments, the sensor may continue to measure the temperature until receiving a second control signal to stop the measurement.

At step 903, whether to activate (or deactivate) one or more heating elements may be determined. In some embodiments, step 903 may be performed by a controller (e.g., controller 761, processor 118). For example, controller 761 may be configured to determine whether to activate (or deactivate) one or more of heating resistors 751, 752, 753, and 754 to heat one or more components of MEMS mirror assembly 700A, based on the temperature information received. For example, controller 761 may determine whether the temperature of piezoelectric element 731 is below an activation threshold, which may be a lower limit of the temperature range under which the component(s) operates optimally. If so, controller 761 may determine to activate heating resistor 751 to heat piezoelectric element 731. On the other hand, if controller 761 determines that the temperature of piezoelectric element 731 equals or exceeds the activation threshold, controller 761 may determine the activation of heating resistor 751 is not needed (i.e., taking no action). As another example, controller 761 may receive information indicative of the temperature of a first component from a first sensor and receive information indicative of the temperature of a second component from a second sensor. By way of example, controller 761 may receive information the temperature of MEMS mirror 701 from a first sensor and receive information indicative of the temperature of actuator 721 from a second sensor. Controller 761 may also determine that the temperature of MEMS mirror 701 is above a first activation threshold, while the temperature of piezoelectric element 732 is below a second activation threshold (which may be the same as or different from the first threshold). Controller 761 may further determine to activate heating resistor 752, but not a heating resistor close to MEMS mirror 701 (not shown in FIG. 7A). As a further example, controller 761 may determine that one of the temperatures of the components is below an activation threshold corresponding to a particular component (which may be the same or different for the components) and determine to activate some or all heating resistors 751, 752, 753, and 754.

In some embodiments, the activation temperature threshold may relate to the dew point where the electrooptical system (or the MEMS mirror assembly) operates. The dew point refers to the atmospheric temperature below which water droplets begin to condense and dew can form, which may vary according to pressure and humidity. For example, controller 761 may receive (or determine based on various factors such as pressure, humidity) the dew point where the electrooptical system (or the MEMS mirror assembly) operates. Controller 761 may set the dew point as the activation threshold. Alternatively, controller 761 may set a certain degrees Celsius below or above the dew point as the activation threshold. By way of example, controller 761 may set 3° C. below (or above) the dew point as the activation threshold.

In some embodiments, the activation temperature threshold may relate to the operation condition of the MEMS mirror assembly. For example, controller 761 may be configured to set the activation temperature high enough to maintain the temperature of the MEMS mirror assembly (and/or the electrooptical system) within the operation range. By way of example, the activation temperature may be set by controller 761 as a temperature below which the degree of movement of the mirror is restricted, the voltage for operation is too high, one or more piezoelectric elements are damaged or behaving in abnormal manner, or the like, or a combination thereof. Alternatively or additionally, controller 761 may receive an error signal from one or more components of the MEMS mirror assembly indicative that the component(s) is/are in a sub-optimal condition because of the low temperature. Controller 761 may activate one or more heating resistors as described elsewhere in this disclosure.

Controller 761 may also be configured to deactivate one or more of heating resistors 751, 752, 753, and 754 if a deactivation condition is met. For example, controller 761 may deactivate a heating resistor 751 based on the temperature information received. For example, controller 761 may receive from sensor information indicative of the temperature of piezoelectric element 731 after heating resistor 751 is activated for heating piezoelectric element 731 (as described elsewhere in this disclosure). Controller 761 may determine that the temperature of piezoelectric element 731 equals to or exceeds a deactivation threshold. Controller 761 may determine to deactivate heating resistor 751. A component's deactivation threshold may be equal to or higher than its activation threshold. In some embodiments, a deactivation threshold may relate to the ambient temperature of the MEMS mirror assembly (e.g., 5, 10, or 15 degrees Celsius higher than the ambient temperature). Alternatively or additionally, controller 761 may deactivate a heating resistor after a predetermined heating period (e.g., 1, 5, or 10 minutes). In some embodiments, the deactivation threshold may relate to the dew point where the electrooptical system (or the MEMS mirror assembly) operates. For example, controller 761 may receive (or determine based on various factors such as pressure, humidity) the dew point where the electrooptical system (or the MEMS mirror assembly) operates. Controller 761 may set a certain degrees Celsius above the dew point as the deactivation threshold. By way of example, controller 761 may set any number between 5-20° C. above the dew point as the deactivation threshold.

In some embodiments, controller 761 may control the activation of a heating resistor until a deactivation condition is met. For example, controller 761 may activate heating resistor 751 to heat piezoelectric element 731, and heating resistor 751 may be configured to heat piezoelectric element 731 upon its activation. Controller 761 may receive from the sensor information indicative of the temperature of piezoelectric element 731 after the heating. Controller 761 may determine that the temperature of piezoelectric element 731 is higher than the ambient temperature in surroundings of the MEMS mirror assembly by a temperature difference (e.g., 5 or 10 degrees Celsius). Controller 761 may then deactivate heating resistor 751. The temperature difference may be in a range of 1-30 degrees Celsius. In some embodiments, the temperature difference may be restricted in a subrange of 1 to 5 degrees Celsius, 5 to 10 degrees Celsius, 10 to 20 degrees Celsius, and 20 to 30 degrees Celsius. In some embodiments, the condition for deactivating a heating resistor may relate to a deactivation temperature threshold being reached after the heating, a time period for heating by the heating resistor being reached, or the like, or a combination thereof.

In some embodiments, controller 761 may determine to activate (and/or deactivate) a heating resistor to heat a component based on the temperature of the component and a reference temperature. The reference temperature may be the temperature of another component. For example, controller 761 may receive from first sensor information indicative of the temperature of piezoelectric element 731 and receive from second sensor information indicative of the temperature of MEMS mirror 701, which serves a reference temperature. Controller 761 may determine to activate (and/or deactivate) heating resistor 751 heating piezoelectric element 731 based on a comparison between piezoelectric element 731's temperature and the reference temperature. By way of example, controller 761 may determine to activate heating resistor 751 if the temperature of piezoelectric element 731 is 5 degrees Celsius lower than the reference temperature.

At step 905, one or more heating elements may be activated (or deactivated). In some embodiments, step 905 may be performed by a controller (e.g., controller 761, processor 118). For example, controller 761 may be configured to activate (or deactivate) the heating element (e.g., one or more of heating resistors 751, 752, 753, and 754) it determined to activate (or deactivate). For example, controller 761 may be configured to cause appliance of an electric current to the heating resistor. By way of example, controller 761 may control power source 771 (by, for example, sending a control signal to power source 771) to supply an electric current to the heating resistor, which may heat one or more components when the electric current passes it.

In some embodiments, controller 761 may cause an electric current to be applied to the heating resistor based on the temperature of the component(s) that the heating resistor will heat. For instance, controller 761 may control power source 771 to supply a first electric current to heating resistor 751 when piezoelectric element 731 is at a first temperature and supply a second electric current larger than the first electric current to heating resistor 751 when piezoelectric element 731 is at a second temperature lower than the first temperature.

In some embodiments, controller 761 may cause different electric currents to be applied to different heating resistors based on the differences between the temperatures of the components that the heating resistors heat. For example, controller 761 may determine to activate heating resistors 751 and 752. Controller 761 may control power source 771 to supply a first electric current to heating resistor 751 and supply a second electric current to heating resistor 752, which may be different from (e.g., larger or smaller than) the first electric current. Alternatively or additionally, controller 761 may cause different electric currents to be applied to different heating resistors based on the types of the heating resistors.

Power source 771 may supply an electric current to one or more heating resistors in various manners (under the direction of controller 761 or on its own). For example, power source 771 may supply pulsed electric currents to a heating resistor. Alternatively or additionally, power source 771 may supply an electric current to the heating resistor continuously. Alternatively or additionally, power source 771 may supply an electric current to the heating resistor intermittently. For example, power source 771 may continue the supply of an electric current to the heating resistor for a first period of time, stop the supply for a second period of time, and then resume the supply for a third period of time, and so on. The time periods for supplying and discontinuing the supply may the same or different.

Power source 771 may supply electric currents to two one or more heating resistors that may cause the heating resistors to dissipate the same amount of heat (or have the same heating power), under the direction of controller 761 or on its own. The amount of heat dissipation (the heating power) of a heating resistor may be proportional to the production of the electric current passing through the heating resistor and the voltage of the heating resistor. For example, power source 771 may supply electric currents to heating resistors 751 and 752 that cause heating resistors 751 and 752 to dissipate the same amount of heat. By way of example, the electric currents passing through the heating resistors may have a same current, and the voltages of the heating resistors are the same. Alternatively, power source 771 may supply electric currents to two one or more heating resistors that may cause the heating resistors to dissipate different amounts of heat. For example, power source 771 may supply a first electric current to heating resistor 751. Power source 771 may also supply a second electric current, which may be different from the first current, to heating resistor 752. By way of example, the second electric current may have a larger (or smaller) current than the first electric current. Alternatively or additionally, power source 771 may cause the voltage of the heating resistor 751 being different from the voltage of heating resistor 752.

Electrooptical System with Heating Mechanism for its Solid State Photodetector

To maintain the optimal environment in which an electrooptical system operates, it may be desirable to include one or more heating elements built in the system to keep the temperature of one or more components of the system in an operational range. Novel solid-state photodetectors are described below, which may include an integrated circuit. A solid-state photodetector may be part of an electrooptical system, which may be part of LIDAR systems (e.g., LIDAR system 100). It is also contemplated that the forgoing principles may be applied to other types of electro-optic systems as well (e.g., a camera, range-finder, electronic microscope). An electrooptical system may also include optics for directing light from a field-of-view (FOV) of the electrooptical system to the solid-state photodetector. In some embodiments, the electrooptical system may also include an electric current source for supplying electric current to one or more components of the solid-state photodetector (e.g., one or more heating resistors).

An integrated circuit may include one or more light sensitive photodiodes configured to generate an output signal indicative of light impinging on the light sensitive photodiode(s). The integrated circuit may also include one or more heating elements (e.g., heating resistors) configured to heat one or more components of the solid-state photodetector. The integrated circuit may further include a circuitry for transmitting electric current to the heating element(s).

Figure 10A:
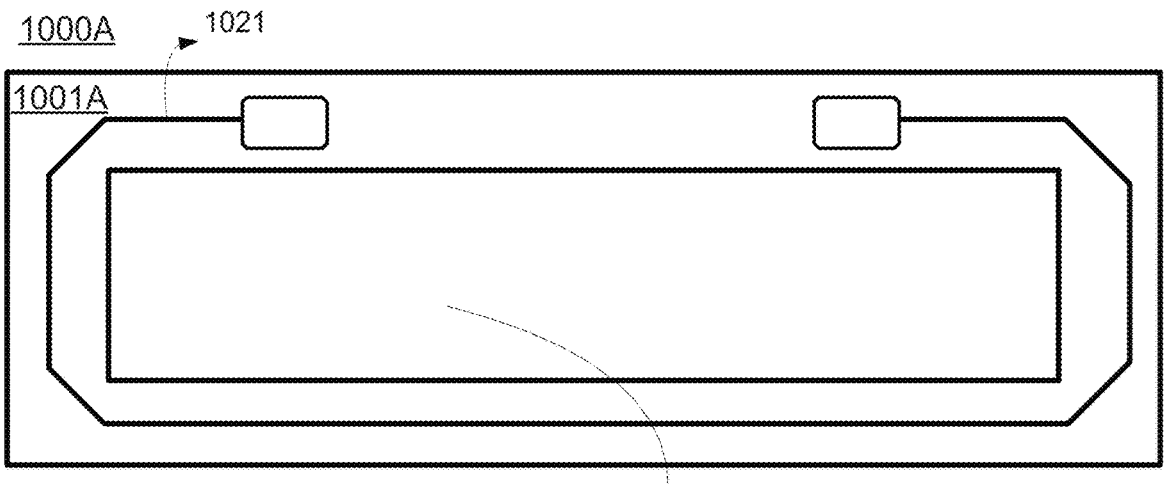
FIGS. 10A, 10B, and 10C are diagrams illustrating exemplary electrooptical systems consistent with some embodiments of the present disclosure.
Figure 10B:
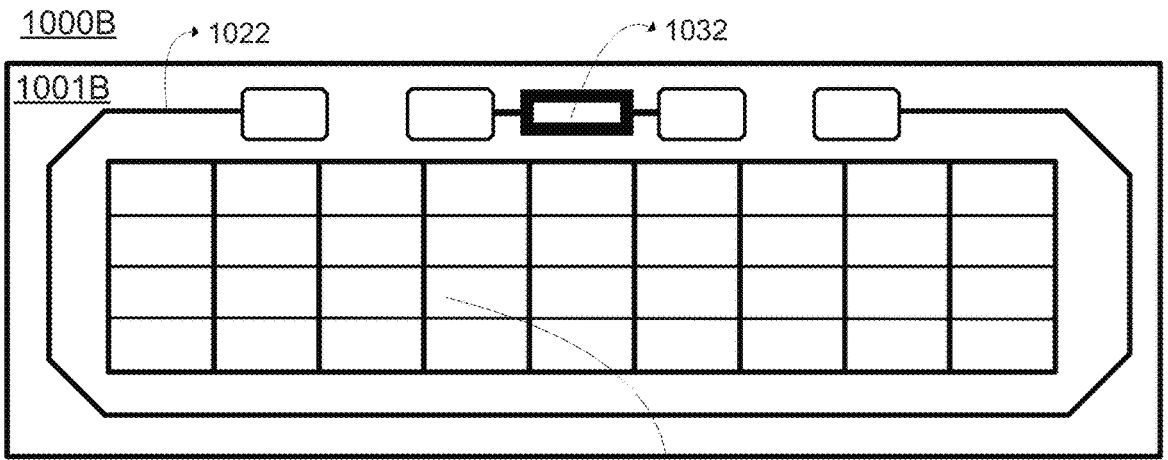
Figure 10C:
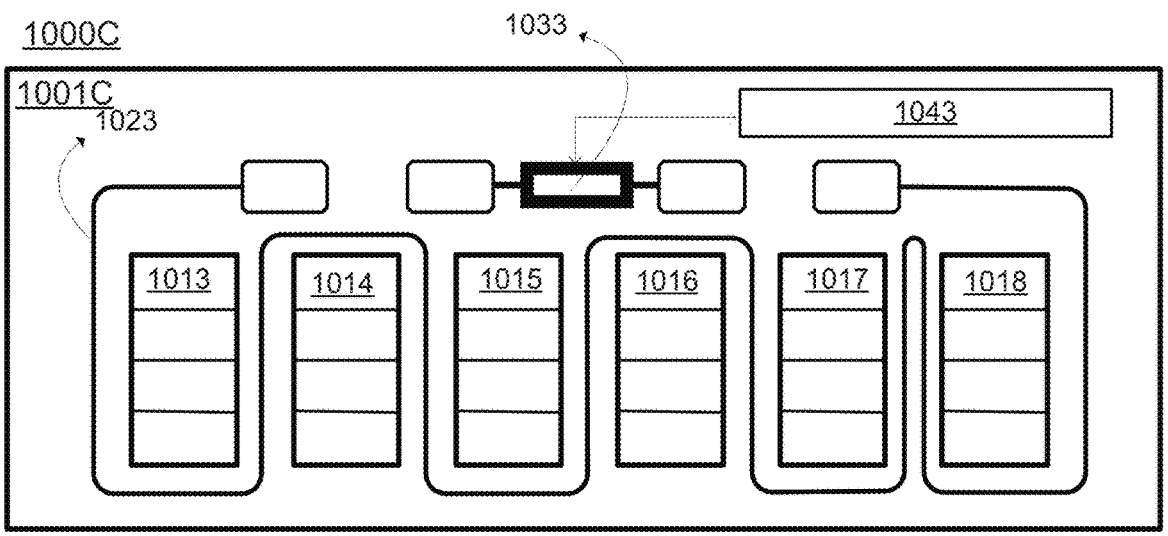

FIGS. 10A, 10B, and 10C illustrate exemplary solid-state photodetectors, in accordance with examples of the presently disclosed subject matter. Although solid-state photodetectors 1000A, 1000B, and 1000C (and solid-state photodetectors 1100A and 1100B illustrated in FIGS. 11A and 11B) are described individually in some instances, one or more components of one solid-state photodetector may be used in other solid-state photodetectors described herein.

As illustrated in FIG. 10A, solid-state photodetector 1000A may include, among others, an integrated circuit 1001A, which may include a light sensitive photodiode 1011, a heating element (e.g., a heating resistor 1021), and a circuitry for transmitting electric current to the heating element from a power source (also referred to an electric current source). Light sensitive photodiode 1011 may be configured to sense the light and generate output signal indicative of light impinging on the light sensitive photodiode. Heating resistor 1021 may be configured to heat the solid-state photodetector (or one or more components thereof). For example, heating resistor 1021 may be configured to heat light sensitive photodiode 1011 when an electric current passes through heating resistor 1021.

An integrated circuit may also include a sensor configured to monitor the configured to monitor the temperature of the solid-state photodetector (or one or more components thereof). FIG. 10B illustrates an exemplary solid-state photodetector 1000B comprising an integrated circuit 1001B, which may include a sensor 1032 configured to monitor the temperature of the solid-state photodetector and/or light sensitive photodiode 1012. Integrated circuit 1001B may also include a heating resistor 1022 to heat light sensitive photodiode 1012 based on the monitored temperature of the solid-state photodetector and/or light sensitive photodiode 1012.

An integrated circuit may further include a controller configured to control the activation of one or more heating elements and a power source configured to supply the electric current to the heating element via a circuitry. FIG. 10C illustrates an exemplary solid-state photodetector 1000C comprising an integrated circuit 1001C, which may comprise a controller 1043, a power source (not shown), a sensor 1033, light sensitive photodiodes 1013, 1014, 1015, 1016, 1017, and 1018, and a heating resistor 1023. Sensor 1033 may be configured to monitor the temperature of the solid-state photodetector (and/or one or more components thereof). Controller 1043 may be configured to control activation of heating resistor 1023 based on the monitored temperature of the solid-state photodetector and/or one or more components (e.g., one or more of light sensitive photodiodes 1013, 1014, 1015, 1016, 1017, and 1018). For example, controller 1043 may receive information indicative the temperature of light sensitive photodiode 1013 from sensor 1033. Controller 1043 may also determine that the temperature is below a threshold. Controller 1043 may further be configured to control the power source to supply an electric current to heating resistor 1023, thereby heating light sensitive photodiode 1013 (and/or one or more other components).

A light sensitive photodiode may be configured to detect reflections from objects in the FOV of the electrooptical system. The light sensitive photodiode may also generate output signal based on the light impinging on the light sensitive photodiode (e.g., intensity, timing, or the like, or a combination thereof). The electrooptical system may include one or more light sensitive photodiodes, each of which may include one or more detectors. A detector (e.g., the detector of light sensitive photodiode 1011, one or more detectors of light sensitive photodiode 1012, one or more light sensitive photodiodes 1013, 1014, 1015, 1016, 1017, and 1018) may be a photosensitive diode sensor, such as avalanche photodetectors (APDs), single-photon avalanche detector (SPADs), silicone zium-photomuplier detector (SiPMs), PIN photodiode.

In some embodiments, the solid-state photodetector may include a light sensitive photodiode that comprises a detector. For example, as illustrated in FIG. 10A, electrooptical system 1000A may include a light sensitive photodiode 1011 including a detector configured to detect light in the FOV of the electrooptical system. In other embodiments, the electrooptical system may include a light sensitive photodiode that comprises a plurality of detectors. For example, a light sensitive photodiode may include a row or a column of detectors. As another example, as illustrated in FIG. 10B, a solid-state photodetector (i.e., solid-state photodetector 1000B) may include a light sensitive photodiode 1012 that comprises a matrix of 4×8 detectors (also referred to as "pixels" or "detection cells"). In some embodiments, each of the pixels may be configured to detect light from a part of the FOV. The size of pixels may vary. For example, the pixel size may be about 100×100 $\mu m^2$ or 1×1 $mm^2$. Light sensitive photodiode 1012 may also include one or more outputs, each of which may corresponds to a different part (pixel) of light sensitive photodiode 1012. Light sensitive photodiode 1012 may be two-dimensional in the sense that it has more than one set (e.g. row, column) of the detectors in two non-parallel axes. The number of the detectors in light sensitive photodiode 1012 may vary between differing implementations (e.g., depending on the desired resolution, signal to noise ratio (SNR), desired detection distance). For example, light sensitive photodiode 1012 may have anywhere between 5 and 5,000 pixels. Lower or higher pixel counts (e.g., in megapixels) can also be implemented.

The detectors of a light sensitive photodiode may be the same type or include different types. Alternatively or additionally, the detectors of the same type may have different characteristics (e.g., sensitivity, size). Combinations of different types of detectors can be used for different reasons, such as improving detection over a span of ranges (e.g., in close range), improving the dynamic range of the detector, improving the temporal response of the detector, and/or improving detection in varying environmental conditions (e.g. atmospheric temperature, rain, etc.).

In some embodiments, the electrooptical system may include a plurality of light sensitive photodiodes, each of which may include one or more detectors. For example, as illustrated in FIG. 10C, electrooptical system 1000C may include light sensitive photodiodes 1013, 1014, 1015, 1016, 1017, and 1018. Each of light sensitive photodiodes 1013, 1014, 1015, 1016, 1017, and 1018 may include a plurality of detectors. In some embodiments, the solid-state photodetector may also include a readout circuitry associated with the light sensitive photodiodes (and/or detectors).

The solid-state photodetector may include one or more heating elements (e.g., heating resistors 1021, 1022, and 1023 illustrated in FIGS. 10A, 10B, and 10C, respectively). A heating resistor may be configured to heat one or more components of the solid-state photodetector (e.g., a light sensitive photodiode, transparent layer, controller, or the like, or a combination thereof). For example, as illustrated in FIG. 10A, heating resistor 1021 may be configured to heat light sensitive photodiode 1011. Alternatively or additionally, the solid-state photodetector may include two or more heating resistors to heat one component. For example, solid-state photodetector 1000A may include heating resistor 1021 and another heating resistor (not shown) to heat light sensitive photodiode 1011. Alternatively or additionally, the solid-state photodetector may include a heating resistor configured to two or more light sensitive photodiodes. For example, as illustrated in FIG. 10C, solid-state photodetector 1000C may include heating resistor 1023, which may be configured to heat light sensitive photodiodes 1013, 1014, 1015, 1016, 1017, and 1018. A heating resistor may be implemented on or close to a component. For example, a heating resistor may be implemented close to a light sensitive photodiode and on the substrate on which the light sensitive photodiode is implemented. In some embodiments, one or more heating resistors may be implemented on a polysilicon or metal layer of the integrated circuit.

In some embodiments, the solid-state photodetector may include a controller configured to control one or more heating resistors to heat one or more components. For example, as illustrated in FIG. 10C, solid-state photodetector 1000C may include an integrated circuit 1001C, which may include a controller 1043 configured to control the activation of heating resistor 1023. Controller 761 may control heating resistor 1023 to heat at least one of light sensitive photodiodes 1013, 1014, 1015, 1016, 1017, and 1018. By way of example, controller 1043 may determine to activate heating resistor 1023 if the temperature of a light sensitive photodiode is below a threshold. Controller 1043 may also control a power source (not shown) to pass an electric current through the heating resistor.

In some embodiments, the solid-state photodetector may include two or more heating resistors configured to heat one component. The heating resistors may be implemented on (or close to) the component homogenously. Alternatively, the heating resistors may not be implemented on (or close to) the component homogenously. In some embodiments, the heating resistors may be the same type or different types. Alternatively or additionally, the controller may control a power source to supply the same electric current or different electric current to the heating resistors.

In some embodiments, the controller may control the power source to supply different electric currents to different heating resistors. For example, the power source may supply a first electric current to a first heating resistor and a second electric current, which is different from the first electric current (e.g., a larger or smaller electric current), to a second heating resistor.

In some embodiments, the solid-state photodetector may include one heating element configured to heat two or more components. By way of example, as illustrated in FIG. 10C, solid-state photodetector 1000C may include heating resistor 1023 configured to heat light sensitive photodiodes 1013, 1014, 1015, 1016, 1017, and 1018 when an electric current passes through heating resistor 1023.

In some embodiments, the heating element may be configured to heat the solid-state photodetector (and/or one or more components thereof) in response information indicative of the temperature of the solid-state photodetector (and/or one or more components thereof). By way of example, controller 1043 may receive information indicating that the temperature of light sensitive photodiode 1013 is below a threshold. Controller 1043 may also control the power source to supply an electric current to heating resistor 1023 for heating light sensitive photodiode 1013.

In some embodiments, the heating resistors may be the same type. Alternatively, the electrooptical system may include two or more different types of heating resistors. For example, a heating resistor may have a different total resistance, heating power, or the like, or a combination thereof, from another heating resistor (or other heating resistors).

In some embodiments, a heating resistor (e.g., heating resistor 1021, 1022, and/or 1023) may have a total resistance in a range between ¼ and 5 kiloohms. In some embodiments, the total resistance of a heating resistor may be limited in a subrange of ¼ to 1 ohm, 1-10 ohm, 10-50 ohms, 50-100 ohms, 100-500 ohms, 500-1000 ohms, 1-2 kiloohms, and 2-5 kiloohms.

In some embodiments, a heating resistor (e.g., heating resistors 751, 752, 753, 754, and 756) may have a heat power in a range between 5 and 5000 milliwatts. In some embodiments, the heat power of a heating resistor may be limited in a subrange of 5 to 10 milliwatts, 10-50 milliwatts, 50-100 milliwatts, 100-500 milliwatts, 500-1000 milliwatts, 1000-1500 milliwatts, 1500-2500 milliwatts, and 2500-5000 milliwatts.

In some embodiments, the solid-state photodetector may include various sensors (not shown) configured to monitor the conditions under which the solid-state photodetector operates. For example, the integrated circuit of the solid-state photodetector may include one or more temperature sensors configured to monitor the temperature of the solid-state photodetector (and/or one or more components thereof). For example, a temperature sensor (e.g., a resistive temperature sensor) may be configured to measure the temperature of the solid-state photodetector or a light sensitive photodiode thereof. Alternatively or additionally, the temperature sensor may be configured to monitor the ambient temperature of the solid-state photodetector (or the electrooptical system that includes the solid-state photodetector). A sensor may include at least one of a feedback resistor, diode, transistor, or the like, or a combination thereof. The sensor may measure the temperature directly or indirectly, e.g., by measuring effects of varying temperatures on operations of one or more components of the solid-state photodetector.

A sensor may be configured to transmit the signal and/or information relating to the condition(s) it monitors to the controller of the solid-state photodetector. For example, the sensor may transmit information indicative of the temperature of one or more of light sensitive photodiodes 1013, 1014, 1015, 1016, 1017, and 1018 to controller 1043, which may determine whether to activate one or more heating resistors to heat one or more of light sensitive photodiodes 1013, 1014, 1015, 1016, 1017, and 1018 based on the information received. The measurement (or monitor) of temperature by a sensor may be continuous or intermittently. Alternatively or additionally, the sensor may receive a control signal from controller 1043 to measure temperature and transmit the temperature information it acquires to controller 1043. By way of example, controller 1043 may receive information indicative of the operation status of one or more light sensitive photodiodes and generate a control signal transmitted to a sensor. After receiving the control signal, the sensor may measure the temperature of the light sensitive photodiodes and transmit the temperature information to controller 1043.

In some embodiments, a sensor may be implemented as part of the solid-state photodetector. For example, a sensor may be implemented on (or close to) a component of the solid-state photodetector on the integrated circuit. By way of example, a sensor may be implemented on a substrate on which a light sensitive photodiode is implemented or controller 1043. As another example, a sensor may be implemented close to a transparent layer (e.g., window 124 illustrated in FIG. 1A, window 1131 illustrated in FIG. 11A, microlenses 1152 illustrated in FIG. 11B, microlenses 422 illustrated in FIG. 4D). In other embodiments, a sensor may be implemented outside of the solid-state photodetector or the electrooptical system (e.g., a temperature sensor external to the electrooptical system configured to measure the ambient temperature around the electrooptical system).

In some embodiments, the solid-state photodetector may also include a controller (e.g., controller 1043) and a power source. Controller 1043 may include one or more processors, microprocessors, or the like, or a combination thereof. Controller 1043 may be configured to control activation of one or more heating resistors. For example, controller 1043 may control a power source (not shown) to supply an electric current to one or more of the heating resistors.

The power source may be configured to supply one or more heating resistors the electric power for heating. Power source may be a battery, AC power source, DC power source, chargeable capacitor, or the like, or a combination thereof. In some embodiments, power source may include a power source being part of the solid-state photodetector or the electrooptical system (e.g., an internal power source). Alternatively or additionally, the power source may include a power source external to the solid-state photodetector or the electrooptical system.

In some embodiments, the power source may be electrically coupled to various components of the solid-state photodetector (e.g., light sensitive photodiodes, heating resistors, controller, various sensors). The power source may be external to controller 1043. Alternatively, the power source and controller 1043 may be integrated as a signal unit. In some embodiments, controller 1043 and the power source may be electrically coupled to, but external to the electrooptical system. For example, controller 1043 (and/or the power source) may be implemented outside the electrooptical system (e.g., as another part of a LIDAR system which includes the electrooptical system).

In some embodiments, controller 1043 may selectively cause the power source to apply an electric current passing through a heating resistor based on a temperature reading from the solid-state photodetector (or a component thereof). For example, controller 1043 may be configured to control the power source to selectively supply an electric current to heating resistor 1023 (but other heating resistor(s), if any) based on a temperature reading from solid-state photodetector 1000C (e.g., a temperature reading from light sensitive photodiode 1013). By way of example, controller 1043 may selectively cause the power source to apply an electric current passing through heating resistor 1023 when the temperature reading is lower than a threshold temperature.

In some embodiments, the electrooptical system is a LIDAR system, which may further include a processor programmed to process detections of the light sensitive photodiode(s) for determining a distance to at least one object in the FOV. Other types of electrooptical systems (e.g., camera, electrooptic microscope) may also be contemplated.

In some embodiments, the solid-state photodetector may further include a transparent layer connected to the solid-state photodetector, and the solid-state photodetector may include a heating resistor configured to reduce or prevent accumulation of ice (or frost) on the transparent layer. The transparent layer may be, for example, a window, a wedge, an array of microlenses, a prism, an array of prisms, an optical filter, or the like, or a combination thereof. The transparent layer may be transparent, partially transparent, or translucent.

Figure 11A:
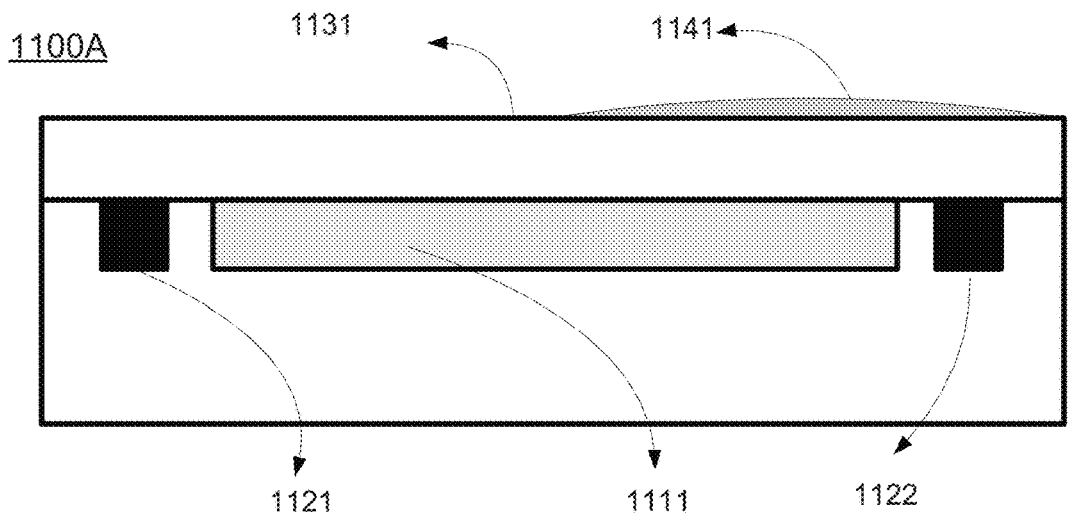
FIGS. 11A and 11B are diagrams illustrating exemplary electrooptical systems consistent with some embodiments of the present disclosure.

FIG. 11A illustrates an exemplary solid-state photodetector 1100A that includes a light sensitive photodiode 1111 and heating resistors 1121 and 1122. Light sensitive photodiode 1111 may be similar to the light sensitive photodiodes as described elsewhere in this disclosure. Heating resistors 1121 and 1122 may be similar the heating resistors as described elsewhere in this disclosure. Solid-state photodetector 1100A may also include a window 1131 connected to light sensitive photodiode 1111. Ice or frost (e.g., ice 1141) may accumulate on window 1131 under certain conditions (e.g., the outside and/or inside of the LIDAR system including the electrooptical system may be below the freezing point in presence of humidity or vapor). Ice or frost may form an optical block (or a filter) and/or change optical characteristics of window 1131 (e.g., changing the optical power of the lenses). To reduce or prevent accumulation of ice, heating resistor 1122 (and/or heating resistor 1121) may be configured to heat window 1131 (and/or light sensitive photodiode 1111). The heating process may be similar to the heating process described elsewhere in this disclosure (e.g., according to process 1200).

Figure 11B:
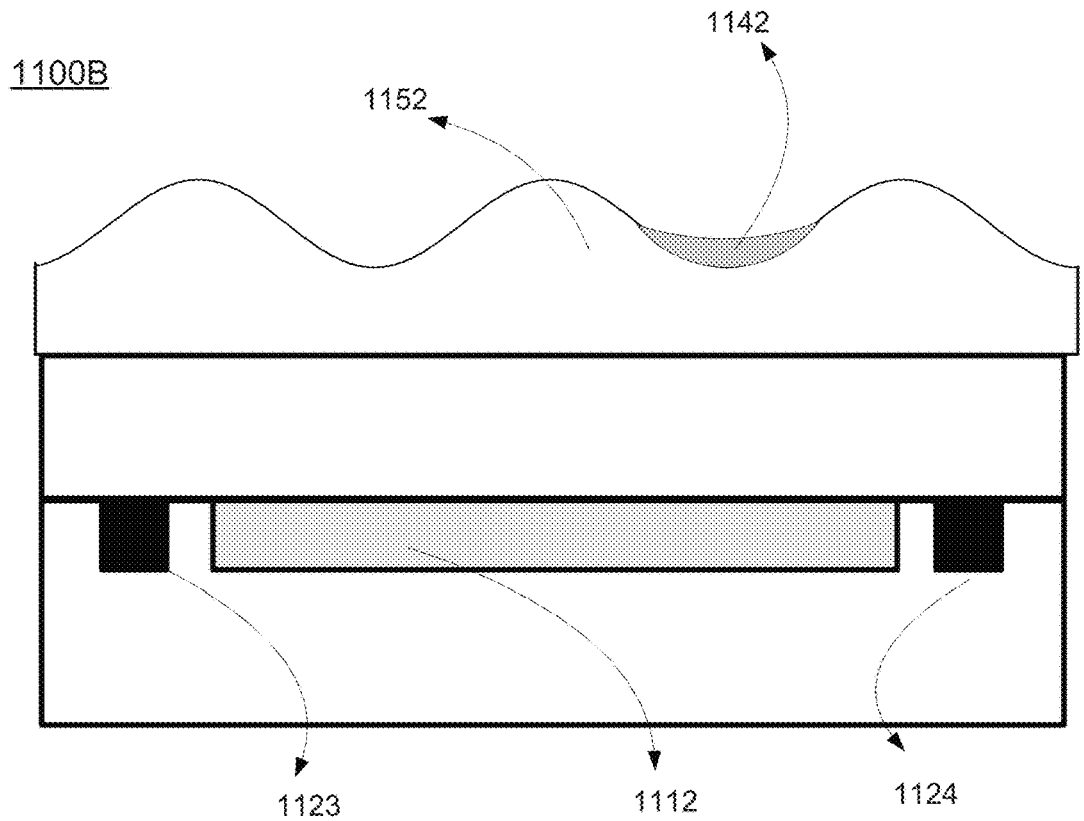

FIG. 11B illustrates an exemplary solid-state photodetector 1100B that includes a light sensitive photodiode 1111 and heating resistors 1121 and 1124. Light sensitive photodiode 1111 may be similar to the light sensitive photodiodes as described elsewhere in this disclosure. Heating resistors 1123 and 1124 may be similar the heating resistors as described elsewhere in this disclosure. Solid-state photodetector 1100B may also include an array of microlenses 1152 connected to light sensitive photodiode 1112. Ice or frost (e.g., ice 1142) may accumulate on microlenses 1152 (or one or more microlenses of thereof) under certain conditions (e.g., the outside and/or inside of the LIDAR system including the solid-state photodetector may be below the freezing point in presence of humidity or vapor). Ice or frost may form an optical block (or a filter) and/or change optical characteristics of microlenses 1152 (e.g., changing the optical power of the lenses). To reduce or prevent accumulation of ice, heating resistor 1124 (and/or heating resistor 1123) may be configured to heat microlenses 1152 (and/or light sensitive photodiode 1112). The heating process may be similar to the heating process described elsewhere in this disclosure (e.g., according to process 1200).

In some embodiments, two or more components of the solid-state photodetector (e.g., one or more of light sensitive photodiodes, heating resistor, controller, power source) may be fabricated on a single chip (or circuit). For example, heating resistor 1023 and one or more of light sensitive photodiodes 1013, 1014, 1015, 1016, 1017, and 1018 (and the circuity for transmitting electric current to heating resistor 1023) may be implemented on an integrated circuit. Alternatively or additionally, a heating resistor and an electrode of a light sensitive photodiode may be implemented on the same metal layer of the integrated circuit. Alternatively or additionally, a heating resistor and may be implemented on doped area of a silicon-based layer of the integrated circuit. In some embodiments, a heating resistor and a light sensitive photodiode may be mechanically and/or electrically isolated from one another even if implemented on the same metal layer (e.g., in the same metal application process). In other embodiments, a heating resistor and a light sensitive photodiode may be mechanically and/or electrically connected.

The solid-state photodetector may also include additional components, such as a controller, a power source, sensors (e.g., a temperature sensor), optical components, structural elements, transparent layer, etc. One of additional components may be implemented on the same chip as a heating resistor and/or a light sensitive photodiode, on another chip, or be otherwise integrated.

In some embodiments, one or more heating resistors may be implemented on a location close to a component of the solid-state photodetector. By way of example, one or more heating resistors may be implemented close to a light sensitive photodiode.

Figure 12:
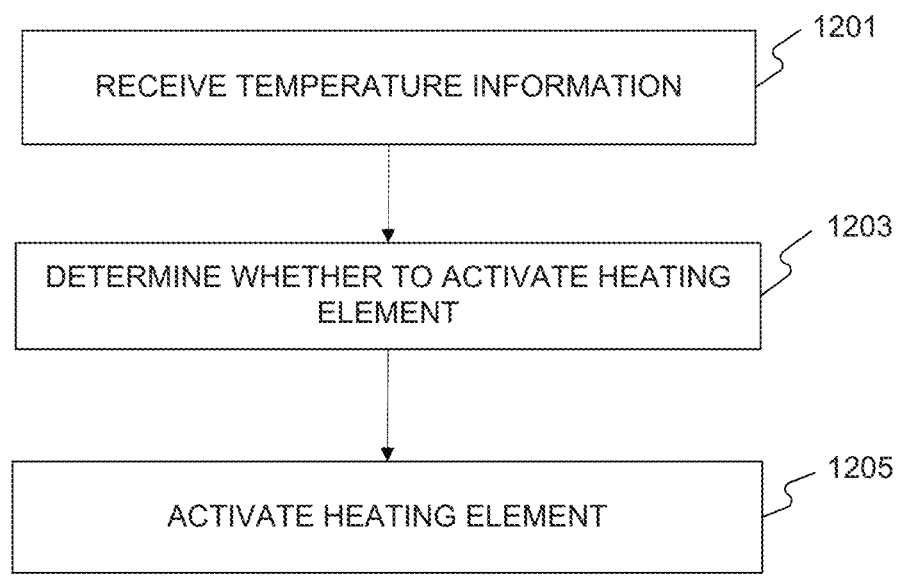
FIG. 12 is a flowchart of an exemplary process for operating an electrooptical system consistent with some embodiments of the present disclosure.

FIG. 12 is a flowchart of an exemplary heating process 1200 consistent with disclosed embodiments. One or more steps of heating process 1200 may be performed by a controller of the solid-state photodetector or a controller external to the solid-state photodetector (e.g., processor 118). While the heating process is described herein using the components of solid-state photodetector 1000C illustrated in FIG. 10C, it may apply to other exemplary solid-state photodetectors described in this disclosure.

At step 1201, temperature information may be received. Step 1201 may be performed by a controller of the solid-state photodetector and/or processor 118. For example, controller 1043 may receive temperature information. In some embodiments, controller 1043 may receive information indicative of solid-state photodetector 1000C (or one or more components thereof, such as one or more light sensitive photodiodes, transparent layer, or the like, or a combination thereof) from a temperature sensor. For example, a sensor close to light sensitive photodiode 1013 may measure the temperature of light sensitive photodiode 1013 and transmit the information indicative of the temperature to controller 1043. As another example, controller 1043 may receive information indicative of the ambient temperature in surroundings of solid-state photodetector 1000C from a sensor external to solid-state photodetector 1000C.

In some embodiments, a sensor may continuously measure the temperature of the solid-state photodetector (or one or more components thereof, such as one or more light sensitive photodiodes, transparent layer, or the like, or a combination thereof) and transmit the information to controller 1043 continuously. Alternatively or additionally, the sensor may measure the temperature intermittently and transmit the temperature information to controller 1043 if it is available. For example, the sensor may be configured to measure the temperature once over a pre-determined period, which may be in a range of 0.1 seconds to 10 minutes. In some embodiments, the period may be restricted in a sub-range of 0.1 to 1 second, 1 to 10 seconds, 10 to 60 seconds, and 1 to 10 minutes. Alternatively or additionally, the sensor may be configured to measure the temperature on demand. For example, the sensor may receive a control signal from controller 1043. In response, the sensor may measure the temperature (continuously or intermittently) and transmit the temperature information to controller 1043. In some embodiments, the sensor may continue to measure the temperature until receiving a second control signal to stop the measurement.

At step 1203, whether to activate (or deactivate) one or more of heating resistors may be determined. Step 1203 may be performed by a controller of the solid-state photodetector and/or processor 118. For example, controller 1043 may be configured to determine whether to activate (or deactivate) one or more of heating resistors (including, for example, heating resistor 1023) to heat the solid-state photodetector or one or more components of the solid-state photodetector (e.g., the integrated circuit, one or more light sensitive photodiodes, the sensor, the controller, the transparent layer, or the like, or a combination thereof), based on the temperature information received. For example, controller 1043 may determine whether the temperature of one or more of light sensitive photodiodes 1013, 1014, 1015, 1016, 1017, and 1018 is below an activation threshold, which may be a lower limit of the temperature range under which the component(s) operates optimally. If so, controller 1043 may determine to activate heating resistor 1023 to heat the light sensitive photodiode(s). On the other hand, if controller 1043 determines that the temperature of the light sensitive photodiodes equals or exceeds the activation threshold, controller 1043 may determine the activation of heating resistor 1023 is not needed (i.e., taking no action). As another example, controller 1043 may receive information indicative of the temperature of a first component from a first sensor and receive information indicative of the temperature of a second component from a second sensor. By way of example, controller 1043 may receive information the temperature of light sensitive photodiode 1013 from a first sensor and receive information indicative of the temperature of light sensitive photodiode 1014 from a second sensor. Controller 1043 may also determine that the temperature of light sensitive photodiode 1013 is above a first activation threshold, while the temperature of light sensitive photodiode 1014 is below a second activation threshold (which may be the same as or different from the first threshold). Controller 1043 may further determine to activate a heating resistor close to light sensitive photodiode 1014, but not a heating resistor close to light sensitive photodiode 1013 (not shown in FIG. 10A). As a further example, controller 1043 may determine that one of the temperatures of the components is below an activation threshold corresponding to a particular component (which may be the same or different for the components) and determine to activate some or all heating resistors.

In some embodiments, the activation temperature threshold may relate to the dew point where the electrooptical system (or the solid-state photodetector) operates. For example, controller 1043 may receive (or determine based on various factors such as pressure, humidity) the dew point where the electrooptical system (or the solid-state photodetector) operates. Controller 1043 may set the dew point as the activation threshold. Alternatively, controller 1043 may set a certain degrees Celsius below or above the dew point as the activation threshold. By way of example, controller 761 may set 3° C. below (or above) the dew point as the activation threshold.

In some embodiments, controller 1043 may be configured to determine to activate a heating resistor based on a temperature reading from a chip on which a light sensitive photodiode is implemented. For example, controller 1043 may be configured to receive a temperature reading from a chip on which a light sensitive photodiode is implemented and determine that the temperature is below a threshold. Controller 1043 may be configured to determine to selectively activate a heating resistor to heat the light sensitive photodiode.

Controller 1043 may also be configured to deactivate one or more heating resistors if a deactivation condition is met. For example, controller 1043 may deactivate a heating resistor based on the temperature information received. By way of example, controller 1043 may receive from sensor information indicative of the temperature of light sensitive photodiode 1013 after heating resistor 1023 is activated for heating light sensitive photodiode 1013 (as described elsewhere in this disclosure). Controller 1043 may determine that the temperature of light sensitive photodiode 1013 equals to or exceeds a deactivation threshold. Controller 1043 may determine to deactivate heating resistor 1023. A component's deactivation threshold may be equal to or higher than its activation threshold. In some embodiments, a deactivation threshold may relate to the ambient temperature of the solid-state photodetector (e.g., 5, 10, or 15 degrees Celsius higher than the ambient temperature). Alternatively or additionally, controller 1043 may deactivate a heating resistor after a predetermined heating period (e.g., 1, 5, or 10 minutes).

In some embodiments, controller 1043 may control the activation of a heating resistor until a deactivation condition is met. For example, controller 1043 may activate heating resistor 1023 to heat light sensitive photodiode 1013, and heating resistor 1023 may be configured to heat light sensitive photodiode 1013 upon its activation. Controller 1043 may receive from the sensor information indicative of the temperature of light sensitive photodiode 1013 after the heating. Controller 1043 may determine that the temperature of light sensitive photodiode 1013 is higher than the ambient temperature in surroundings of the solid-state photodetector (or a light sensitive photodiode thereof) by a temperature difference (e.g., 5 or 10 degrees Celsius). Controller 1043 may then deactivate heating resistor 1023. The temperature difference may be in a range of 1-30 degrees Celsius. In some embodiments, the temperature difference may be restricted in a subrange of 1 to 5 degrees Celsius, 5 to 10 degrees Celsius, 10 to 20 degrees Celsius, or 20 to 30 degrees Celsius. In some embodiments, the condition for deactivating a heating resistor may relate to a deactivation temperature threshold being reached after the heating, a time period for heating by the heating resistor being reached, or the like, or a combination thereof.

In some embodiments, the deactivation threshold may relate to the dew point where the electrooptical system (or the solid-state photodetector) operates. For example, controller 1043 may receive (or determine based on various factors such as pressure, humidity) the dew point where the electrooptical system (or the solid-state photodetector) operates. Controller 1043 may set a certain degrees Celsius above the dew point as the deactivation threshold. By way of example, controller 1043 may set any number between 5-20° C. above the dew point as the deactivation threshold.

In some embodiments, controller 1043 may determine to activate (and/or deactivate) a heating resistor to heat a component based on the temperature of the component and a reference temperature. The reference temperature may be the temperature of another component. For example, controller 1043 may receive from first sensor information indicative of the temperature of light sensitive photodiode 1013 and receive from second sensor information indicative of the temperature of light sensitive photodiode 1014, which serves a reference temperature. Controller 1043 may determine to activate (and/or deactivate) heating resistor 1023 heating light sensitive photodiode 1013 based on a comparison between light sensitive photodiode 1013's temperature and the reference temperature. By way of example, controller 1043 may determine to activate heating resistor 1023 if the temperature of light sensitive photodiode 1013 is 5 degrees Celsius lower than the reference temperature.

At step 1205, one or more heating elements may be activated (or deactivated). Step 1205 may be performed by a controller of the solid-state photodetector or a controller external to the solid-state photodetector. For example, controller 1043 may be configured to activate (or deactivate) the heating element it determined to activate (or deactivate). For example, controller 1043 may be configured to cause appliance of an electric current to the heating resistor via a circuitry. By way of example, controller 1043 may control a power source (by, for example, sending a control signal to the power source) to supply an electric current to the heating resistor via the circuitry, which may heat one or more components when the electric current passes through it. In some embodiments, the heating may reduce or prevent ice accumulation on a light sensitive photodiode and/or a transparent layer of the solid-state photodetector.

In some embodiments, heating a light sensitive photodiode may impact the performance of the light sensitive photodiode given that the light sensitive photodiode may operate better at a lower temperature (e.g., having lower noise). For example, heating the light sensitive photodiode may degrade the sensitive of the power source. Controller 1043 may deactivate the heating resistor that heats the light sensitive photodiode when the heating may negatively impact the performance of the light sensitive photodiode. For example, controller 1043 may receive information relating to the performance of the light sensitive photodiode after the light sensitive photodiode has been or is being heated. Controller 1043 may determine whether to deactivate the heating resistor based on the information received. Controller 1043 may also deactivate the heating resistor if it determines that the heating has negatively impacted the performance of the light sensitive photodiode. As another example, controller 1043 may receive the information relating to the temperature of the light sensitive photodiode after the light sensitive photodiode has been or is being heated. Controller 1043 may determine that the temperature equals or exceeds a deactivation threshold. Controller 1043 may further determine to deactivate the heating resistor so that the light sensitive photodiode may be operate at an optimal temperature, thereby maintaining optical transparency or efficiency of the path from the FOV to the light sensitive photodiode.

In some embodiments, controller 1043 may be configured to cause the heating resistor to heat a light sensitive photodiode to a temperature higher by at least certain degrees Celsius than the ambient temperature in surroundings of the solid-state photodetector (or the light sensitive photodiode). For example, controller 1043 may be configured to cause the heating resistor to heat the light sensitive photodiode to a temperature higher at least by any number between 5 to 20 degrees Celsius than the ambient temperature in surroundings of the solid-state photodetector (or the light sensitive photodiode).

In some embodiments, controller 1043 may cause an electric current to be applied to the heating resistor based on the temperature of the component(s) that the heating resistor will heat. For instance, controller 1043 may control the power source to supply a first electric current to heating resistor 1023 when light sensitive photodiode 1013 is at a first temperature and supply a second electric current larger than the first electric current to heating resistor 1023 when light sensitive photodiode 1013 is at a second temperature lower than the first temperature.

In some embodiments, controller 1043 may cause different electric currents to be applied to different heating resistors based on the differences between the temperatures of the components that the heating resistors heat. For example, controller 1043 may determine to activate a first heating resistor and a second heating resistor. Controller 1043 may control the power source to supply a first electric current to the first heating resistor and supply a second electric current to the second heating resistor, which may be different from (e.g., larger or smaller than) the first electric current. Alternatively or additionally, controller 1043 may cause different electric currents to be applied to different heating resistors based on the types of the heating resistors.

The power source may supply an electric current to one or more heating resistors in various manners (under the direction of controller 1043 or on its own). For example, the power source may supply pulsed electric currents to a heating resistor. Alternatively or additionally, the power source may supply an electric current to the heating resistor continuously. Alternatively or additionally, the power source may supply an electric current to the heating resistor intermittently. For example, the power source may continue the supply of an electric current to the heating resistor for a first period of time, stop the supply for a second period of time, and then resume the supply for a third period of time, and so on. The time periods for supplying and discontinuing the supply may the same or different.

The power source may supply electric currents to two one or more heating resistors that may cause the heating resistors to dissipate the same amount of heat (or have the same heating power), under the direction of controller 1043 or on its own. The amount of heat dissipation (the heating power) of a heating resistor may be proportional to the production of the electric current passing through the heating resistor and the voltage of the heating resistor. For example, the power source may supply electric currents to a first heating resistor and a second heating resistor that cause the heating resistors to dissipate the same amount of heat. By way of example, the electric currents passing through the heating resistors may have a same current, and the voltages of the heating resistors are the same. Alternatively, the power source may supply electric currents to two one or more heating resistors that may cause the heating resistors to dissipate different amounts of heat. For example, the power source may supply a first electric current to a first heating resistor. The power source may also supply a second electric current, which may be different from the first current, to a second heating resistor. By way of example, the second electric current may have a larger (or smaller) current than the first electric current. Alternatively or additionally, the power source may cause the voltage of the first heating resistor being different from the voltage of the second heating resistor.

In some embodiments, the electrooptical system may be configured to detect light from the FOV of the electrooptical system by the light sensitive photodiode (after and/or before heating from one or more heating resistors). For example, at least one instance of heating the light sensitive photodiode (or a transparent layer) may precede the detection of light. In some embodiments, the detecting may be executed continuously (e.g., for scanning a FOV of the solid-state photodetector), while the heating is executed when a heating condition is met (e.g., when the temperature falls below a threshold temperature).

The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, or other optical drive media.

Computer programs based on the written description and disclosed methods are within the skill of an experienced developer. The various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A microelectromechanical system (MEMS) mirror assembly, the mirror assembly comprising:
    a MEMS mirror;
    a frame;
    at least one piezoelectric actuator configured to move the MEMS mirror with respect to the frame, wherein the at least one piezoelectric actuator includes a body and a piezoelectric element that is configured to bend the body when subjected to an electrical field, thereby moving the MEMS mirror; and
    at least one heating resistor configured to heat the piezoelectric element when an electric current passes through the at least one heating resistor.

2. The mirror assembly according to claim 1, further comprising a controller configured to cause the electric current to pass through the at least one heating resistor in response to information relating to a temperature of the piezoelectric element.

3. The mirror assembly according to claim 1, wherein the at least one heating resistor is implemented on a metal layer of a wafer of the electrooptical system.

4. The mirror assembly according to claim 3, wherein at least one electrode used for applying the electrical field to the piezoelectric element is implemented on the metal layer.

5. The mirror assembly according to claim 1, wherein the at least one heating resistor is implemented on a doped area of a silicon-based layer of a wafer of the electrooptical system.

6. The mirror assembly according to claim 1, wherein the at least one heating resistor is implemented on at least one of the piezoelectric actuators.

7. The mirror assembly according to claim 1, wherein the at least one heating resistor is implemented on the frame.

8. The mirror assembly according to claim 1, wherein the at least one heating resistor is implemented on a non-movable part of the electrooptical system adjacent to at least one of the piezoelectric actuators.

9. The mirror assembly according to claim 1, further comprising:
    a sensor configured to detect a temperature of at least one component of the electrooptical system; and
    a controller configured to control the activation of the at least one heating resistor.

10. The mirror assembly according to claim 9, wherein the sensor is a calibrated resistor.

11. The mirror assembly according to claim 2, further comprising a processor programmed to generate the information indicative of the temperature in response to a voltage for actuating the MEMS mirror.

12. The mirror assembly according to claim 1, wherein the at least one heating resistor has a total resistance of between ¼ and 5 kiloohm.

13. The mirror assembly according to claim 1, wherein the at least one heating resistor emits a heat power having a range between 5 and 500 milliwatt.

14. The mirror assembly according to claim 1, further comprising a plurality of heating resistors, and wherein at least one of the heating resistors emits a heat power having a range between 5 and 500 milliwatts.

15. The mirror assembly according to claim 1, further comprises a controller, wherein:
    the at least one heating resistor comprises a first heating resistor and a second heating resistor; and
    the controller is configured to control, based on the received information relating to the temperature of the piezoelectric element, appliance of a first electric current to the first heating resistor and appliance of a second electric current to the second heating resistor, the first electric current being different from the second electric current.

16. A method for operating a microelectromechanical system (MEMS) mirror assembly, the method comprising:
    applying an electrical field to a piezoelectric element of a piezoelectric actuator of the MEMS mirror assembly, thereby moving a MEMS mirror that is coupled to the piezoelectric actuator; and
    passing an electric current through at least one heating resistor of the MEMS mirror assembly for heating the piezoelectric elements.

17. The method according to claim 16, further comprising selectively passing the electric current based on a temperature reading from the MEMS mirror assembly.

18. The method according to claim 16, further comprising selectively passing the electric current when the temperature reading is indicative of a temperature lower than a threshold temperature.

19. The method according to claim 16, wherein:
    the at least one heating resistors comprises a first heating resistor and a second heating resistor; and
    the method further comprises passing a first electric current through the first heating resistor and passing a second electric current through the second heating resistor, the first electric current being different from the second electric current.

20. The method according to claim 16, wherein the heating comprising heating the piezoelectric elements to a temperature higher by at least 5 degrees Celsius than an ambient temperature in surroundings of the MEMS mirror assembly.

* * * * *